(12) United States Patent
Yamazaki et al.

(10) Patent No.: US 8,322,847 B2
(45) Date of Patent: Dec. 4, 2012

(54) LIQUID DROPLET EJECTION SYSTEM AND CONTROL PROGRAM OF EJECTION CONDITION OF COMPOSITIONS

(75) Inventors: Shunpei Yamazaki, Tokyo (JP); Jun Koyama, Kanagawa (JP); Yasuyuki Arai, Kanagawa (JP); Shinji Maekawa, Kanagawa (JP); Yohei Kanno, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 11 days.

(21) Appl. No.: 13/049,078

(22) Filed: Mar. 16, 2011

(65) Prior Publication Data

US 2011/0164083 A1    Jul. 7, 2011

Related U.S. Application Data

(62) Division of application No. 10/970,712, filed on Oct. 21, 2004, now abandoned.

(30) Foreign Application Priority Data

Oct. 28, 2003   (JP) ................. 2003-405202

(51) Int. Cl.
   *B41J 2/01* (2006.01)
   *B05B 7/06* (2006.01)
   *H01L 21/36* (2006.01)

(52) U.S. Cl. .......... 347/107; 118/313; 438/584

(58) Field of Classification Search .......... 347/40, 347/107; 438/584; 118/313
   See application file for complete search history.

(56) References Cited

U.S. PATENT DOCUMENTS

| 4,435,674 | A | 3/1984 | Hevenor et al. |
| 5,132,248 | A | 7/1992 | Drummond et al. |
| 5,412,410 | A | 5/1995 | Rezanka |
| 5,921,836 | A | 7/1999 | Nanto et al. |
| 6,063,339 | A | 5/2000 | Tisone et al. |
| 6,164,746 | A | 12/2000 | Akahira et al. |
| 6,503,831 | B2 | 1/2003 | Speakman |
| 6,641,251 | B1 * | 11/2003 | Rodriguez ............ 347/40 |
| 6,778,206 | B2 | 8/2004 | Kinjyou et al. |
| 6,890,050 | B2 | 5/2005 | Ready et al. |

(Continued)

FOREIGN PATENT DOCUMENTS

| EP | 0 806 786 A1 | 11/1997 |
| EP | 1 329 933 A1 | 7/2003 |
| JP | 5-185005 | 7/1993 |
| JP | 7-204569 | 8/1995 |
| JP | 8-229478 | 9/1996 |

(Continued)

*Primary Examiner* — Shelby Fidler
(74) *Attorney, Agent, or Firm* — Husch Blackwell LLP

(57) ABSTRACT

When using a liquid droplet ejection method, a conventional photomask is not required, however, it is required instead that a moving path of a nozzle or a substrate is controlled with accuracy at least in ejecting liquid droplets. According to the characteristics of compositions to be ejected or their pattern, such ejection conditions are desirably set as the moving rate of a nozzle or a substrate, ejection quantity, ejection distance and ejection rate of compositions, atmosphere of the space that the compositions are ejected, the temperature and moisture of the space, and heating temperature of the substrate. A liquid droplet ejection system in accordance with the invention comprises an input means for inputting data of a thin film pattern, a set means for setting a nozzle for a ejecting a composition containing a material for forming the thin film or setting a moving path of the substrate to which the composition is ejected, an image pick-up means for detecting an alignment marker formed on a substrate and a control means for controlling the moving path of the nozzle or the substrate.

14 Claims, 34 Drawing Sheets

U.S. PATENT DOCUMENTS

| | | | |
|---|---|---|---|
| 6,893,103 B2 | 5/2005 | Okada et al. | |
| 6,933,086 B2 | 8/2005 | Sakurada | |
| 7,052,811 B2 | 5/2006 | Sakurada | |
| 7,285,033 B2 | 10/2007 | Sakurada | |
| 2001/0003602 A1 | 6/2001 | Fujita | |
| 2002/0159919 A1 | 10/2002 | Churchill et al. | |
| 2003/0151637 A1 | 8/2003 | Nakamura et al. | |
| 2003/0197756 A1 | 10/2003 | Inoue et al. | |
| 2003/0206207 A1 | 11/2003 | Stossel et al. | |
| 2004/0072364 A1 | 4/2004 | Tisone et al. | |
| 2004/0077112 A1 | 4/2004 | Elliott | |
| 2004/0147113 A1* | 7/2004 | Yamazaki et al. | 438/584 |
| 2004/0218136 A1* | 11/2004 | Imai | 349/156 |
| 2004/0263564 A1 | 12/2004 | Maekawa et al. | |
| 2005/0248602 A1 | 11/2005 | Newsome et al. | |

FOREIGN PATENT DOCUMENTS

| | | |
|---|---|---|
| JP | 10-27543 | 1/1998 |
| JP | 11-340129 | 12/1999 |
| JP | 2000-58437 | 2/2000 |
| JP | 2002-500098 | 1/2002 |
| JP | 2002-134024 | 5/2002 |
| JP | 2002-170758 | 6/2002 |
| JP | 2003-1170 | 1/2003 |
| JP | 2003-53244 | 2/2003 |
| JP | 2003-158066 | 5/2003 |
| JP | 2003-159786 | 6/2003 |
| JP | 2003-251245 | 9/2003 |
| JP | 2003-260396 | 9/2003 |
| JP | 2003-282561 | 10/2003 |
| JP | 2003-289080 | 10/2003 |
| WO | WO 02/099478 A1 | 12/2002 |

* cited by examiner rotating substrate stage at 90 degree pixel portion pixel portion pixel portion

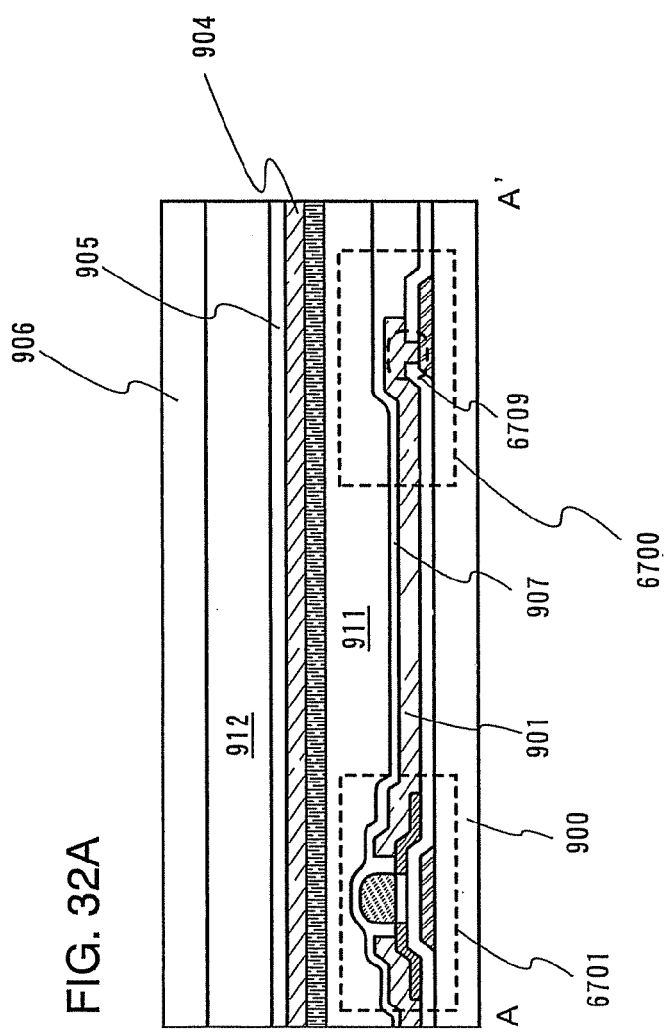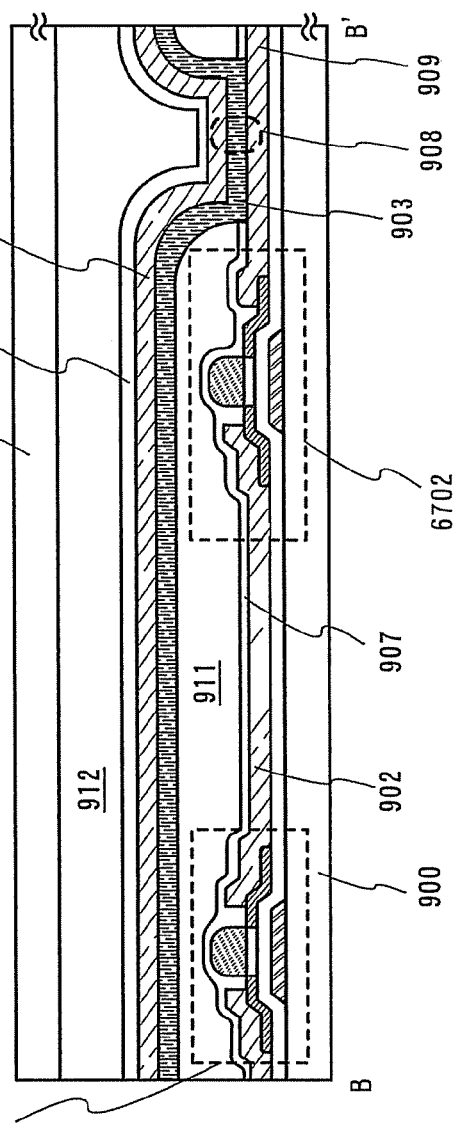
FIG. 32A
FIG. 32B

LIQUID DROPLET EJECTION SYSTEM AND CONTROL PROGRAM OF EJECTION CONDITION OF COMPOSITIONS

This application is a divisional of copending U.S. application Ser. No. 10/970,712, filed on Oct. 21, 2004 now abandoned.

BACKGROUND OF THE INVENTION

1. Field of the Invention

The present invention relates to a technology for forming a conductive film, an insulating film, a semiconductor film and the like over a substrate by ejecting compositions to the substrate. In particular, the invention relates to a liquid droplet ejection system including a means for controlling ejection conditions of compositions, and a liquid droplet ejection method.

2. Description of the Related Art

Conventionally, a thin film transistor (TFT) used for a flat panel display (FPD) and the like is formed by depositing thin films such as a conductive film, an insulating film and a semiconductor film, and subsequently performing photolithography thereto to obtain desired shapes of the thin films and laminating them. The photolithography is a technology for obtaining a desired shape of a thin film by coating a resist over a thin film deposited over the whole surface of a substrate, exposing it to the ultraviolet light using a photomask formed by using a schematic editor such as CAD as a mask, and etching it using a mask pattern formed by a developing process (leaving a pattern by chemically treating the resist which has been exposed to light).

Meanwhile, in recent years, the use of a liquid droplet ejection system is considered for the formation of a thin film or a wiring pattern used for a semiconductor element in view of a reduction in equipment cost or simpler manufacturing steps of semiconductor elements. According to the liquid droplet ejection method, a thin film or a wiring pattern can be formed through a direct depiction by ejecting a composition, in which materials for forming the thin film or the wiring are dissolved or dispersed into a solvent, from a nozzle of a liquid droplet ejection system (a system having a cylindrical nozzle with a small hole in its distal end for ejecting liquid solution or gas) on a substrate and the like. Therefore, the aforementioned photomask is no longer required and conventional photolithography steps can be omitted, which will lead to drastically simplified steps and reduced cost.

However, when using the liquid droplet ejection method, at least a moving path of a nozzle or a substrate is required to be accurately controlled in ejecting liquid droplets instead of omitting the conventional photomask. In addition, such conditions are also desirably controlled with accuracy as a moving rate of a nozzle or a substrate, ejection quantity of compositions, ejection distance, ejection rate, atmosphere, temperature and moisture of ejection environment, and heating temperature of a substrate.

SUMMARY OF THE INVENTION

The invention is made with a view to solve the foregoing problems. It is a feature of the invention to provide a liquid droplet ejection system having a means for setting a moving path of a nozzle for ejecting a composition containing materials to form a thin film or setting a moving path of a substrate to which the composition is ejected based on the data of the thin film pattern which is formed in advance in order to improve the tact time and throughput in manufacture of a thin film or a wiring.

A liquid droplet ejection system in accordance with the invention comprises an input means for inputting data of a thin film pattern, a set means for setting a moving path of a nozzle for ejecting a composition containing materials for forming the thin film or setting a moving path of a substrate to which the composition is ejected based on the data, an image pick-up means for detecting an alignment marker formed on the substrate and a control means for controlling the moving path of the nozzle or the substrate.

According to the aforementioned invention, the moving path of a nozzle for ejecting a composition containing materials for forming the thin film or the moving path of a substrate to which the composition is ejected can be set based on the data of the thin film pattern which has been inputted to a computer for controlling a liquid droplet ejection system. In addition, by inputting the positional information of an alignment marker formed on a substrate into a computer which is obtained by the image pick-up means for detecting an alignment marker, the substrate can be aligned with the nozzle by comparing of the data with the positional information. Then, by moving the nozzle or the substrate along the set moving path by the control means and ejecting the composition from the ejection head (ink-jet head) of the nozzle, a thin film or a wiring having a desired shape can be formed.

Here, the data of the thin film pattern can be formed by using a circuit design tool such as CAD (Computer Aided Design), CAM (Computer Aided Manufacturing) and CAE (Computer Aided Engineering), however, the invention is not limited to them.

In addition, as an image pick-up means, a camera such as the one using a CCD (Charge Coupled Device) for converting the light intensity into an electrical signal can be used, however, the invention is not limited to this.

In addition, by inputting the types of the composition containing materials for forming a thin film simultaneously with the data of the thin film pattern, a desired nozzle or ejecting head, or a container storing the composition can be selected.

The moving path of a nozzle or a substrate or other ejection conditions are set by processing information according to purposes using a software (program) installed in a hardware (computer) based on the data of the thin film pattern, the thin film width (line width) and the film thickness, or the data of the types of the composition which has been inputted in advance to the hardware incorporated in the liquid droplet ejection system.

In addition, a liquid droplet ejection system in accordance with the invention comprises an image pick-up means for detecting a first thin film pattern formed over a substrate, an input means for inputting data of the composition containing materials for forming a second thin film pattern and the thin film, a set means for setting a moving path of a nozzle for ejecting the composition or setting a moving path of a substrate to which the composition is ejected based on the data and a control means for controlling the moving path of the nozzle or the substrate.

According to the aforementioned invention, the moving path of the nozzle for ejecting the composition containing materials for forming the thin film (second thin film) or the moving path of the substrate to which the composition is ejected can be set based on the data of the thin film pattern designed by a circuit design tool such as CAD which has been inputted to a computer for controlling the liquid droplet ejection system. In addition, by inputting the positional information of the first thin film which is obtained by an image pick-up means such as a CCD camera for detecting other thin film (the first thin film) formed previously over the substrate into a computer, the substrate can be aligned with the nozzle based on the comparison result of the data with the positional information. By moving the nozzle or the substrate along the set moving path by the control means, and ejecting the composition from the ejection head of the nozzle, a thin film (the second thin film) having a desired shape can be formed at a desired position.

In addition, by reading out the types of the composition containing materials for forming a thin film simultaneously with the data of the thin film pattern, a desired nozzle or ejecting head, or a container storing the composition can be selected.

In addition, a liquid droplet ejection system in accordance with the invention comprises an input means for inputting data of a thin film pattern, a set means for setting moving paths of a first nozzle and a second nozzle for ejecting a composition containing materials for forming the thin film based on the data, an image pick-up means for detecting an alignment marker formed on a substrate and a control means for controlling the moving paths of the first nozzle and the second nozzle, wherein the moving path of the second nozzle is set to cross the moving path of the first nozzle.

According to the aforementioned invention, a thin film having crossed shapes can be formed on the same layer easily. In addition, by setting one of the first nozzle and the second nozzle to eject the composition in succession while setting the other to eject the composition intermittently, a thin film of a shape having both a linear portion and a projecting portion (such as ⊥ shape and ⊥ shape) can be formed. That is, by forming the linear portion through successive ejection of compositions from the first nozzle while forming the projecting portion through intermittent ejection of compositions by moving the second nozzle in the direction so as to cross the first nozzle (in the orthogonal direction, for example), one thin film having both the linear portion and the projecting portion can be formed as a result. The aforementioned invention can be applied, for example, to the case where a gate wiring and a gate electrode of a TFT, or a source signal line and a source electrode thereof are formed on the same layer.

Note that the types of compositions to be ejected from the first nozzle and the second nozzle are basically the same, however, different compositions may be used as long as the function of a thin film to be formed is not disturbed. For example, the gate wiring portion or the source signal line portion can be formed by the ejection of a composition containing Al and Cu, while the gate electrode portion or the source electrode portion can be formed by the ejection of a composition containing Ag. Other suitable materials can also be employed as well in consideration of the cost and electric resistivity.

According to the aforementioned invention, a film having both the linear portion and the projecting portion is formed by using a plurality of nozzles. By using the fixed nozzles and moving a substrate to be ejected compositions along a first path and a second path, a thin film having crossed shapes can be formed on the same layer easily. In addition, by controlling the moving path of the substrate so that the compositions are ejected in succession from the nozzle while the substrate passes through one of the first path and the second path, and the compositions are ejected intermittently from the nozzle while the substrate passes the other path, a thin film having the aforementioned linear portion and projecting portion can be formed. Note that the ejected compositions may be changed between the first moving path and the second moving path of the substrate as long as the function of a thin film to be formed is not disturbed.

In addition, a control program of ejection conditions of a composition in accordance with the invention comprises a feature which allows a computer for controlling the ejection conditions of a composition containing materials for forming a thin film to function as a set means for setting the moving path of a nozzle for ejecting the composition or setting the moving path of a substrate to which the composition is ejected based on the data of the thin film pattern which has been inputted to the computer.

According to the aforementioned invention, by reading out the control program of the ejection conditions of a composition with a computer for controlling the liquid droplet system, it is possible that the moving path of a nozzle for ejecting a composition containing materials for forming the thin film or the moving path of a substrate to which the composition is ejected can be set based on the data of the thin film pattern designed by CAD and the like which has been inputted to the computer. Then, by moving the nozzle or the substrate along the set moving path, and ejecting the composition from the ejection head of the nozzle, a thin film or a wiring having a desired shape can be formed at a desired position.

In addition, by inputting the types of the composition containing materials for forming a thin film simultaneously with the data of the thin film pattern, a desired nozzle or ejecting head, or a container storing the composition can be selected.

Note that a control program of the ejection conditions of a composition in accordance with the invention comprises a determination means for determining at least one of the moving rate of a nozzle or a substrate, distance between the ejection head of the nozzle and the substrate, ejection rate of the composition ejected from the ejecting head, atmosphere of the space that the composition is ejected, the temperature and moisture of the space, and heating temperature of the substrate which are set by the set means.

According to the aforementioned invention, a liquid droplet ejection system can be controlled more completely, whereby an excellent thin film can be formed with high throughput.

Note that a thin film in accordance with the invention refers to all films which can be formed by a liquid droplet ejection method such as a conductive film, an insulating film, a semiconductor film, a mask pattern, a film containing organic compounds or inorganic compounds, a color filter and an alignment film.

Examples of the conductive film include a gate electrode, a source electrode and a drain electrode of a semiconductor element, a pixel electrode of a display device, a hole injection electrode (anode), an electrode injection electrode (cathode) of a light-emitting device such as an EL display, wirings such as a signal line or a scan line connected to such electrodes and the like. Examples of the insulating film includes a gate insulating film of a semiconductor element, an interlayer insulating film and a planarization film which are formed over the semiconductor element, a bank (also referred to as a partition and the like) in the aforementioned light-emitting element, and the like. Examples of the semiconductor film includes a silicon film, a germanium film, a silicon germanium film and the like which are used for a channel region of a semiconductor element, a source or a drain region of a semiconductor element doped with impurities.

Examples of the mask pattern include a heat resistant high molecular weight material such as resist, polyimide, acrylic, polyamide and polybenzimidazole. A mask pattern formed by a liquid droplet ejection method can be used as a mask in etching in the case where the conductive film, the insulating film, the semiconductor film and the like are formed not by the liquid droplet ejection method, but by a thin film deposition method such as CVD and sputtering.

Examples of the film containing organic compounds or inorganic compounds include a hole injection layer, a hole transporting layer, a light-emitting layer, an electron transporting layer, an electron injection layer, a hole blocking layer and the like each of which constitutes a light-emitting element (typically, a light-emitting element utilizing EL: Electro Luminescence) in the aforementioned light-emitting device.

Generally, a liquid droplet ejection system used for the formation of a thin film or a wiring is required to comprise an input means for inputting data of a thin film pattern, a set means for setting a moving path of a nozzle for ejecting a composition containing materials for forming the thin film based on the data, an image pick-up means for detecting an alignment marker formed on a substrate and a control means for controlling the moving path of the nozzle in order to control the moving path of the nozzle or a substrate with accuracy in ejecting liquid droplets, which is carried out in the invention as well. By reading out a control program of the ejection conditions of compositions with a computer for controlling the liquid droplet ejection system, it is possible to control such conditions with accuracy as the moving rate of a nozzle and substrate, ejection quantity of compositions, ejection distance, ejection rate, environment of ejection such as atmosphere, temperature and moisture, and heating temperatures of a substrate.

Accordingly, a thin film or a wiring having a desired thickness, width and shape can be formed with accuracy at a desired position in a short tact time with high throughput. Further, manufacturing yields of a semiconductor element such as a TFT manufactured by using the thin film or wiring, or a liquid crystal display (LCD), a light-emitting device such as an organic EL display (OLED), an LSI and the like manufactured by using the semiconductor element can be improved. In particular, according to the invention, a thin film or a wiring pattern can be formed in an arbitrary place while adjusting the thickness, width and shape of the pattern. Therefore, a semiconductor element substrate such as the one having a large area of more than 1 to 2 meters on a side can be manufactured at low cost and high yields.

BRIEF DESCRIPTION OF THE DRAWINGS

FIGS. 32A and 32B each illustrates a cross-sectional view of a pixel portion in an EL display panel.

DETAILED DESCRIPTION OF THE PREFERRED EMBODIMENTS

Embodiment Mode 1

Figure 1:
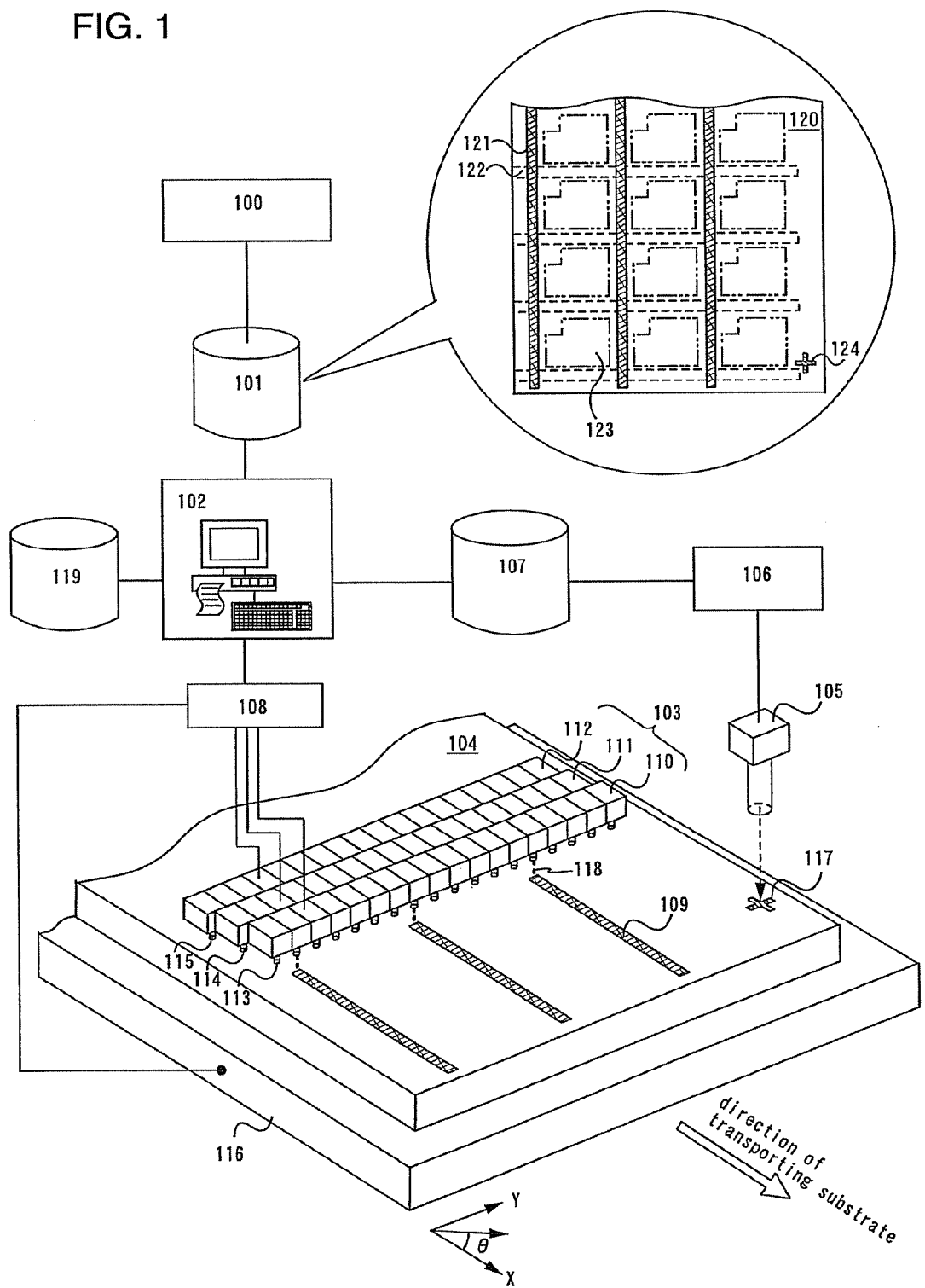
FIG. 1 illustrates a structure of a liquid droplet ejection system in accordance with the invention.
Figure 4A:
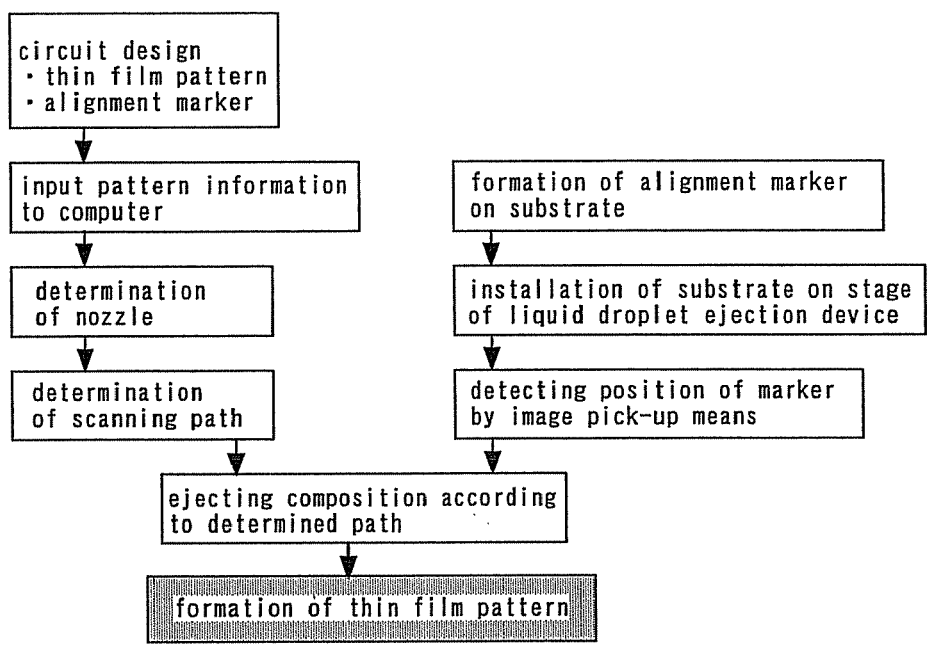
FIGS. 4A and 4B each illustrates a flow chart of a pattern formation using a liquid droplet ejection system in accordance with the invention.

Description is made on a liquid droplet ejection system in accordance the invention with reference to FIG. 1 and FIG. 4A.

First, circuit design is carried out by using a circuit design tool 100 such as CAD, CAM and CAE to determine the position of a desired thin film and alignment marker.

Then, data 101 of the thin film pattern including the positions of the designed thin film and alignment marker is inputted to a computer 102 for controlling the liquid droplet ejection system through information networks such as a recording medium and a LAN (Local Area Network). Based on the data 101 of the thin film pattern, a nozzle having an ejection head with an optimal bore diameter which stores a composition containing materials for forming the thin film or is connected to a container for storing the composition is selected among the nozzles of a liquid droplet ejection means 103 (a system having a cylindrical nozzle with a small hole in its distal end for ejecting liquid solution or gas) based on the data 101 of the thin film pattern. Subsequently, a scan path (moving path) of the liquid droplet ejection means 103 is determined. Note that in the case where an optimal nozzle is determined in advance, only a moving path of the nozzle is required to be set.

Then, an alignment marker 117 is formed over a substrate 104 on which the thin film is formed by using a photolithography technology or laser light. The substrate formed with the alignment marker 117 is then set on a stage 116 inside of the liquid droplet ejection system. The position of the alignment marker 117 is detected by an image pick-up means 105 provided in the system, and inputted to the computer 102 as the positional information 107 of the alignment marker through an image signal processing device 106. In the computer 102, the data 101 of the thin film pattern which is designed by CAD and the like is compared with the positional information 107 of the alignment marker which is obtained by the image pick-up means 105 in order to align the substrate 104 with the liquid droplet ejection means 103.

Subsequently, a composition 118 is ejected by the liquid droplet ejection means 103 controlled by a controller 108 along a determined scan path, whereby a desired thin film pattern 109 is formed. Note that the ejection quantity of compositions can be controlled appropriately by selecting the diameter of the ejection head, however, it differs slightly depending on various conditions such as the moving rate of the ejection head, distance between the ejection head and the substrate, ejection rate of the compositions, atmosphere of the ejected space and temperature and moisture of the space. Therefore, it is desirable that these conditions can also be controlled. It is desirable that these conditions are compiled into a database for each material included in the composition by obtaining optimal conditions through experiments and evaluations in advance.

As the data of the thin film pattern, for example, a circuit diagram of an active matrix TFT substrate used in a liquid crystal display device, an EL display device and the like can be used. The circuit diagram shown in a circle in FIG. 1 schematically illustrates a conductive film used in such an active matrix TFT substrate. Reference numeral 121 denotes a gate wiring, 122 denotes a source signal line, 123 denotes an electrode such as a pixel electrode, a hole injection electrode or an electron injection electrode. In addition, 120 denotes a substrate and 124 denotes an alignment marker. Needless to say, the thin film pattern 109 corresponds to the gate wiring 121 on the data of the thin film pattern.

The liquid droplet ejection means 103 has an integrated structure of nozzles 110, 111 and 112 here, however, the invention is not limited to this. In addition, each nozzle has a plurality of ejection heads 113, 114 and 115. The thin film pattern 109 is formed by selecting a predetermined ejection head 113 in the nozzle 110.

Note that in order that the liquid droplet ejection means 103 can meet the manufacture of a thin film pattern having various line widths, and that a tact time can be improved, a plurality of nozzles are desirably provided, each of which is different in the bore diameter, ejection quantity or a nozzle pitch. Each of the nozzle heads desirably has as narrow a spacing from each other as possible. In order to perform ejection to a large substrate of one meter or more on a side with high throughput, it is desirable that nozzles each having a length of one meter or more are provided. The spacing between adjacent nozzle heads may be controlled freely by providing an extending function thereto. In addition, in order to depict a high-resolution, that is a fine pattern, the nozzles or the heads are desirably set obliquely. Accordingly, a large-area pattern such as a rectangular pattern can be depicted.

It is also possible to provide another ejection head having a different nozzle pitch in parallel with one ejection head. In this case, the bore diameter of the ejection heads may be the same or different.

In addition, in the case where the liquid droplet ejection system has a plurality of nozzles as described above, a standby chamber for storing a nozzle which is not in use is required to be provided. When a gas supply means and a shower head are provided in the standby chamber, the nozzle can be placed under the same atmosphere of a gas as the solvent in the composition, therefore, drying can be prevented to a certain degree. Further, it is possible to provide a clean unit and the like to supply purified air and reduce dust in an operation area.

Figure 16A:
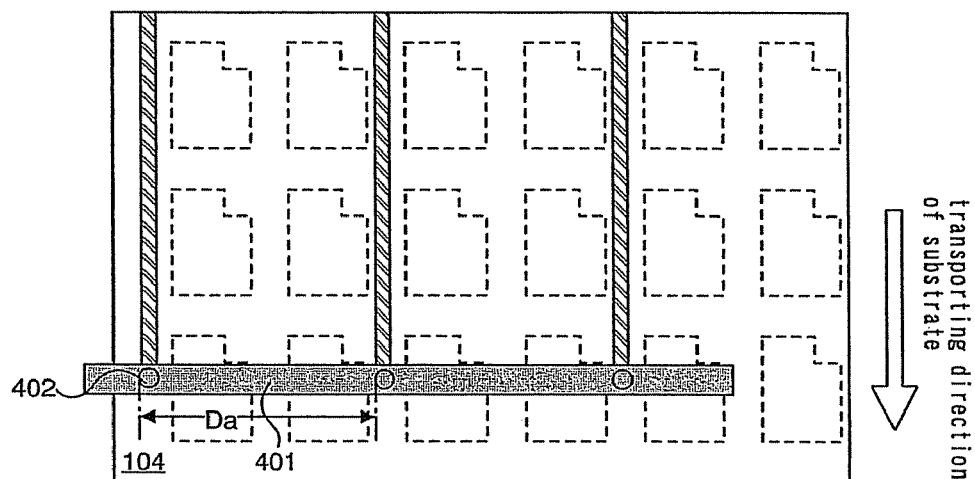
FIGS. 16A and 16B illustrate exemplary diagrams of an embodiment mode where wiring patterns on the even-numbered rows and wiring patterns on the odd-numbered rows are fowled separately by liquid droplet ejection using a plurality of nozzles each having a nozzle pitch n (n is an integer) times as large as the pixel pitch.
Figure 16B:
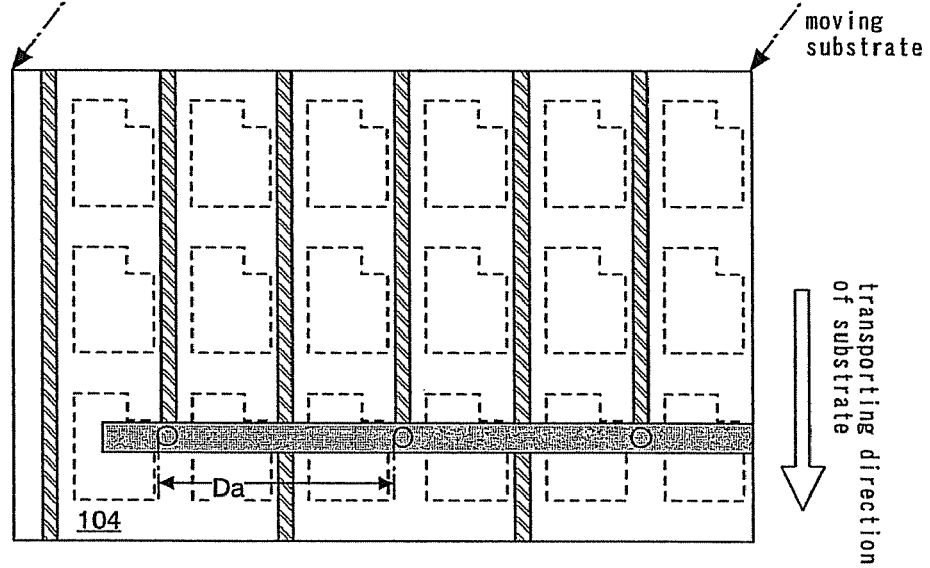

In the case where the spacing between the adjacent ejection heads cannot be designed narrow due to the specification of the nozzle, it is desirable that a nozzle pitch is designed to be integral times as large as the pixels of a display device. Accordingly, compositions can be ejected by moving the nozzles as shown in FIGS. 16A and 16B.

As the image pick-up means 105, a camera such as the one using a CCD (Charge Coupled Device) for converting the light intensity into an electrical signal can be used.

According to the aforementioned method described above, the thin film pattern 109 is formed by fixing the stage 116 over which is mounted the substrate 104 and operating the liquid droplet ejection means 103 to perform scanning along the determined path. Alternatively, the thin film pattern 109 may be formed by fixing the liquid droplet ejection means 103 and transferring the stage 116 in the direction of x, y and é along the determined path based on the data 101 of the thin film pattern. At this time, in the case where the liquid droplet ejection means 103 has a plurality of nozzles, it is required that a nozzle having an ejection head with an optimal bore diameter is selected which stores a composition containing materials for forming the thin film or is connected to a container for storing the composition.

According to the aforementioned method, the thin film pattern 109 is formed by liquid droplet ejection using only one predetermined ejection head of the nozzle 110, however, ejection of the composition may be performed using a plurality of ejection heads according to the line width or thickness of a thin film to be formed as shown in FIGS. 12A to 15C.

Alternatively, a redundant function may be provided by using a plurality of nozzles. Assume that a composition is ejected from the nozzle 112 (or 111) first. By controlling the ejection conditions so that the identical composition is ejected from the nozzle 110, a composition can be ejected from the rear nozzle 110 even when the former nozzle 112 has a problem such that the ejection head thereof is clogged and the like. Therefore, at least broken wirings and the like can be prevented.

Alternatively, by controlling the ejection conditions in such a manner that compositions are ejected from a plurality of nozzles each having an ejection head with a different bore diameter, a planar thin film can be formed in a reduced tact time as shown in FIGS. 12A to 12C and FIGS. 13A to 13C. This method is particularly suitable for the formation of a thin film which requires planarity and a large area to be ejected with a composition and such as a pixel electrode of an LCD, a hole injection electrode or an electron injection electrode of an EL display (corresponds to 123 in FIG. 1).

Figure 14:
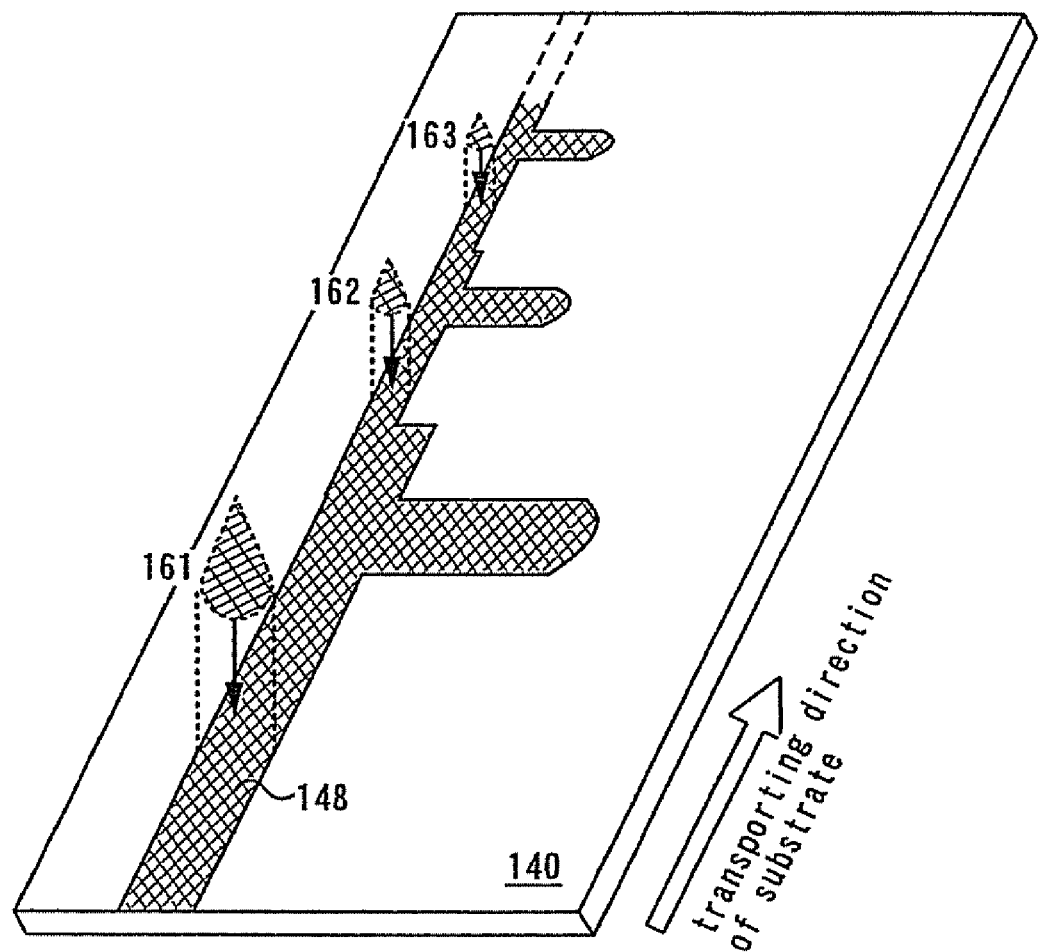
FIG. 14 illustrates an exemplary diagram of an embodiment mode where a ring having various line widths is formed by using a plurality of nozzles each having a different bore diameter.

Further, by controlling the ejection conditions in such a manner that compositions are ejected from a plurality of nozzles each having an ejection head with a different bore diameter, a wiring pattern having various line widths can be formed at once as shown in FIG. 14.

Figure 15A:
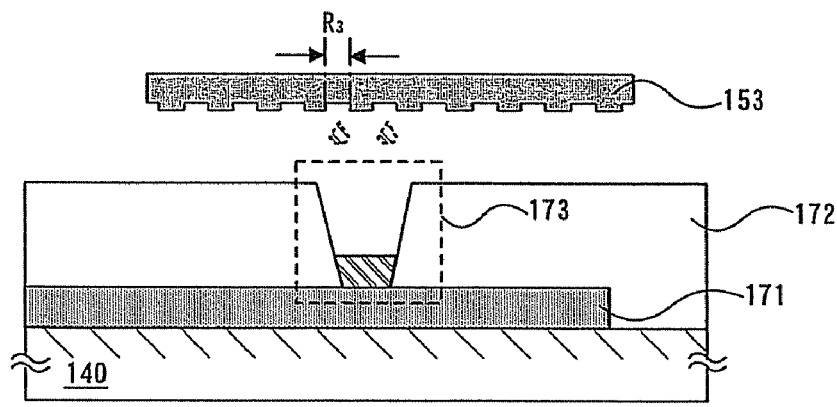
FIGS. 15A to 15C illustrate exemplary diagrams of an embodiment mode where an aperture is filled with conductive materials by liquid droplet ejection using a plurality of nozzles each having a different bore diameter.
Figure 15B:
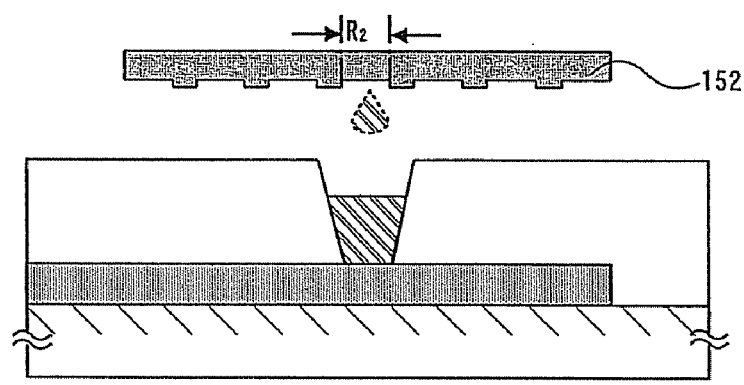
Figure 15C:
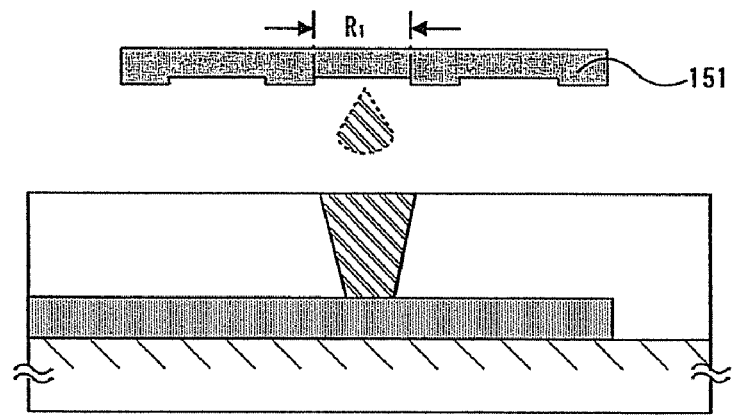

Further, by controlling the ejection conditions in such a manner that compositions are ejected from a plurality of nozzles each having an ejection head with a different bore diameter, an aperture having a high aspect ratio which is provided in a part of an insulating film 172 can be filled with compositions as shown in FIGS. 15A to 15C. According to such a method, voids (mothy holes produced between the insulating film 172 and a wiring) can be prevented, which enables the formation of a planarized wiring.

Figure 2:
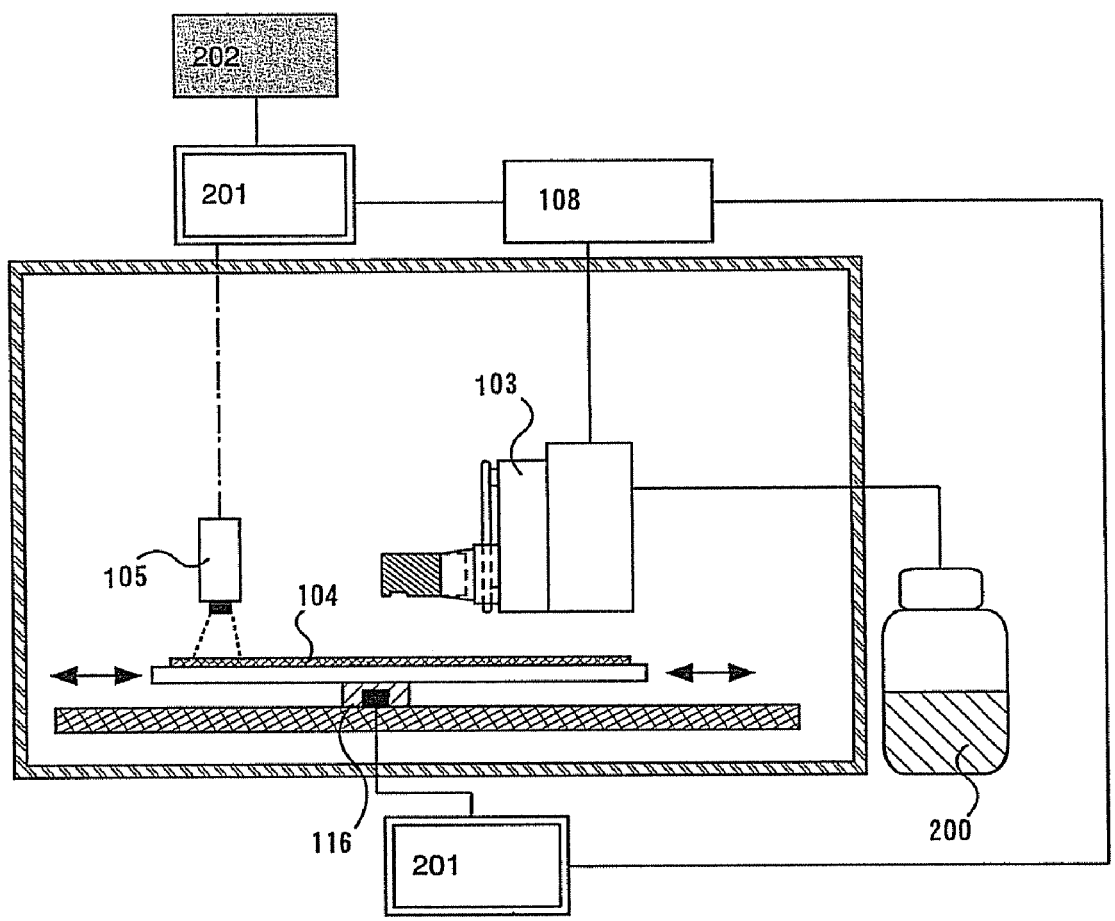
FIG. 2 illustrates a side view of a liquid droplet ejection system in accordance with the invention.

FIG. 2 illustrates a side view of a liquid droplet ejection device having the aforementioned liquid droplet ejection system. The liquid droplet ejection device comprises the liquid droplet ejection means 103 equipped with an ejection head in which a plurality of nozzles are arranged in one axial direction, the controller 108 and a CPU 201 for controlling the liquid droplet ejection means 103 and the stage 116 for fixing the substrate 104 to move it in the direction of x, y and é. The stage 116 also has a function to fix the substrate 104 by vacuum chuck and the like. Compositions are ejected from the ejection head of each nozzle of the liquid droplet ejection means 103 in the direction of the substrate 104, whereby a pattern is formed.

The stage 116 and the liquid droplet ejection means 103 are controlled by the CPU 201 through the controller 108. The image pick-up means 105 such as a CCD camera is also controlled by the CPU 201. The image pick-up means 105 detects an alignment marker formed on the substrate 104, and the positional information of the alignment marker can be checked with a monitor 202 after the image processing in the CPU 201. The liquid droplet ejection means 103 is connected to an ink bottle 200 which supplies compositions to the nozzle of the liquid droplet ejection means 103 and the ejection head thereof.

Note that in the formation of a pattern, the liquid droplet ejection means 103 may be moved, or the stage 116 may also be moved by fixing the liquid ejection means 103. However, in the case where the liquid droplet ejection means 103 is moved, the movement is required to be carried out in consideration of acceleration of the nozzle movement, distance between the nozzle equipped in the liquid droplet ejection means 103 and an object to be ejected with compositions, and its environment.

In addition, in order to prevent bulges from being produced at the beginning, the end or the changing point of directions in ejecting compositions, it is desirable to provide a start-up section before the compositions start to be ejected from the nozzle, and install it in a computer for controlling programs for calculating the moving distance to allow compositions to be ejected at the point where the acceleration of the substrate or the nozzle becomes constant.

Incidentally, additional components may be provided though not shown, such as a moving mechanism which allows the ejection heads 113 to 115 to move up and down and a control means thereof in order to improve the accuracy of the composition to be ejected. Accordingly, the distance between the ejection head and the substrate 104 can be changed in accordance with the characteristics of the ejected composition. When a gas supply means and a shower head are provided, the nozzle can be placed under the same atmosphere of a gas as the solvent in the composition, therefore, drying can be prevented to a certain degree. It is also possible to provide a clean unit and the like to supply purified air and reduce dust in an operation area. In addition, although not shown, a means for heating the substrate, and a means for measuring the temperature, pressure and various physical values may be provided, which can be collectively controlled by a control means provided outside of the housing. Further, when the control means is connected to a manufacturing management system through a LAN cable, a wireless LAN, an optical fiber and the like, process can be collectively controlled externally, leading to improved productivity. Note that vacuum evacuation may be performed to allow the operation under the reduced pressure in order to facilitate the discharged composition to be dry at speed and eliminate the solvent component in the composition.

Figure 3:
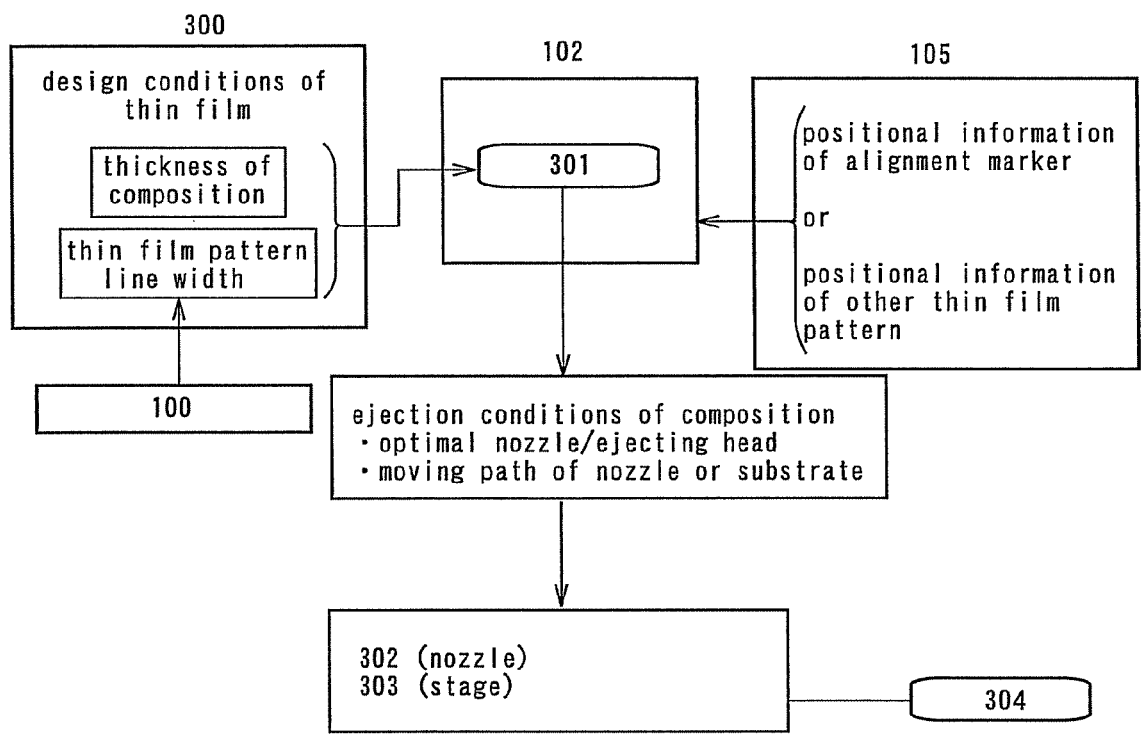
FIG. 3 illustrates a mechanism of a liquid droplet ejection system in accordance with the invention.

FIG. 3 schematically illustrates a mechanism of a liquid droplet ejection system in accordance with the invention. First, data of the thin film pattern designed with a circuit design tool 100 such as CAD, information of the composition type and the like are inputted to the computer 102 from an input means 300 (an input terminal, for example). Then, based on the inputted data of the thin film pattern, a moving path of a nozzle for ejecting a composition containing materials for forming the thin film or a moving path of a substrate transfer mechanism for supporting a substrate to which the composition is ejected are set. By detecting an alignment marker formed on the substrate using the image-pick up means 105 such as a CCD camera in advance in order to compare the positional information obtained by the image pick-up means 105 with the data of the thin film pattern, the substrate can be aligned with the nozzle. By moving an ejection mechanism 302 or a substrate transfer mechanism 303 along the set moving path by a control means 304 and ejecting the composition from the ejection head of the nozzle, a thin film having a desired shape can be formed at a desired position.

Embodiment Mode 2

Figure 4B:
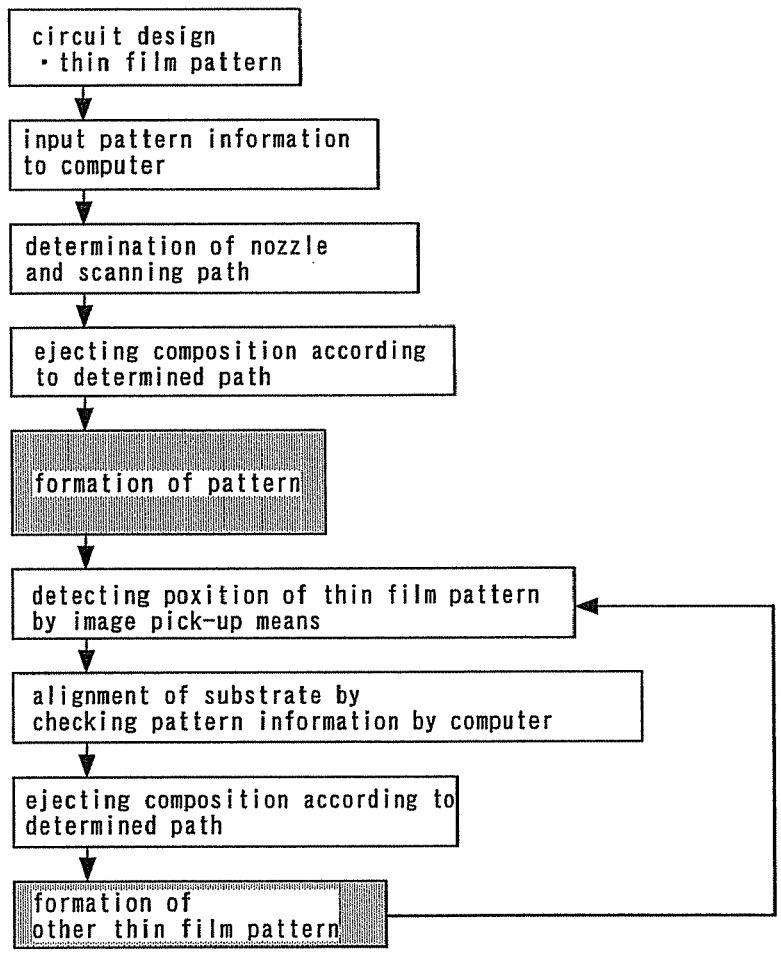

In Embodiment Mode 1, description is made on the case where a substrate is aligned with a nozzle using an alignment marker formed on the substrate. In this embodiment mode, description is made on the case where a first thin film pattern formed over a substrate in advance is detected by the image pick-up means 105 and the positional information thereof is compared with data 101 of a second thin film pattern designed by using CAD and the like in order to align the substrate with a nozzle for ejecting a composition containing materials for forming the second thin film with reference to FIG. 4B.

First, the first thin film pattern is formed over a substrate. The first thin film pattern may be formed by a system and a method similar to the ones in Embodiment Mode 1.

Then, data of the second thin film pattern is inputted to the computer 102 by an input means. Based on the inputted data of the second thin film pattern, a moving path of the nozzle for ejecting a composition containing materials for forming the thin film or a moving path of a substrate transfer mechanism for supporting the substrate to which the composition is ejected is set by the set means 301.

Then, the first thin film pattern is detected by using the image pick-up means 105, and the positional information thereof is compared with the data of the second thin film pattern designed by CAD and the like, whereby the substrate is aligned with the nozzle for ejecting a composition containing materials for forming the second thin film.

Then, the nozzle or the substrate transfer mechanism is moved along the set moving path, and the composition is ejected from the ejection head of the nozzle, whereby the second thin film pattern having a desired shape can be formed promptly at a desired position.

Similarly, by inputting a third thin film pattern and setting the moving path of the nozzle or the substrate while detecting the first thin film pattern or the second thin film pattern by the image pick-up means 105 so as to align the substrate with the nozzle, and further by moving the nozzle or the substrate transfer mechanism along the set moving path so as to eject a composition from the ejection head of the nozzle, the third thin film pattern having a desired shape can be formed promptly at a desired position.

Note that this embodiment mode can be implemented in combination with the aforementioned embodiment mode or the embodiments described below.

Embodiment Mode 3

Figure 5:
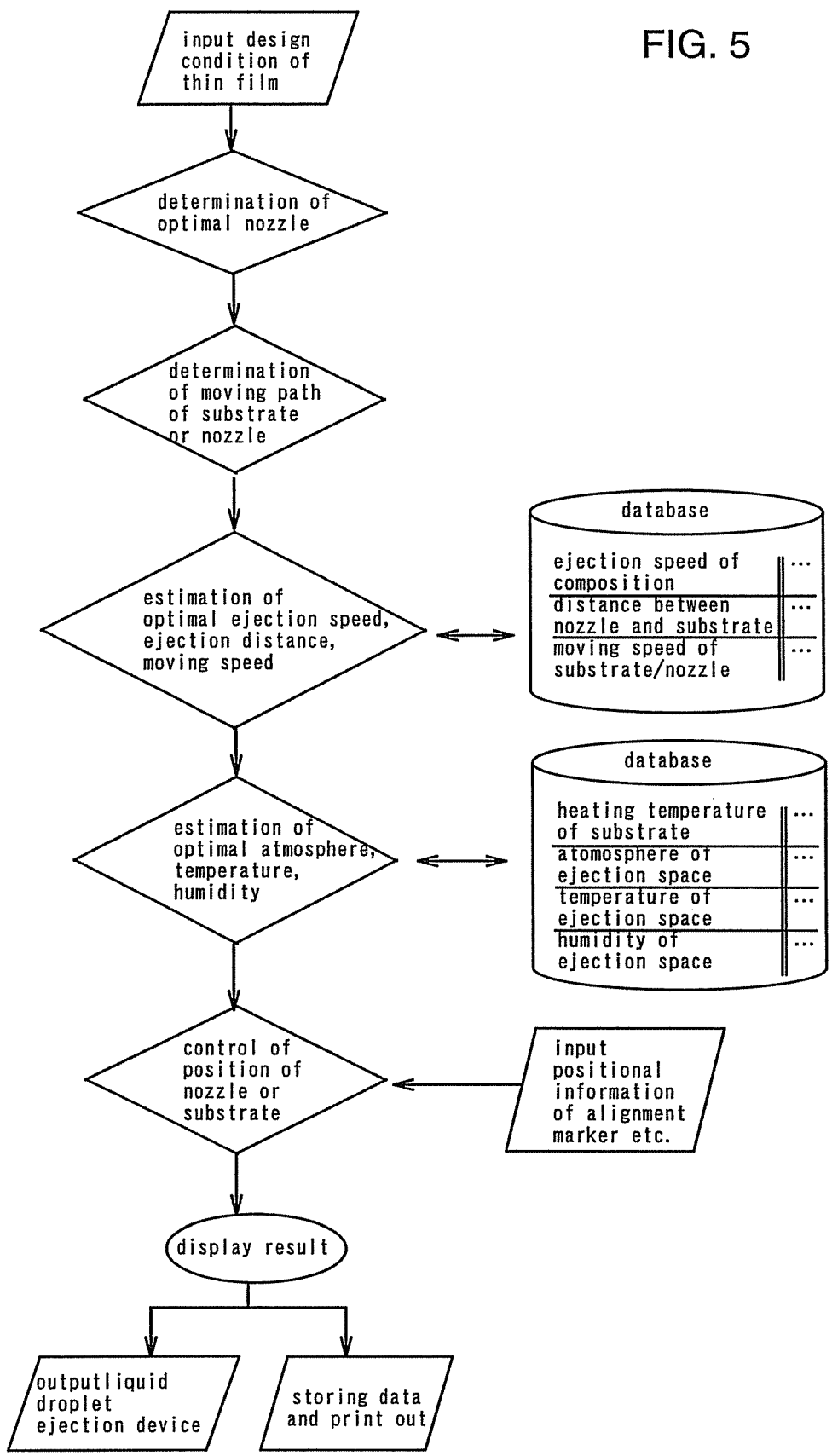
FIG. 5 illustrates a flow chart including a means for setting various conditions such as an ejection atmosphere and a heating temperature.

In this embodiment mode, description is made on a liquid droplet ejection system having a means for setting other ejection conditions in addition to the means for setting the moving path of a nozzle or a substrate transfer mechanism described in Embodiment Modes 1 and 2 with reference to FIGS. 1 and 5.

The liquid droplet ejection system described in this embodiment mode has a function to automatically control the ejection conditions of compositions, by using a database 119 (FIG. 1) in which optimized ejection conditions according to characteristics of the compositions are compiled, such as the moving rate of a nozzle or a substrate, ejection quantity of compositions, distance between a nozzle head and the substrate, ejection rate of compositions to be ejected from the ejection head, atmosphere of the space that the compositions are ejected, the temperature and moisture of the space, and heating temperature of the substrate.

FIG. 5 is a flow chart of a thin film formation using the liquid droplet ejection system. First, an optimal nozzle and moving path of a substrate or a nozzle are determined using a set means similar to the one in Embodiment Modes 1 and 2.

Then, according to the characteristics of the compositions to be ejected, such ejection conditions are set as the moving rate of a nozzle or a substrate, ejection quantity of compositions, distance between an ejection head of a nozzle and the substrate, ejection rate of compositions to be ejected from the ejection head, atmosphere of the space that the compositions are ejected, the temperature and moisture of the space, and heating temperature of the substrate. These conditions are determined by a determination means for determining an optimal parameter by comparing the designed data 101 of the thin film pattern with the data of the composition type, film thickness and the like based on a database in which a number of parameters that are obtained theoretically, experimentally and experientially are compiled.

In accordance with the determined ejection conditions, each mechanism of the liquid ejection system is controlled by the controller 108. For example, the distance between the nozzle head and the substrate can be changed by controlling the moving mechanisms which allows the ejection heads 113 to 115 of the nozzles to move up and down.

In the case of adopting a piezo jet technology using a piezo actuator (piezoelectric element) comprising a diaphragm, a lower electrode, a piezoelectric layer and an upper electrode as the head of the liquid droplet ejection means 103, the piezo layer sandwiched between both electrodes is flexed by providing a potential difference between the upper electrode and the lower electrode, whereby a liquid droplet is ejected. Therefore, by changing the voltage applied to both electrodes, ejection quantity or ejection rate of compositions can be controlled. Note that depending on the materials used as a liquid solution, what is called bubble jet (Japanese registered trademark) technology may be used in which the piezo actuator is replaced by a heating element, which is heated to produce bubbles of liquid solution to be ejected. In this case, ejection quantity or ejection rate of compositions can be controlled by changing the heating temperature of the heating element and the like.

In addition, in the case of controlling the atmosphere of the ejected space, $N_2$, $O_2$, organic gas or the like may be used according to the characteristics of the ejected compositions. The temperature of the ejected space and the heating temperature of the substrate can also be controlled according to the characteristics of the compositions. Further, these temperatures may be controlled in accordance with the processing after the ejection. For example, the temperatures can be controlled in accordance with drying and baking steps through which a conductive film is formed after the ejection of compositions containing the conductive material. One such example is that after the ejection of compositions containing Ag (Ag nanopaste), it is baked at a temperature of 200 to 250° C. in an ($N_2+O_2$) atmosphere (composition ratio of $O_2$ is desirably in the range of 10 to 30%), whereby a planar, low-resistant conductive film can be formed.

As described above, a desired thin film can be formed with high throughput by controlling the ejection conditions using the database and the determination means.

Embodiment 1

In this embodiment, description is made on a method for forming a gate wiring and a gate electrode of a TFT in an active matrix substrate by using a liquid droplet ejection system in accordance with the invention with reference to FIGS. 6A to 7B.

First, a gate wiring is formed by ejecting compositions containing conductive materials from a nozzle 401. By inputting a pattern of the gate wiring to a computer, the nozzle 401 and ejection heads for ejecting compositions are selected and a moving path of a substrate is determined by a set means. The substrate is transferred along the moving path and compositions are ejected from the selected ejection heads (portions denoted by black in the figure) in succession to form a gate wiring 403. Note that compositions may be ejected intermittently, for which case, it is desirable that ejection is performed with about half a pitch of the compositions ejected to the substrate (hereinafter referred to as a "half-dot pitch") as shown in FIGS. 8A to 9B in order to obtain a finer outline of the conductive film.

The conductive material is required to contain at least one of Ag, Au, Cu, Ni, Pt, Pd, Ir, Rh, W, Al, Ta, Mo, Cd, Zn, Fe, Ti, Si, Ge, Zr, Ba, ITO, ITSO, organic indium, organotin and zinc oxide (ZnO). Here, a composition called a nanopaste containing Ag is used. The nanopaste is an organic solvent dispersed or dissolved with Ag. However, the nanopaste also includes a dispersing agent or thermosetting organic resin called binder. In particular, the binder functions to prevent cracks or uneven baking from being produced during baking. Further, through drying or baking steps, evaporation of an organic solvent, elimination of the dispersing agent by dissolution and curing/shrinking of the binder all proceed simultaneously, whereby nanoparticles are fused to cure the nanopaste. At this time, nanoparticles grow to be several tens to one hundred and several tens nm in diameter, whereby adjacent grown particles are fused to be linked together, forming a metallic bond. On the other hand, most of the remnant organic component (about 80 to 90%) is pushed out of the metallic bond, and consequently, a conductive film containing the metallic bond and a film containing an organic component covering the exterior thereof are formed.

After the gate wiring 403 is formed and the stage 116 over which is mounted the substrate 104 is turned clockwise by 90 degrees, a gate electrode portion is formed by ejecting compositions containing conductive materials from the nozzle 401. First, by inputting a pattern of the gate electrode portion to a computer, the nozzle 401 and the ejection heads for ejecting compositions are selected, and a moving path of the substrate is determined through the set means. The substrate is moved along the determined moving path, and compositions are intermittently ejected from the selected ejection heads (portions denoted by black in the figure), whereby a gate electrode 404 is formed.

Ag is used as the conductive material for the gate electrode 404 as well as the gate wiring 403, however, other materials may be selected from the aforementioned materials. By controlling the ejection quantity of the nozzle 401, the gate electrode 403 and the gate electrode 404 having different line widths can be formed.

Note that the gate wiring 403 and the gate electrode 404 are formed through drying and baking steps after ejection of compositions, however, the drying and baking steps may be performed after the complete termination of the ejection or performed to each of the gate wiring 403 and the gate electrode 404. The baking steps are preferably performed in an ($N_2+O_2$) atmosphere (composition ratio of $O_2$ is desirably in the rage of 10 to 30%) at 200 to 250° C. in the case where compositions containing Ag (Ag nanopaste) are used.

In addition, although the same conductive materials are used for the gate wiring 403 and the gate electrode 404 here, a different conductive material may be used as long as the function of a conductive film to be formed is disturbed. For example, it is possible that Al and Cu are used for the gate wiring 403 while Ag is used for the gate electrode 404, or vice versa. The conductive material may be selected appropriately in consideration of a cost and resistance value.

Figure 6A:
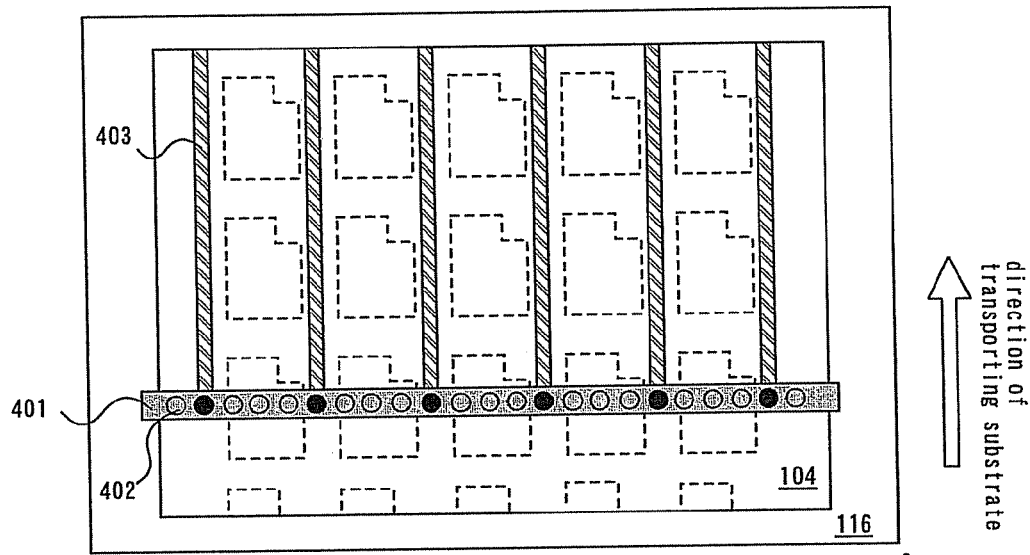
FIGS. 6A and 6B illustrate an embodiment mode for forming one wiring by liquid droplet ejection through rotation of a stage of a substrate.
Figure 6B:
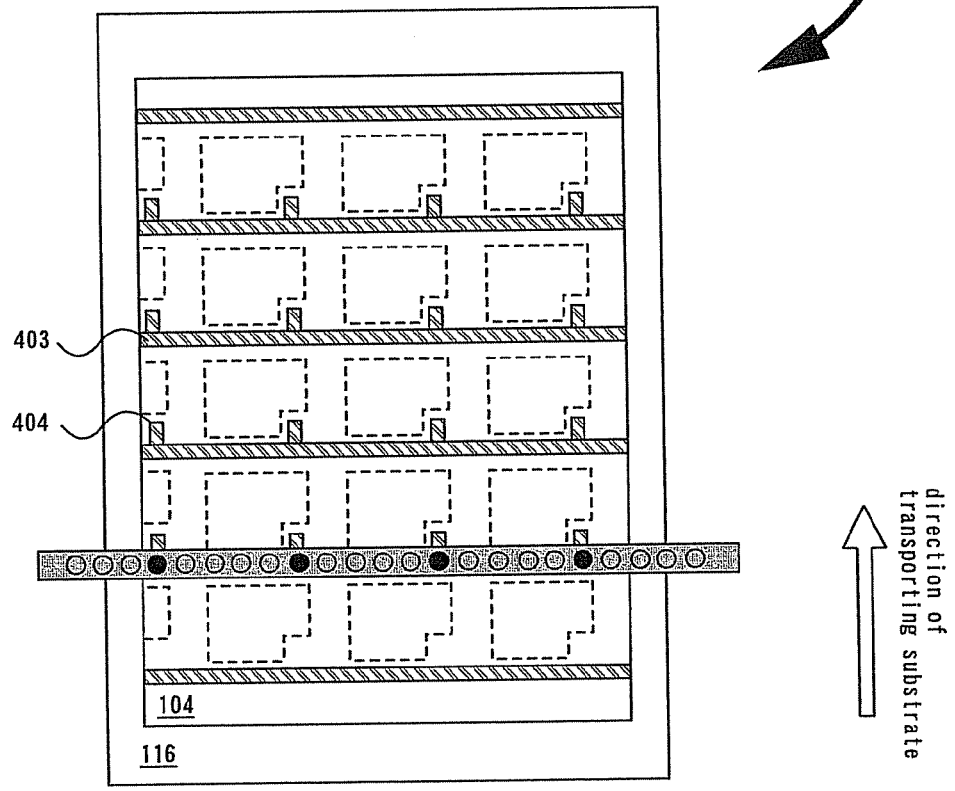

Through repetition of the steps in FIGS. 6A and 6B, the gate wiring 403 and the gate electrode 404 each having a multi-layer structure can be formed as well. In this case also, the multi-layer structure can be formed by using different materials.

In this embodiment mode, the nozzle 401 remains stationary, however, it may be moved in the direction of X, Y and é.

Figure 7A:
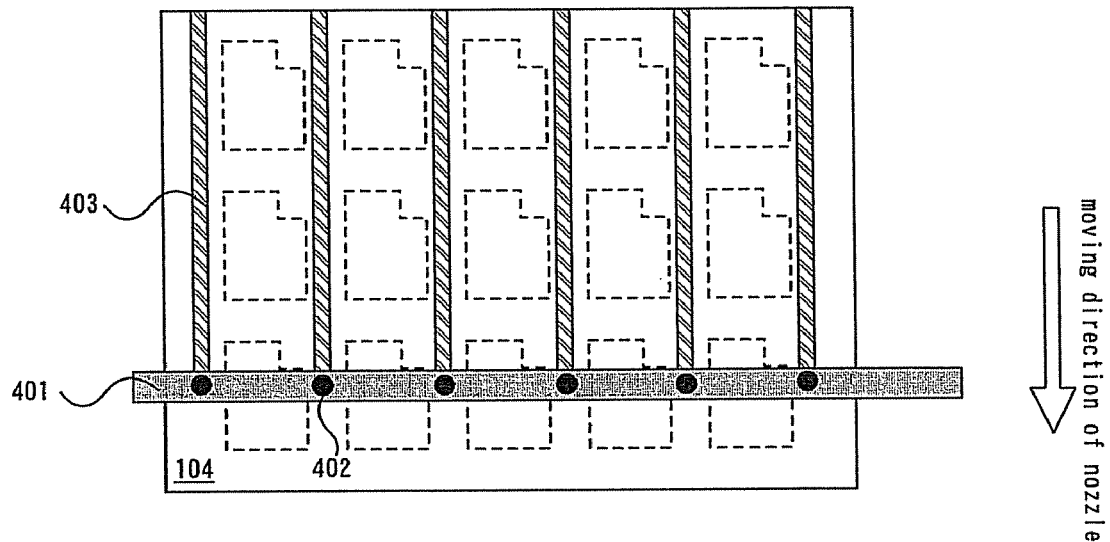
FIGS. 7A and 7B illustrate an embodiment mode for forming one wiring by liquid droplet ejection using different nozzles.
Figure 7B:
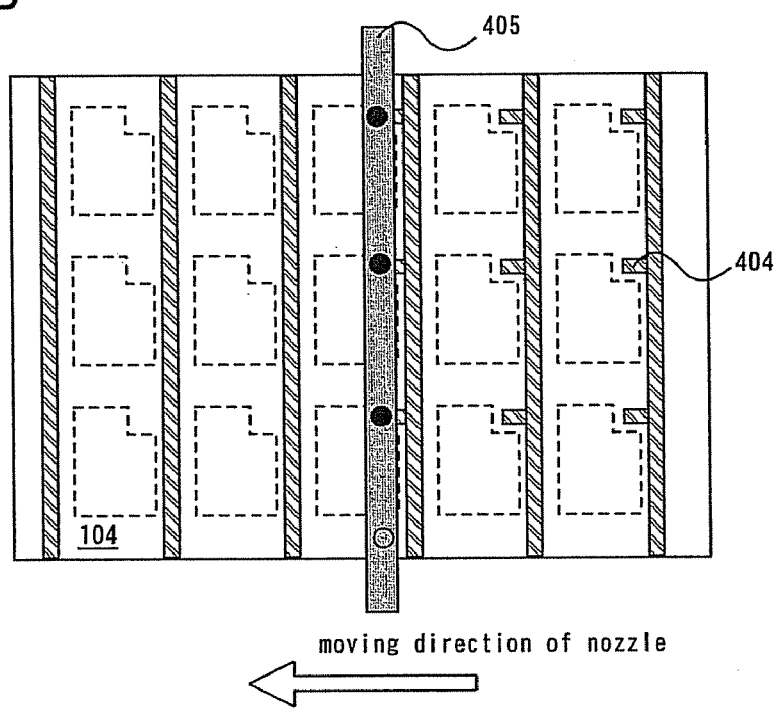

In the case of using one rotatable nozzle, ejection quantity may be changed between the gate wiring 403 and the gate electrode 404. Alternatively, the gate wiring 403 and the gate electrode 404 may be formed by using a plurality of nozzles 401 and 405 in the condition where the substrate 104 is fixed as shown in FIGS. 7A and 7B. These nozzles may each have different nozzle pitch or a different ejection bore diameter. The gate wiring 403 and the gate electrode 404 may be formed of the aforementioned materials.

Note that the liquid droplet ejection system used in this embodiment may be the one shown in the aforementioned embodiment modes. This embodiment can be implemented in combination with the aforementioned embodiment modes or other embodiments. In addition, the method described in this embodiment can be applied not only to the formation of a conductive film of a gate electrode and the like of a TFT in an active matrix substrate but also to the formation of various films which can be formed by other liquid droplet ejection methods.

Embodiment 2

In this embodiment, description is made on a method for forming a wiring using a liquid droplet ejection system in accordance with the invention with reference to FIGS. 8A to 9B.

Figure 8A:
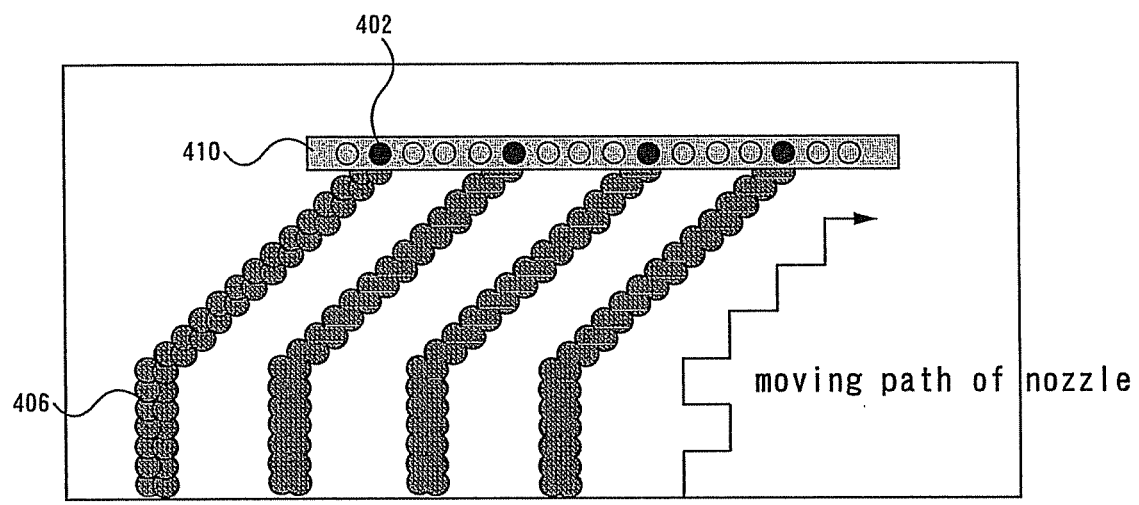
FIGS. 8A and 8B illustrate comparative diagrams of the case where liquid droplet ejection is performed at a nozzle pitch of 1-dot intervals or half-dot intervals.
Figure 8B:
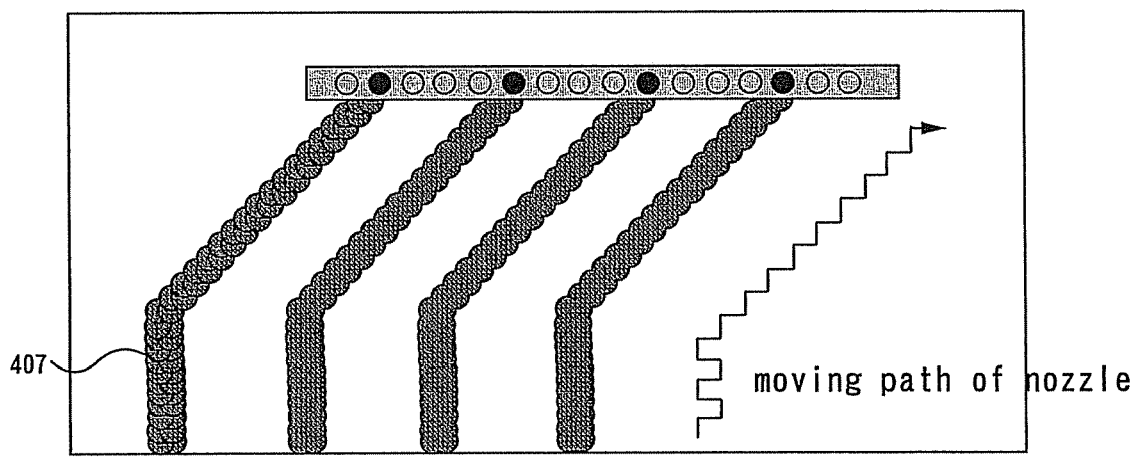
Figure 9A:
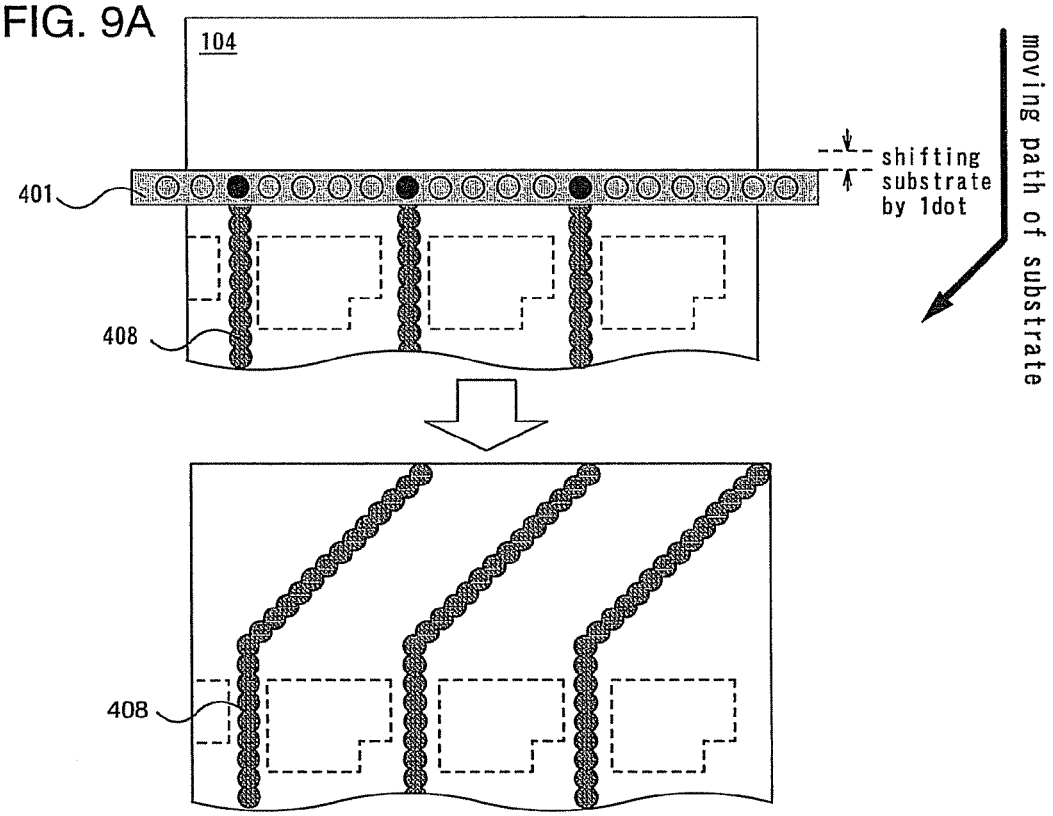
FIGS. 9A and 9B illustrate comparative diagrams of the case where liquid droplet ejection is performed at a nozzle pitch of 1-dot intervals or half-dot intervals.

In the case where compositions are ejected intermittently at intervals of one dot (diameter of the composition ejected to a substrate) as shown in FIGS. 8A and 9A, wirings 406 and 408 each has remarkably depressed/projecting shapes. However, in the case where the ejection is performed with a half-dot pitch as in FIGS. 8B and 9B, wirings 407 and 409 have far finer shapes as compared to the case of one-dot pitch ejection.

Figure 9B:
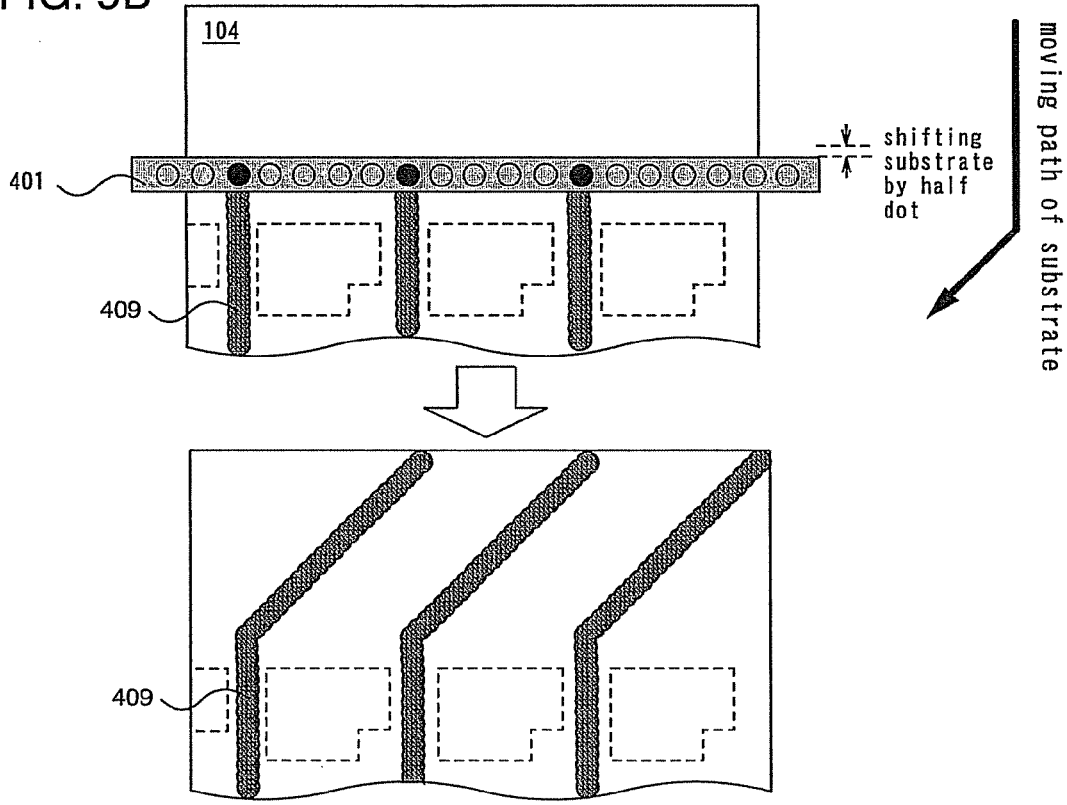
Figure 10A:
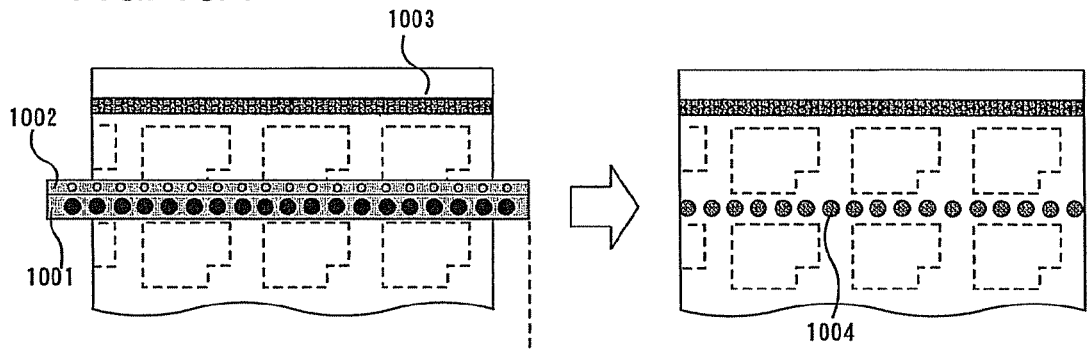
FIGS. 10A to 10D illustrate exemplary diagrams of an embodiment mode where one wiring is formed with a plurality of nozzles each having a different bore diameter.
Figure 10B:
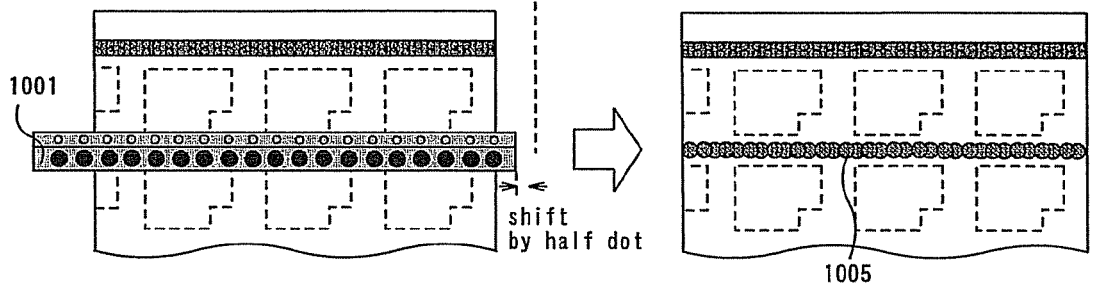
Figure 10C:
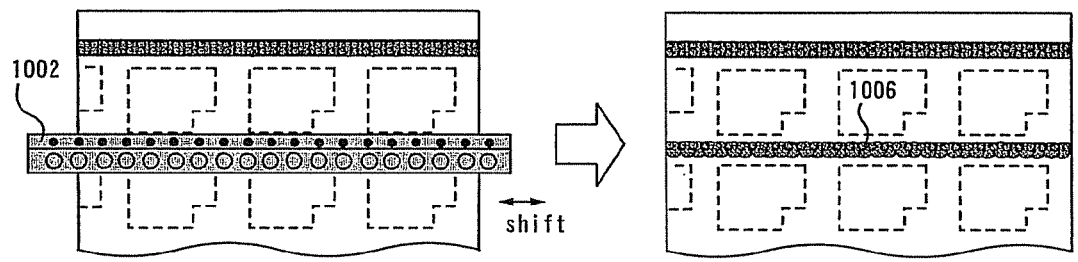
Figure 10D:
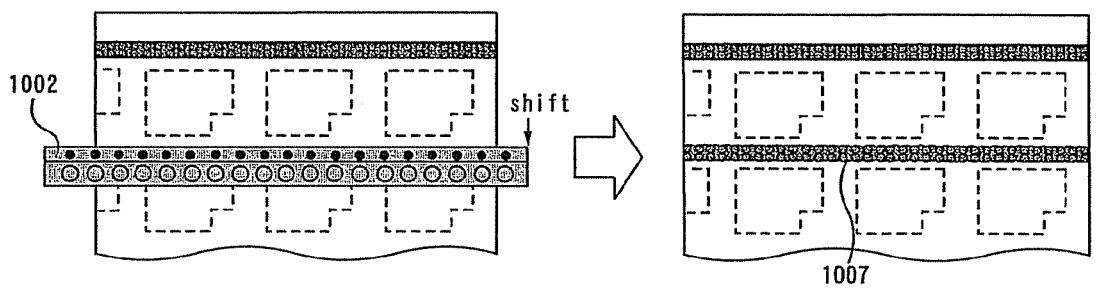

FIGS. 8A and 8B illustrate the examples where a movable nozzle 410 moves along its moving path that is from up right up left . . . up right up right . . . in order to faun the wirings 406 and 407. FIGS. 9A and 9B illustrate examples where the substrate 104 moves along the moving path (moving path of the stage over which is the substrate is formed) that is from down down . . . lower right lower right . . . in order to form the wirings 408 and 409 over the substrate 104. These methods can be applied to the case of forming various wirings and thin films as well. Note that the aforementioned method can be applied to the case where compositions are ejected in succession as well.

Further, a multi-layer wiring may be formed by ejecting compositions containing a different conductive material from that of the aforementioned composition. In addition, by forming a wiring having a saw-bladed shape or depressed/projecting shape, a protection circuit to be provided around an active matrix substrate can be formed. This protection circuit functions to prevent excessive charges applied to a wiring in the TFT formation steps by utilizing its specific shape, namely dielectric breakdown of a TFT, which is also referred to as an electric discharge pattern.

Note that the liquid droplet ejection system used in this embodiment may be the one described in the aforementioned embodiment mode. This embodiment can be implemented in combination with the aforementioned embodiment modes or other embodiments. In addition, the method described in this embodiment can be applied not only to the formation of a conductive film of a wiring and the like but also to the formation of various films which can be formed by other liquid droplet ejection methods.

Embodiment 3

In this embodiment, description is made on a method for forming a wiring used for a TFT in an active matrix substrate by using a liquid droplet ejection system in accordance with the invention with reference to FIGS. 10A to 10D.

First, at least two nozzles 1001 and 1002 each having a different ejection bore diameter are provided. A composition 1004 is formed by ejection using the nozzle 1001 having a larger ejection bore diameter. Subsequently, the nozzle 1001 is shifted by half dot to eject a composition 1005. By shifting the nozzle 1001 by half dot, a fine-patterned wiring can be formed over a substrate 1003.

However, in the case where a further fine-patterned, planar wiring is formed, the nozzle 1002 having a smaller ejection bore diameter is used to eject compositions 1006 and 1007 so as to fill in the depressions/projections of the compositions 1004 and 1005.

Further, a multi-layer wiring may be formed by ejecting compositions containing a different conductive material from that of the aforementioned compositions. In addition, by ejecting compositions using a plurality of nozzles disposed at the before and behind, a redundant function (repair function) may be provided.

Note that the liquid droplet ejection system used in this embodiment may be the one described in the aforementioned embodiment modes. This embodiment can be implemented in combination with the aforementioned embodiment modes or other embodiments. In addition, the method described in this embodiment can be applied not only to the formation of a conductive film of a wiring and the like used for a TFT in an active matrix substrate but also to the formation of various films which can be formed by other liquid droplet ejection methods.

Embodiment 4

Figure 11:
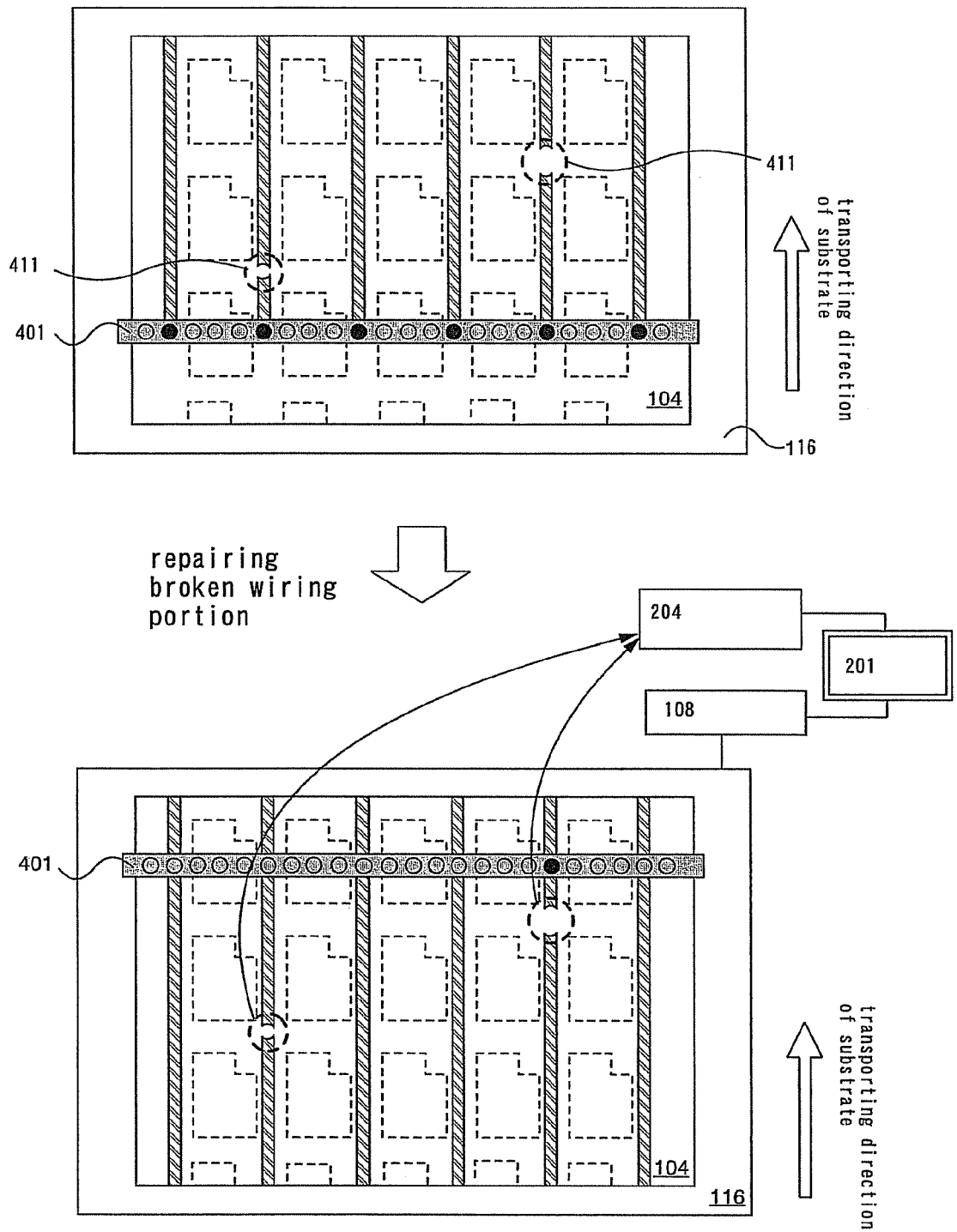
FIG. 11 illustrates exemplary diagrams of an embodiment mode where a broken wiring portion is repaired by using an aperture detecting means.
Figure 17:
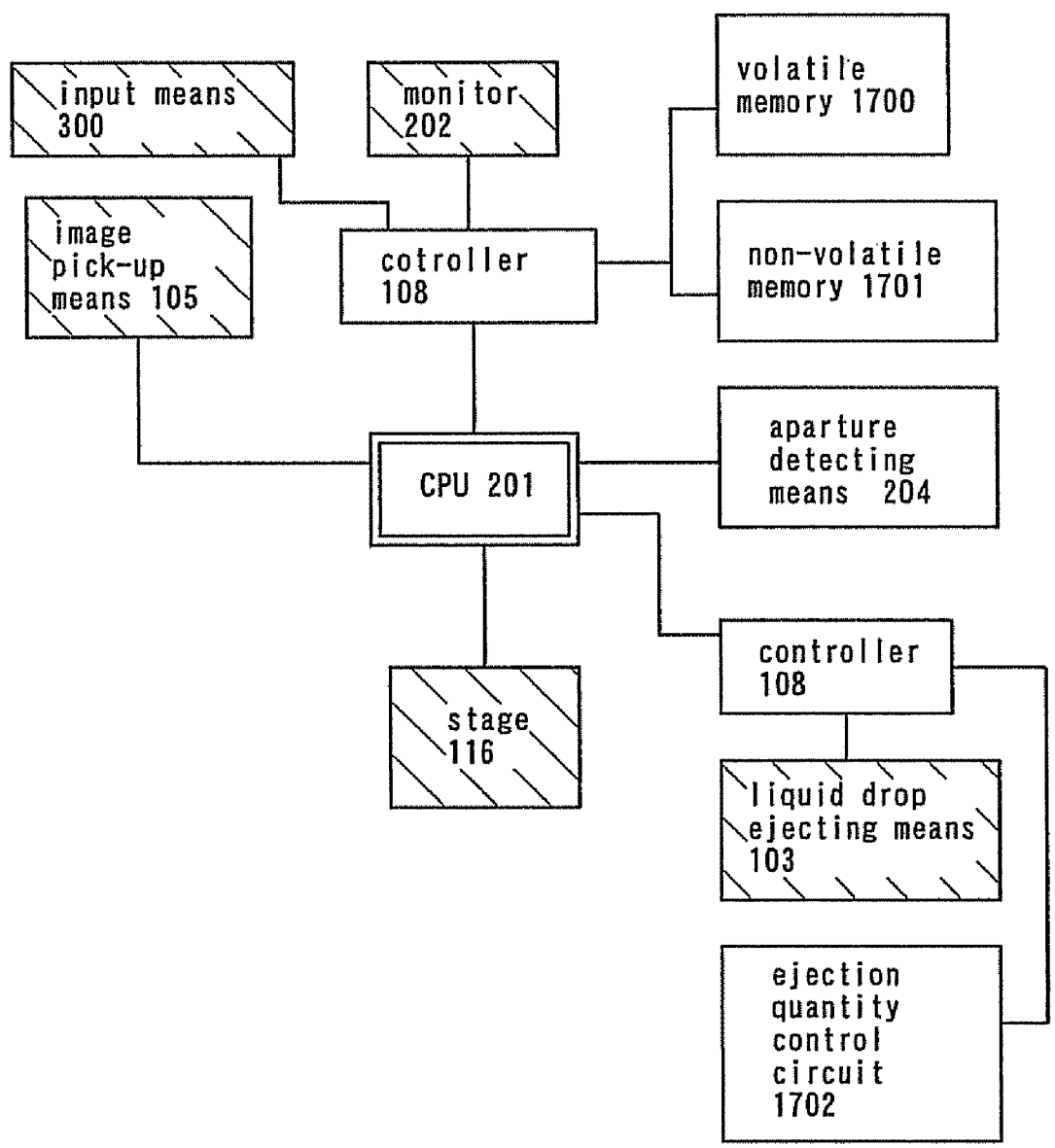
FIG. 17 illustrates a mechanism of a liquid droplet ejection system having an aperture detecting means.

In this embodiment, description is made on another method for forming a wiring used for a TFT in an active matrix substrate by using a liquid droplet ejection system in accordance with the invention with reference to FIGS. 11 and 17.

An aperture detecting means 204 for detecting a broken wiring portion (aperture) 411 of a wiring formed by using the nozzle 401 is provided. By controlling the stage 116 of a substrate or the liquid droplet ejection means 103 with a controller 108 based on the positional information of the broken wiring portion 411 through the CPU 201, the broken wiring portion 411 can be filled to be repaired. Note that the aperture detecting means 204 may be an image pick-up means such as a CCD camera and the like as described in embodiment modes.

FIG. 17 illustrates a mechanism of a liquid droplet ejection system in accordance with the invention. The mechanism includes the aperture detecting means 204 for detecting the broken wiring portion 411 and the like, the image pick-up means 105 for detecting an alignment marker and the like, and volatile and non-volatile memories 1700 and 1701 as a store means for storing data of the thin film pattern designed by CAD and the like, or information obtained by the input means 300 for inputting various design conditions of the thin film. In addition, an ejection quantity control circuit 1702 for controlling the ejection quantity of compositions in repairing is provided. These additional mechanisms can be applied to the aforementioned embodiment modes or other embodiments.

By detecting a contact hole formed in an insulating film such as an interlayer insulating film utilizing the aperture detecting means 204 as described in the embodiment below, selecting an optimal nozzle in accordance with the diameter of the aperture based on the positional information thereof and controlling the stage 116 of the substrate or the liquid droplet ejection means 103, a conductive film can be formed in the contact hole portion.

Note that the aforementioned system can be applied to the case of forming an aperture. For example, when data at the position on which an aperture is formed is inputted by the input means 300, compositions containing etchant are selectively ejected by the liquid droplet ejection means 103 based on the data. Accordingly, an aperture can be formed selectively.

Description is made now on a system for controlling the ejection quantity in accordance with the depth, diameter or an aspect ratio of an aperture. The aperture detecting means 204 has a function to detect a nozzle having a diameter corresponding to the depth of an aperture, and it may be a known sensor. In general, a diameter of an aperture is tapered downwardly, therefore, it is preferable to use a nozzle having the smallest bore diameter first, and then a nozzle having a larger bore diameter by degrees. In the case of using a nozzle with a piezo actuator, ejection quantity is controlled by controlling the waveform applied to the piezo actuator. That is, the aforementioned characteristics may be applied to such a system. In particular, a nozzle having an ejection head with an optimal diameter is selected based on the information obtained by the aperture detecting means 204. Subsequently, the ejection quantity control circuit the 1702 for controlling the waveform applied to the piezo actuator may be used in order to optimize the ejection quantity ejected from the nozzle.

Note that the liquid droplet ejection system used in this embodiment may be the one described in the aforementioned embodiment modes. This embodiment can be implemented in combination with the aforementioned embodiment modes or other embodiments. In addition, the method described in this embodiment can be applied not only to the formation of a conductive film of a wiring and the like but also to the formation of various films which can be formed by other liquid droplet ejection methods.

Embodiment 5

In this embodiment mode, description is made on a method for forming a conductive film in a large area such as a pixel electrode, a hole injection electrode and an electrode injection electrode of an active matrix substrate by using a liquid droplet ejection system in accordance with the invention with reference to FIGS. 12A to 13C.

Figure 12A:
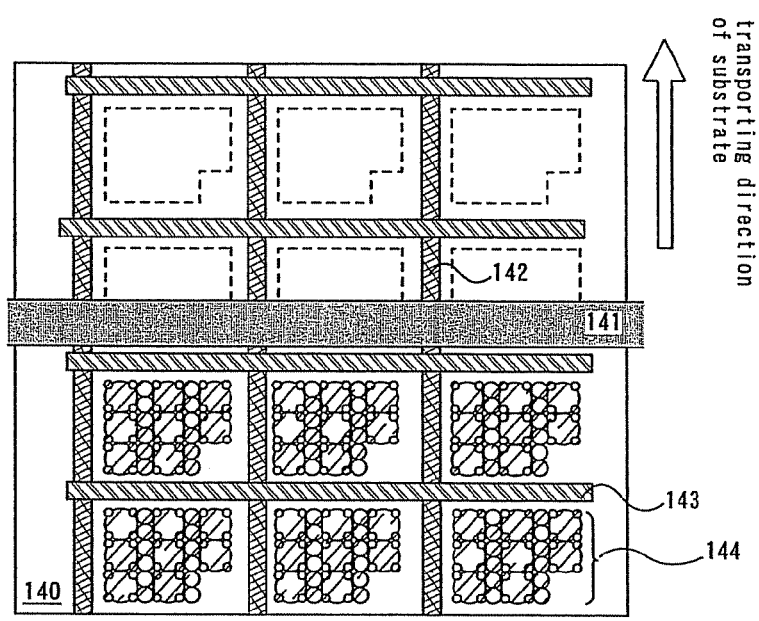
FIGS. 12A to 12D illustrate exemplary diagrams of an embodiment mode where an electrode is formed with a plurality of nozzles each having a different bore diameter.

FIG. 12A illustrates a pattern formation over a substrate 140, and more particularly the pattern formation of a pixel electrode 144 over the substrate 140. In FIGS. 12A to 12D, 141 denotes a liquid droplet ejection means, and wirings 142 and 143 are formed over the substrate 140 in advance by the liquid droplet ejection means 141 or other means. In the shown mode, the substrate 140 is transferred to form a pattern of the pixel electrode 144.

In the invention, a pattern is formed by using the liquid droplet ejection means 141 comprising a plurality of rows of nozzles each having ejection heads arranged in one axial direction. In this embodiment, description is made on the case where the liquid droplet ejection means 141 comprises nozzles 151 to 153 with the ejection bore diameters of $R_1$, $R_2$ and $R_3$ ($R_1 > R_2 > R_3$) respectively.

Note that at the moment that a liquid droplet is ejected from a nozzle, the liquid droplet has the same diameter to that of the ejection head. However, when a liquid composition is landed on onto the substrate, the diameter of the composition has a larger diameter than that of the ejection head. This is dependent on the ejection quantity. The smaller the ejection quantity is, the slighter the change in diameter of the composition is between before and after the discharge. Taking an example to give a specific numeric value, when the ejection quantity is 0.01 pl, the diameter of the ejection head of the nozzle is 3 ìm whereas the diameter of a discharged composition is 3.25 ìm, which is 1.08 times as large. When the ejection quantity is 0.1 pl, the diameter of the ejection head of the nozzle is 6.5 ìm whereas the diameter of a discharged composition is 7 ìm, which is 1.08 times as large. When the ejection quantity is 1 pl, the diameter of the ejection head of the nozzle is 13 ìm whereas the diameter of a discharged composition is 16 ìm, which is 1.23 times as large. The description is made below assuming two cases, that is the case where the ejection head of the nozzle is substantially the same in diameter as the landed composition (for example, 1.1 times as large or less) and the case where the landed composition is larger in diameter than the ejection head of the nozzle (for example, 1.1 times as large or more).

First, description is made on the assumption that the ejection head of the nozzle is substantially the same in diameter as the discharged composition (for example, 1.1 times as large or less) with reference to FIGS. 12A to 12D.

Figure 12B:
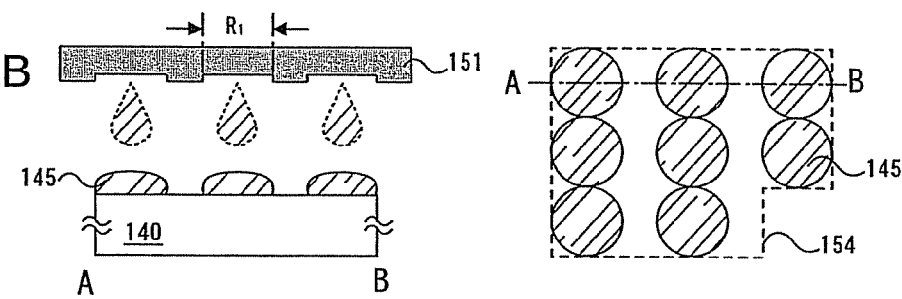
Figure 12C:
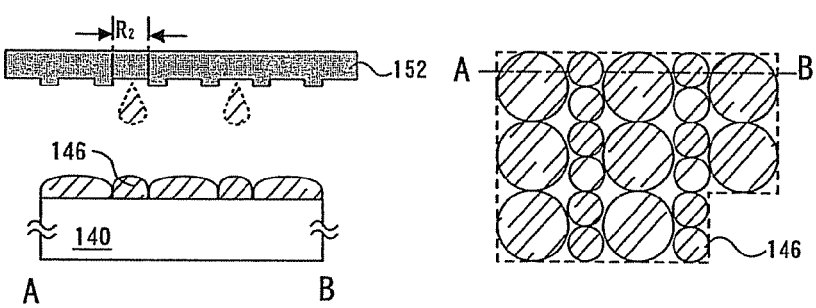
Figure 12D:
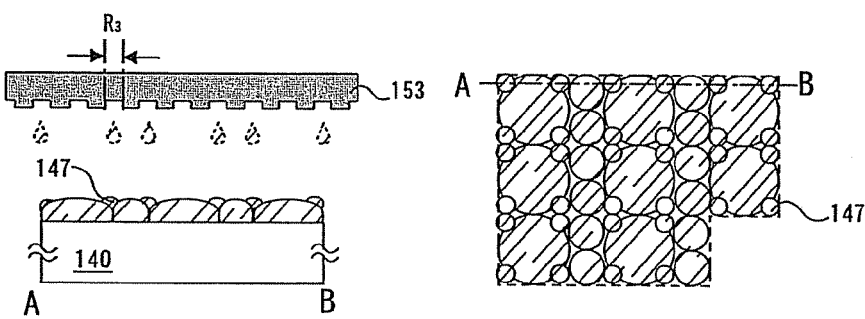

First, a pattern 145 is formed by using a nozzle 151 with the ejection bore diameter $R_1$ (FIG. 12B). A region 154 surrounded by a dotted line is a pattern formation region. As shown in the figure, the pattern is striped since there is a spacing between ejection heads of the adjacent nozzles. Then, a pattern 146 is formed by using a nozzle 152 with the ejection bore diameter $R_2$ (FIG. 12C). In this step, a composition is ejected onto the region where no pattern is formed in the previous step. Through the above steps, substantially the whole surface of the pattern formation region 154 is ejected with compositions. However, the pattern has an irregular surface as shown in the cross-sectional view. At the end, a pattern 147 is formed by using a nozzle 153 with the ejection bore diameter $R_3$ (FIG. 12D). The above steps are performed in order to planarize the pattern, and compositions are selectively ejected onto the irregular portions. Accordingly, a pattern with a planarized surface can be formed as shown in the cross-sectional view.

Figure 13A:
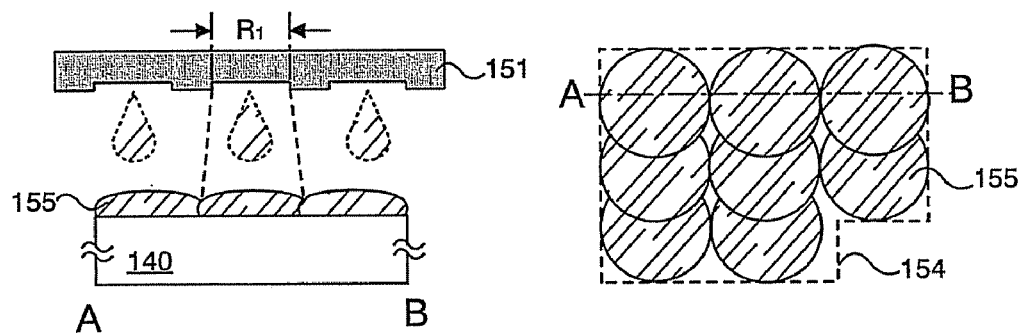
FIGS. 13A to 13C illustrate exemplary diagrams of an embodiment mode where a planar wiring is formed with a plurality of nozzles each having a different bore diameter.
Figure 13B:
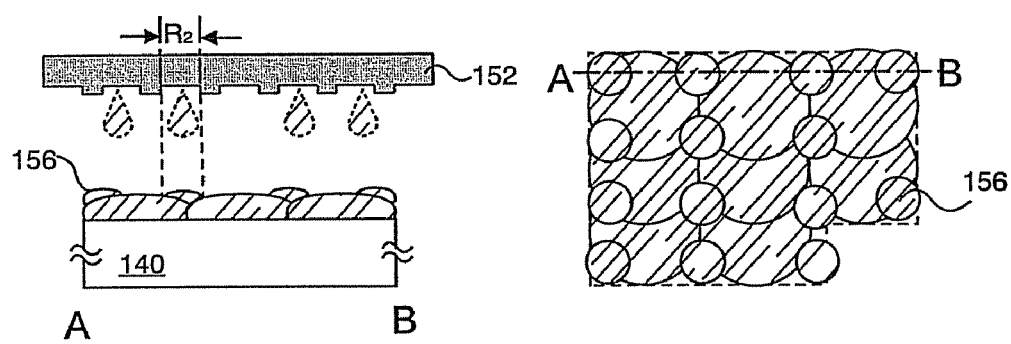
Figure 13C:
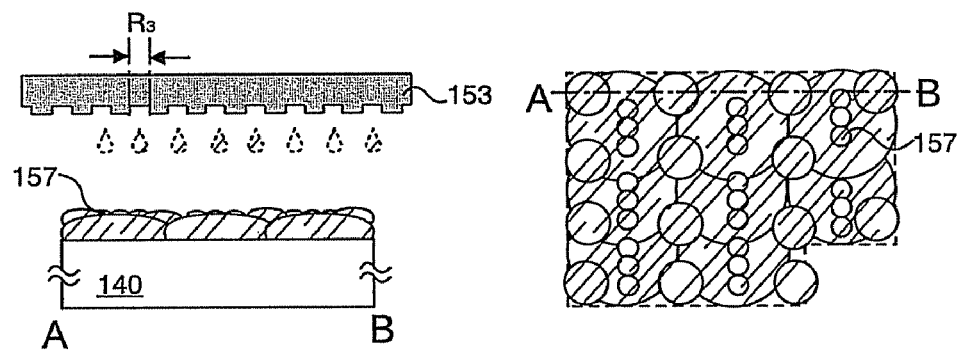

Description is made now on the assumption that the landed composition is larger in diameter than the ejection head of the nozzle with reference to FIGS. 13A to 13C.

First, a pattern 155 is formed by using the nozzle 151 having an ejection head with the diameter $R_1$ (FIG. 13A). A region 154 surrounded by a dotted line is a pattern formation region. In this case, substantially the whole surface of the pattern formation region 154 is ejected with compositions since the diameter of the landed composition is different from the diameter of the ejection head of the nozzle 151. However, the pattern has an irregular surface as shown in the cross-sectional view. Then, a pattern 156 is formed by using the nozzle 152 with the ejection bore diameter $R_2$ (FIG. 13B). In this step, a composition is ejected onto the irregular portions which are produced in the previous step. Through the above steps, nearly the entire irregularity on the surface of the pattern is eliminated. At the end, a pattern 157 is formed by using the nozzle 153 having an ejection head with the diameter $R_3$ (FIG. 13C). The above steps are performed in order to planarize the pattern, and compositions are selectively ejected onto the irregular portions. Accordingly, a pattern with a planarized surface can be formed as shown in the cross-sectional view.

According to the aforementioned structure of the invention, a pattern is formed first by using a nozzle having the largest bore diameter, and then compositions are selectively ejected to the portions, where no pattern is formed by the nozzle having the largest bore diameter, by using a nozzle having a smaller bore diameter than the nozzle having the largest bore diameter. Subsequently, compositions are selectively ejected to planarize the surface of the pattern as required by using a nozzle having a smaller bore diameter than the nozzle which is used previously. This method is effective for the formation of not only wirings but also other patterns of a conductive film having a relatively large area such as a pixel electrode of an LCD, and a hole injection electrode or an electrode injection electrode of an OELD. Thus, a planarized pattern can be formed without irregularity on its surface.

Note that the liquid droplet ejection system used in this embodiment may be the one described in the aforementioned embodiment modes. This embodiment can be implemented in combination with the aforementioned embodiment modes or other embodiments. In addition, the method described in this embodiment can be applied not only to the formation of a conductive film of a pixel electrode and the like but also to the formation of various films which can be formed by other liquid droplet ejection methods.

Embodiment 6

In this embodiment, description is made on a method for forming a conductive film by using a liquid droplet ejection system in accordance with the invention with a plurality of nozzles each having a different bore diameter as a liquid droplet ejection means with reference to FIG. 14.

First, description is made on a mode where a wiring pattern having various line widths is formed with reference to FIG. 14. FIG. 14 illustrates the formation of a wiring pattern 148 on a substrate 140. More particularly, it illustrates the pattern formation in such a manner that a pattern is formed first by using a nozzle with the ejection bore diameter $R_1$, a nozzle with the ejection bore diameter $R_2$, and a nozzle with the ejection diameter $R_3$ in this order. Each of the nozzles is not shown in the figure, however, a similar nozzle to those used in the aforementioned embodiments can be used. Liquid droplets 161 to 163 ejected from the respective nozzles are different in size (ejection quantity), therefore, a pattern with various line widths can be formed easily by using a liquid droplet ejection means in accordance with the invention.

Note that after the formation of the pattern, it may be planarized by pressing with a plate which is processed with polytetra-fluoroethylene, or by buffing or a roller as required. Alternatively, one of or both of a drying step or a baking step (heat treatment) may be performed. Each of the drying step of the baking step is a heat treatment step. For example, the drying is performed at 100° C. for three minutes whereas the baking is performed at 200 to 350° C. for 15 to 30 minutes. Although each of the steps is a heat treatment step, the object, temperature and time thereof is different. The drying step and the baking step are performed through laser irradiation, rapid thermal annealing, heating with a furnace and the like under the atmospheric pressure or reduced pressure.

In order to perform the drying step and baking step efficiently, the substrate may be heated in advance. The temperature at that time is dependent on the material of the insulating film thereof, and it is set at 200 to 800° C. (more preferably at 250 to 450° C.) in general. Through the aforementioned steps, solvent in the compositions is evaporated, or dispersing agent in the compositions is eliminated chemically while curing/shrinking the surrounding resin, thereby bringing nanoparticles into contact as to accelerate the fusing of the nanoparticles.

When performing laser irradiation, a continuous wave or pulsed gas laser or solid-state laser may be used. As the former gas laser, an excimer laser, a YAG laser and the like can be used while as the latter solid-state laser, a laser using crystals such as YAG and YVO$_4$ doped with CR, Nd and the like can be used. The irradiation conditions are determined appropriately such that: pulse oscillating frequency at 300 Hz and laser energy density at 100 to 700 mJ/cm$^2$ in the case of using an excimer laser. In the case of using a YAG laser, on the other hand, it is preferable to use the second harmonic wave and set in the following manner: pulse oscillating frequency at 1 to 300 Hz and laser energy density at 300 to 1000 mJ/cm$^2$. The whole surface of the substrate may be irradiated with laser light which is linearly condensed at a line width of 100 to 1000 im while setting the superposition rate of the linear beams to 50 to 98%. Note that in view of the absorptivity of the laser light, a continuous wave laser is desirably used. In addition, what is called a hybrid laser irradiation may be used which is a combination of the pulsed laser and the continuous wave laser.

Rapid thermal annealing (RTA) is performed by using an infrared lamp which irradiates light in the range of ultraviolet to infrared light, halogen lamp and the like under an inert gas atmosphere, and the temperature is increased rapidly to instantaneously apply heat for several minutes to several micro seconds. This process is performed instantaneously, thus substantially only the thin film on the outer surface can be heated, which has no affect on a film on the lower layer.

Note that the liquid droplet ejection system used in this embodiment may be the one described in the aforementioned embodiment modes. This embodiment can be implemented in combination with the aforementioned embodiment modes or other embodiments. In addition, the method described in this embodiment can be applied not only to the formation of the aforementioned wiring but also to the formation of various films which can be formed by other liquid droplet ejection methods.

Embodiment 7

In this embodiment, description is made on an example where an aperture is filled with a conductor by using a liquid droplet ejection system in accordance with the invention with reference to FIGS. 15A to 15C.

Referring to FIGS. 15A to 15C, 140 denotes a substrate, 171 denotes a semiconductor or a conductor and 172 denotes an insulating film. The insulating film 172 is provided with an aperture 173. In this embodiment, a wiring is formed by using a liquid droplet ejection means comprising a plurality of rows of nozzles each having ejection heads arranged in one axial direction. In this embodiment, description is made on the case where the liquid droplet ejection means comprises the nozzles 151 to 153 with the ejection bore diameters of $R_1$, $R_2$ and $R_3$ ($R_1 > R_2 > R_3$) respectively.

The aperture 173 has a diameter tapered downwardly. According to the invention, a composition is filled first in the lower layer portion of the aperture 173 by using the nozzle 153 with the ejection bore diameter $R_3$. Then, a composition is filled up to the central portion of the aperture 173 by using the nozzle 152 having an ejection head with the diameter $R_2$. At the end, composition is filled in the upper layer portion of the aperture 173 by using the nozzle 151 with the ejection bore diameter $R_1$.

According to the aforementioned method, the aperture 173 is filled with compositions, whereby a planarized conductive layer can be formed. Accordingly, voids are not produced in the insulating film 172 provided with the aperture 173 having a high aspect ratio, which enables the formation of a planarized wiring.

Note that the insulating film 172 is formed of an insulating film containing silicon, for example such as a silicon oxide film, silicon nitride film, silicon nitride oxide film and silicon oxynitride film in single or a plurality of layers. In the case of forming a multi-layer wiring laminating wirings, low-dielectric-constant materials (preferably, dielectric constant of 4 or less) are preferably used. For example, organic materials such as acrylic, benzocyclobutene, parylene, flare, light-transmitting polyimide may be used. When an organic insulating film is used as the insulating film 172, the planarity thereof is excellent, which does not yield an extremely thin film thickness or short circuits on the steps even when a conductor is deposited subsequently. In addition, when a low-dielectric constant material is used for an interlayer insulating film, wiring capacitance is decreased, which enables the formation of a multi-layer wiring. Accordingly, by applying a manufacturing method of a wiring in accordance with the invention, a manufacturing method of a high-performance and high-functional display device, semiconductor device and the like can be provided.

When an organic material is used for the insulating film 172, a barrier film may be formed by using Ti (titanium), TiN (titanium nitride), a silicide film or polysilicon film formed of TiSix, MoSix and the like, or materials such as Nb, TiON, W (tungsten), WN, TiWN and Ta so as to prevent degassing. The barrier film may have either a single-layer structure or laminated structure. The barrier film functions to heighten adhesiveness and provide a filling property as well as decrease and stabilize the contact resistance.

As for the formation of the aperture 173, either method of wet etching and dry etching may be employed. However, dry etching is preferable since it allows the aperture 173 to have a high aspect ratio (three or more). Alternatively, the aperture 173 may be formed by a liquid droplet ejection method. In this case, the process is carried out by ejecting wet etchant from a nozzle. Note that a cleaning step with a solvent such as water is preferably added in order to control the aspect ratio of the aperture 173. It is needless to mention that this cleaning step can be carried out in succession with an identical device if the liquid droplets ejected from the nozzle are replaced by water or a head filled with a liquid solution is replaced, which is favorable in respect of processing time.

In the case of using a nozzle having a piezo actuator as a liquid droplet ejection means, ejection quantity is controlled by controlling the waveform applied to the piezo actuator. The aforementioned characteristics may be applied to a liquid droplet ejection means in accordance with the invention. More particularly, the waveform applied to the piezo actuator may be controlled for selecting a nozzle having an ejection head with an optimal diameter and obtaining an optimal ejection quantity from the nozzle. Alternatively, one of or both of a drying step or a baking step (heat treatment) may be performed as required after filling the aperture with compositions.

According to the aforementioned structure of the invention, the aperture is filled with compositions, whereby a planarized wiring can be formed easily. Accordingly, voids are not produced in the insulator provided with the aperture having a high aspect ratio, which enables the formation of a planarized wiring. Thusly planarized wiring makes it possible to provide a multi-layer wiring having multiple layers such as four, five and six layers. The multi-layer wiring enables high integration which can provide a high-performance display device or semiconductor device.

Note that the liquid droplet ejection system used in this embodiment may be the one described in the aforementioned embodiment modes. This embodiment can be implemented in combination with the aforementioned embodiment modes or other embodiments. In addition, the method described in this embodiment can be applied not only to the formation of the aforementioned wiring but also to the formation of various films which can be formed by other liquid droplet ejection methods.

Embodiment 8

In this embodiment, description is made on a method for forming a wiring pattern by using a liquid droplet ejection system in accordance with the invention with a plurality of nozzles each having a nozzle pitch n (n is an integer) times as large as the pixel pitch with reference to FIGS. 16A and 16B.

Description is given here on the assumption where n=2. In FIGS. 16A and 16B, 104 denotes the substrate, 401 denotes the nozzle and 402 denotes the ejection head. First, wiring patterns on the odd-numbered rows are depicted by the first scanning of the substrate 104 (FIG. 16A). Then, the substrate 104 is moved to be aligned with the ejection head 402 to depict wiring patterns on the even-numbered rows by the second scanning of the substrate 104. Thus, pattern depiction can be completed only by scanning the substrate two times.

Note that the pixel pitch refers to the measurement of the distance between pixels, and it is determined by the number of dots and the screen size. For example, in the case of forming a panel with resolution of VGA (640×480) and the screen size of 15.1 inches, the pixel pitch is 479 ìm. Accordingly, a pitch Da of a plurality of nozzles is n (n is an integer) times as large as 479 ìm. The width of the wiring pattern depicted in this case is about 100 ìm, therefore, the diameter of the ejection head of the nozzle is desirably set to be about 50 ìm. By using a liquid droplet ejection means having the aforementioned structure, pattern depiction can be performed in a short period of time, which leads to an improved tact time.

Note that the liquid droplet ejection system used in this embodiment may be the one described in the aforementioned embodiment modes. This embodiment can be implemented in combination with the aforementioned embodiment modes or other embodiments. In addition, the method described in this embodiment can be applied not only to the formation of the aforementioned wiring but also to the formation of various films which can be formed by other liquid droplet ejection methods.

Embodiment 9

In this embodiment, description is made on the case where a liquid droplet ejection system in accordance with the invention is applied to the manufacturing method of a TFT of a channel-protective type (channel stopper type) with reference to FIGS. 18A to 19E.

Figure 18A:
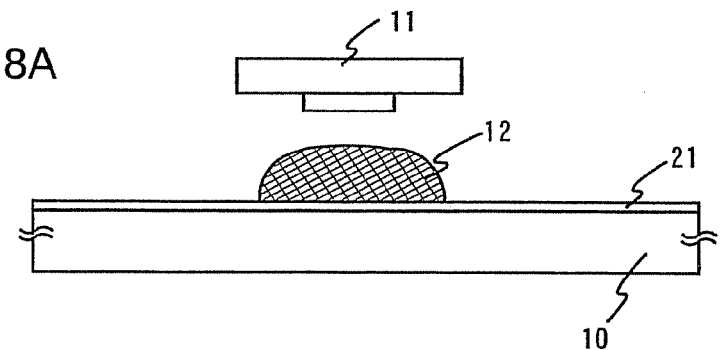
FIGS. 18A to 18E illustrate manufacturing steps of a channel-protective TFT in accordance with the invention.

First, a thin film containing Ti (hereinafter referred to as a 'Ti film 21') is deposited over a substrate 10 (FIG. 18A). For example, the Ti film 21 having a thickness of 5 nm or less is deposited over a glass substrate. The Ti film can heighten the adhesiveness between the substrate 10 and a conductive film which is formed later by ejecting a composition containing a conductive material. In addition, the Ti film turning into titanium oxide at baking of the conductive film allows the increase of light transmissivity of a display device.

The substrate 10 may be the one formed of an insulating material such as a glass substrate, a quartz substrate and an alumina substrate, a plastic substrate which has heat resistance to the processing temperature in the subsequent steps and the like. In this case, an insulating film such as silicon oxide ($SiO_x$), silicon nitride ($SiN_x$), silicon oxynitride ($SiO_xN_y$) (x>y), silicon nitride oxide ($SiN_xO_y$) (x>y) (x, y=1, 2 . . . ) and the like is desirably formed in order to prevent diffusion of impurities from the substrate side. Alternatively, a metal such as stainless, a semiconductor substrate or the like, over the surface of which is formed an insulating film such as silicon oxide and silicon nitride can be used.

Figure 18B:
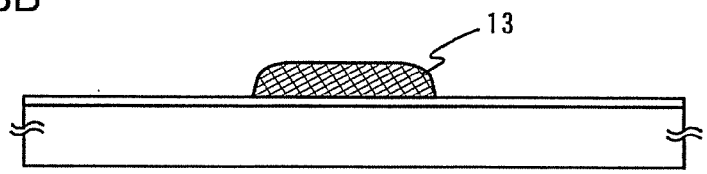

Subsequently, a composition containing a conductive material is ejected onto a portion where a gate electrode 13 is formed by a liquid droplet ejection method over the Ti film 21 to form a conductive film 12 selectively (FIG. 18B). At this time, the shape of the conductive film 12 is typically roundish due to the surface tension of the liquid droplet.

Ag is used as the conductive material here, however, the invention is not limited to this. Alternatively, such metal can be used as Ag, Au, Cu, Ni, Pt, Pd, Ir, Rh, W, Al, Ta, Mo, Cd, Zn, Fe, Ti, Si, Ge, Zr and Ba, or a metal obtained by dissolving or dispersing conductive materials such as silver halide particles or dispersible nanoparticles into a solvent. As the solvent, tetradecane and the like can be employed. In addition, the liquid droplet ejection conditions and the like may be similar to the one described in the aforementioned embodiment modes.

Then, the conductive film 12 is baked in an atmosphere containing at least nitrogen and oxygen. Here, a mixed gas of nitrogen and oxygen is used with an oxygen partial pressure in the mixed gas at 25%. The baking conditions are set at the temperature of 230° C. for one hour, however, the invention is not limited to this. In this manner, by forming a conductive film by a liquid droplet ejection method and subsequently baking it in an $O_2$-containing atmosphere, a conductive film with improved planarity, thinner film thickness and lower resistance can be obtained. Note that the solvent in the composition is evaporated by ejecting a composition containing a conductive material under the reduced pressure, therefore, time required for the subsequent heat treatment (drying or baking) can be reduced.

Through the aforementioned steps, the gate electrode 13 is formed (FIG. 18B). Note that planarization may be performed in order to improve the planarity of the gate electrode 13. For example, CMP (chemical mechanical polishing), etch back, reflowing, coating, filling with oxide, bias sputtering, selective growth by means of CVD, laser irradiation and the like can be employed.

Note that the gate electrode 13 is not limited to the single-layer structure, and it may have a laminated structure of two, three or more layers. For example, a double-layer structure by the use of TaN (tantalum nitride) and W (tungsten) can be employed. In this case, the aforementioned baking step is performed every time a conductive film is formed, however, the invention is not limited to the procedural steps. Simultaneously with the formation of the gate electrode 13, a scan line, signal line and the like can be formed.

Figure 18C:
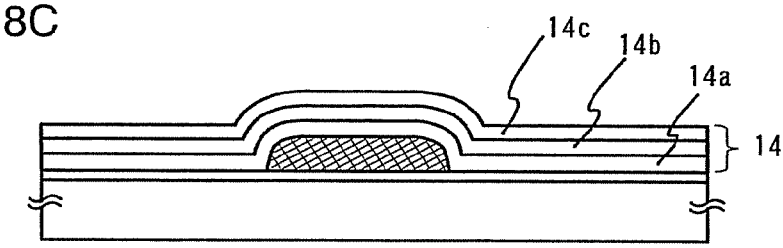

Subsequently, a gate insulating film 14 is formed over the gate electrode 13 (FIG. 18C). Here, the gate insulating film 14 has triple layers of a silicon nitride film 14a, a silicon oxide film 14b and a silicon nitride film 14c in order to function as a gate insulating film as well as to prevent traps from being produced due to the diffusion of the impurities from the gate electrode side. However, the invention is not limited to this, and other insulating films can be used. In the case of using Ag as the gate electrode in particular, oxygen plasma generated in the deposition of silicon oxide reacts with Ag to produce argentic oxide (AgO), therefore, an insulating film in contact with Ag is desirably a silicon nitride film. Note that these insulating films can be formed by CVD or sputtering.

Then, a semiconductor film 15 is formed over the gate insulating film 14. Here, a polycrystalline semiconductor film is directly formed by LPCVD (low-pressure CVD) using disilane ($Si_2H_6$) and germanium fluoride ($GeF_4$) as the material gas. The gas flow rate is set at $Si_2H_6/GeF_4$=20/0.9, the deposition temperature is set at 400 to 500° C. and He or Ag is used as a carrier gas, however, the invention is not limited to this. The composition ratio of Si in the polycrystalline semiconductor film deposited under such conditions is 80% or more.

The semiconductor film 15 may be a semi-amorphous silicon (SAS) film. Alternatively, an amorphous semiconductor or a polycrystalline semiconductor formed by other methods can be used. Description is made now on the semi-amorphous semiconductor. Semi-amorphous semiconductor has an intermediate structure between amorphous and crystalline (including single crystalline and polycrystalline) structures and has the third state which is stable in free energy. The semi-amorphous semiconductor includes a crystalline region having a short-range order and lattice distortion. At least a part of the regions in the film includes crystal grains of 0.5 to 20 nm, and it is therefore called a micro crystalline semiconductor (i-C semiconductor) as well. It has another characteristic that Raman spectrum is shifted to the lower frequency than 520 $cm^{-1}$, and has the observed diffraction peaks at (111) and (220) under the X-ray diffraction derived from the Si-crystal lattices. In addition, it contains hydrogen or halogen with a concentration of 1 atomic % or more as a neutralizing agent for dangling bonds.

The semi-amorphous silicon is formed by performing glow discharge decomposition of a silicide gas such as $SiH_4$, $Si_2H_6$, $SiH_2Cl_2$, $SiHCl_3$, $SiCl_4$ and $SiF_4$ using plasma CVD. The silicide gas may be diluted by $H_2$ or one or more of the noble gas elements such as $H_2$ and He, Ar, Kr and Ne. It is desirable that the dilution rate is set in the range of 2 to 1000 times, pressure in the range of about 0.1 to 133 Pa and power source frequency in the range of 1 to 120 MHz, and more preferably in the range of 13 to 60 MHz. In addition, the substrate is heated at 350° C. or less, and more preferably at 100 to 300° C. Among the impurities in the film, atmospheric impurities such as oxygen, nitrogen and carbon are desirably set at $1\times10^{20}$ $cm^{-3}$ or less. In particular, oxygen concentration is set in the range of $5\times10^{19}$ $cm^{-3}$, and more preferably in the range of $1\times10^{19}$ $cm^{-3}$ or less. Note that the method for forming an SAS described here can be applied to Embodiment Modes 1 and 2.

Figure 18D:
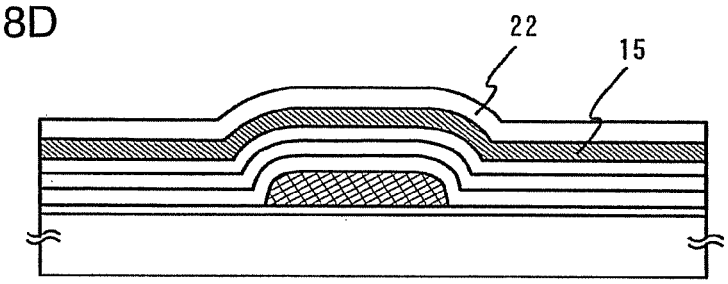

Subsequently, an insulating film 22 to function as a channel-protective film is formed over the semiconductor film 15 (FIG. 18D). A silicon nitride film is deposited here, however, the invention is not limited to this. Note that the channel-protective film functions to protect a channel region from overetching, therefore, the insulating film 22 is desirably formed with a thickness of 1 ìm, or more preferably 5ìm or more.

Figure 18E:
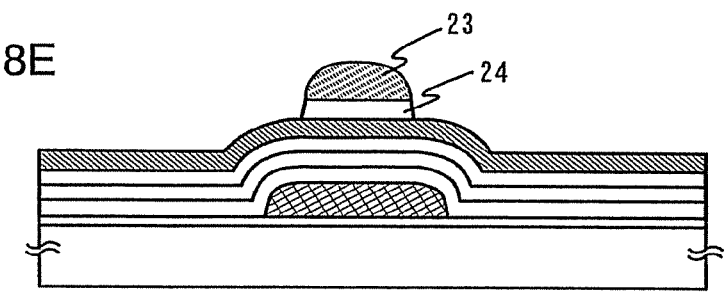

Then, a mask pattern 23 for etching the insulating film 22 is formed by a liquid droplet ejection method (FIG. 18E). The mask pattern 23 is preferably formed by using a heat resistant high molecular weight material. For example, polyimide, siloxane or polybenzimidazole can be used. In the case of using polyimide, it is desirable that a composition containing polyimide is ejected from a nozzle onto the insulating film 22 which is doped with impurities, and it is then subjected to baking at a temperature of 200° C. for 30 minutes. Note that the mask pattern 23 can be formed through exposure and developing steps after the deposition of a film over the whole surface as is conventional, however, a liquid droplet ejection system is desirably used in view of the simplification of steps. Needless to say, the mask pattern 23 may be formed by using a photoresist as is conventional.

Then, the insulating film 22 is etched using the mask pattern 23 as a mask, thereby forming a channel-protective film 24 (FIG. 18E). As an etching gas, a chlorine gas typified by $Cl_2$, $BCl_3$, $SiCl_4$ or $CCl_4$, a fluorine gas typified by $CF_4$, $SF_6$, $NF_3$ and $CHF_3$, or $O_2$ can be used, however, the invention is not limited to this. The mask pattern 23 is removed by $O_2$ ashing and the like after the etching step.

Figure 19A:
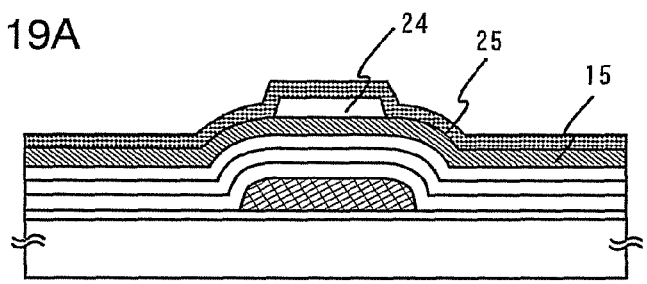
FIGS. 19A to 19E illustrate manufacturing steps of a channel-protective TFT in accordance with the invention.

Then, an N-type semiconductor film 25 is formed over the semiconductor film 15 and the channel-protective film 24 (FIG. 19A). Here, an N-type (n+) polycrystalline semiconductor film with a thickness of 40 to 60 nm is directly formed by LPCVD using a mixed gas of disilane ($Si_2H_6$) and germanium fluoride ($GeF_4$) as the material gas with $H_2$ and $PH_3$ (phosphine). However, the invention is not limited to this, and a semi-amorphous silicon film, an amorphous semiconductor or a crystalline semiconductor formed by other methods can be used.

Figure 19B:
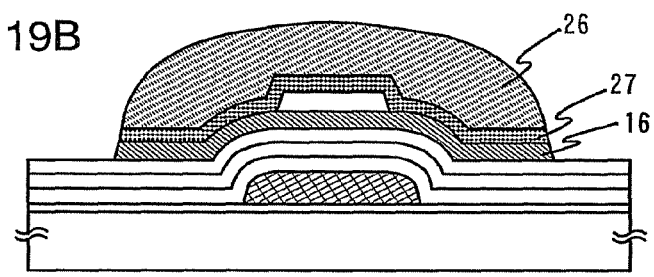

Then, a mask pattern 26 for etching the semiconductor film 15 and the N-type semiconductor film 25 is formed by a liquid droplet ejection method (FIG. 19B). The mask pattern 26 can be formed of a similar material to that of the mask pattern 23.

Then, the semiconductor film 15 and the N-type semiconductor film 25 are etched using the mask pattern 26 as a mask, thereby forming an island-like semiconductor film 16 and an island-like semiconductor film 27 (FIG. 19B). As an etching gas, a chlorine gas typified by $Cl_2$, $BCl_3$, $SiCl_4$ or $CCl_4$, a fluorine gas typified by $CF_4$, $SF_6$, $NF_3$ and $CHF_3$, or $O_2$ can be used, however, the invention is not limited to this. The mask pattern 26 is removed by $O_2$ ashing and the like after the etching step.

Note that the etching can be performed by utilizing the atmospheric pressure plasma as well. The etching gas used for this case is preferably a mixed gas of $CF_4$ and $O_2$. In addition, it is possible to perform maskless etching by locally blowing an etching gas.

Figure 19C:
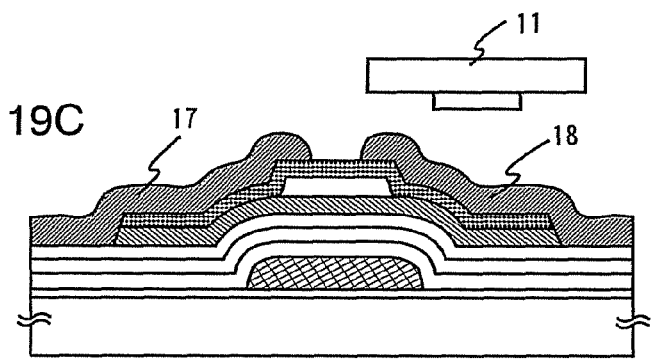

Then, a portion where a source electrode and a drain electrode are formed (above a source region and drain region in the island-like semiconductor film 27) is selectively ejected with a composition containing a conductive material, thereby forming conductive films 17 and 18 (FIG. 19C). As the conductive material, a similar material to the one used for the gate electrode 13, which is dissolved or dispersed into a solvent can be used. For example, a composition containing Ag is formed by the selective ejection. Note that the nozzle for ejecting a composition may be identical to or different from the nozzle 11 used for the formation of the gate electrode 13. At this time, the shapes of the conductive films 17 and 18 are roundish due to the surface tension of the liquid droplet.

Then, the conductive films 17 and 18 are baked in an atmosphere containing at least nitrogen and oxygen. For example, a mixed gas of nitrogen and oxygen is preferably used. The composition ratio of oxygen in the mixed gas is in the range of 3 to 60%, and more preferably in the range of 10 to 25%. The baking conditions are preferably at a temperature of 200 to 300° C. for 0.5 to 2 hours. As described above, by forming a conductive film and subsequently baking it in an $O_2$-containing atmosphere, an organic substance such as a binder (thermosetting resin) included in the composition containing a conductive material can be eliminated, whereby a conductive film with improved planarity, thinner film thickness and lower resistance can be obtained. Note that the solvent in the composition is evaporated by ejecting a composition containing a conductive material under the reduced pressure, therefore, time required for the subsequent heat treatment (baking) can be reduced.

Figure 19D:
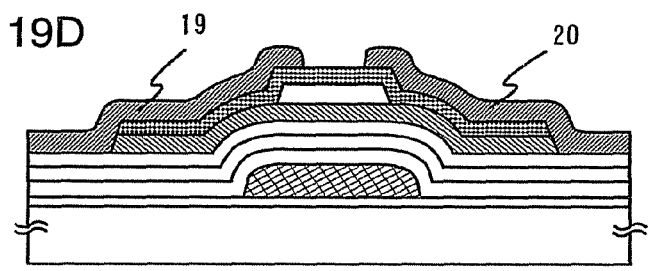

Through the aforementioned steps, a source electrode 19 and a drain electrode 20 are formed (FIG. 19D). Note that planarization may be performed in order to improve the planarity of the source electrode 19 and the drain electrode 20. For example, CMP, etch back, reflowing, coating, filling with oxide, bias sputtering, selective growth by means of CVD, laser irradiation and the like can be used.

Note that each of the source electrode 19 and the drain electrode 20 is not limited to the single-layer structure, and it may have a laminated structure of two, three or more layers. In this case, it is desirable that the aforementioned planarization is performed if necessary after the aforementioned baking step being performed each time a conductive film is deposited, however, the invention is not limited to this procedure. Simultaneously with the formation of the source electrode 19 and the drain electrode 20, various wirings such as a signal line can be formed as well.

Figure 19E:
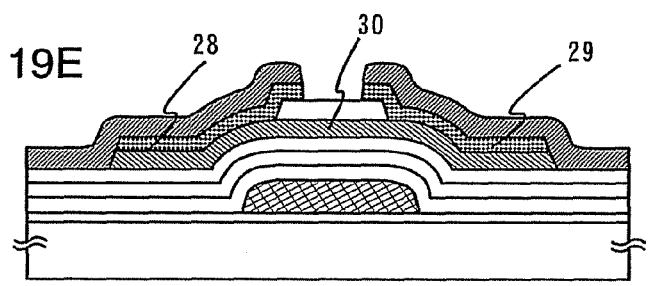

Subsequently, an exposed portion of the island-like N-type semiconductor film 27 is etched using the source electrode 19 and the drain electrode 20 as masks, thereby forming a source region 28 and a drain region 29 (FIG. 19E). As an etching gas, a chlorine gas typified by $Cl_2$, $BCl_3$, $SiCl_4$ or $CCl_4$, a fluorine gas typified by $CF_4$, $SF_6$, $NF_3$ and $CHF_3$, or $O_2$ can be used, however, the invention is not limited to this.

Note that the etching can be performed by utilizing the atmospheric pressure plasma as well. The etching gas used for this case is preferably a mixed gas of $CF_4$ and $O_2$. In addition, it is possible to perform maskless etching by locally blowing the etching gas.

Through the aforementioned steps, a channel-protective TFT can be completed. Note that a passivation film is desirably formed over the source electrode 19 and the drain electrode 20 in order to prevent diffusion of impurities from above the TFT, though not shown. The passivation film can be formed by a thin film formation method such as plasma CVD and sputtering using silicon nitride, silicon oxide, silicon nitride oxide, silicon oxynitride, aluminum oxynitride, aluminum oxide, diamond-like carbon (DLC), nitrogen-containing carbon (CN) or other insulating materials. Alternatively, a similar material to that of the channel-protective film 24 or a lamination of these materials can also be used to form the passivation film.

In the channel-protective TFT, the channel-protective film 24 is formed over a channel region 30, therefore, it can be prevented that the channel region 30 is subjected to a damage of overetching when etching the island-like N-type semiconductor film 27. Thus, it can function as a semiconductor element having stable characteristics and high mobility.

Note that when providing a liquid crystal element or a light-emitting element including an organic compound layer or an inorganic compound layer (typically, a light-emitting element utilizing EL: Electro Luminescence) over the source electrode 19 or the drain electrode 20, a thin display device such as an active matrix display device or an EL light-emitting device can be provided, which can be controlled by the semiconductor element formed through the aforementioned steps.

In the formation of the gate electrode 13, when forming the conductive film 12 by a liquid droplet ejection method and subsequently baking it in an $O_2$-containing atmosphere, a conductive film with improved planarity, thinner film thickness and lower resistance can be obtained. Thus, the gate insulating film 14, the semiconductor film 15 and the like having planarity, evenness and excellent step coverage relatively to the gate electrode 13 can be formed over the gate electrode 13.

In the formation of the source electrode 19 and the drain electrode 20, when forming the conductive films 17 and 18 by a liquid droplet ejection method and subsequently baking it in an $O_2$-containing atmosphere, conductive films with improved planarity, thinner film thickness and lower resistance can be obtained. Thus, insulating films, wirings and the like having planarity, evenness and excellent step coverage relatively to the source electrode 19 and the drain electrode 20 can be formed over the source electrode 19 and the drain electrode 20.

The gate electrode 13, the source electrode 19, the drain electrode 20, the mask pattern 23 and the like described above can be formed to have desired patterns at desired positions by setting a moving path of the nozzle 11 or a moving path of the stage for supporting the substrate 10 based on the pattern data designed by CAD and the like, moving the nozzle or the stage along the set moving path by a control means and ejecting compositions containing the materials for forming the such patterns from an ejection head of the nozzle.

In addition, according to the characteristics of compositions to be ejected, such ejection conditions are set as the moving rate of a nozzle or a substrate, ejection quantity of compositions, distance between an ejection head of a nozzle and the substrate, ejection rate of compositions to be ejected from the ejection head, atmosphere of the space that the compositions are ejected, the temperature and moisture of the space, and heating temperature of the substrate. These conditions are determined by a determination means for determining an optimal parameter by comparing the designed data of the thin film pattern with the data of the composition type, film thickness and the like based on a database in which a number of parameters that are obtained theoretically, experimentally and experientially are compiled. Thus, an excellent pattern can be obtained with high throughput.

In addition, the channel-protective film 23, the island-like semiconductor film 16, the island-like N-type semiconductor film 27 and the like in this embodiment can also be formed by ejecting compositions containing materials for forming such films by using a liquid droplet ejection system in accordance with the invention.

By inputting pattern data of the thin film such as the gate electrode 13, the source electrode 19, the drain electrode 20, the mask pattern 23 and the like formed by the aforementioned method, the moving path of the nozzle for ejecting compositions or the moving path of the stage of the substrate is determined, and compositions are ejected along the moving path, whereby a desired thin film pattern can be promptly formed with accuracy. Thus, a manufacturing method of a semiconductor element can be provided with a reduced tact time, higher throughput and higher yield.

Embodiment 10

Figure 20A:
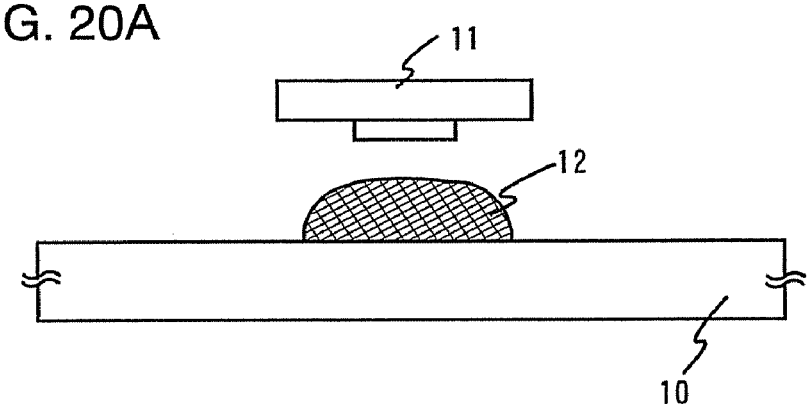
FIGS. 20A to 20D illustrate manufacturing steps of a channel-etched TFT in accordance with the invention.
Figure 21A:
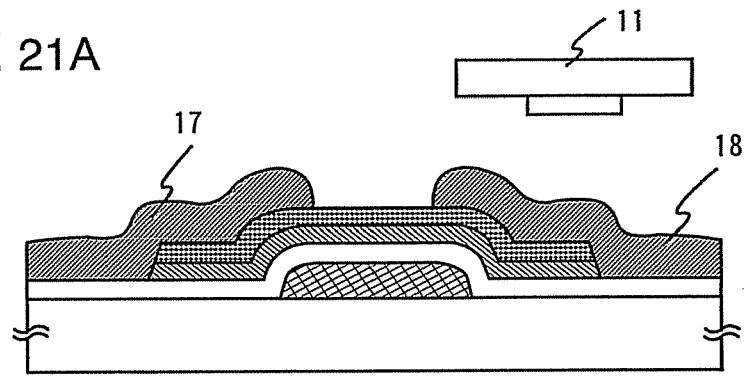
FIGS. 21A to 21D illustrate manufacturing steps of a channel-etched TFT in accordance with the invention.
Figure 21B:
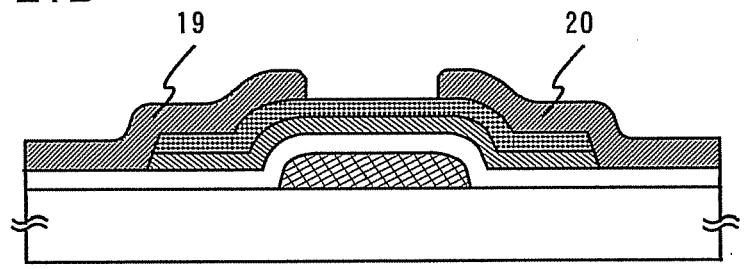
Figure 21C:
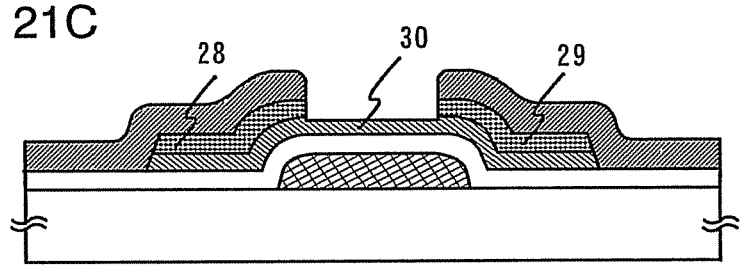
Figure 21D:
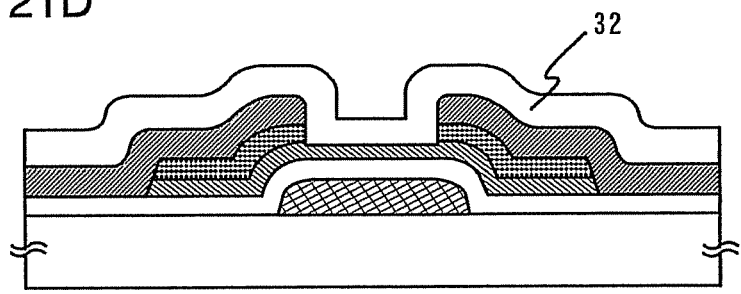

In this embodiment, description is made on the case where the invention is applied to the manufacture of a channel-etched TFT which is one kind of the inverted staggered TFTs with reference to FIGS. 20A and 21D.

First, a Ti film (not shown) is deposited over the substrate 10. The Ti film is formed with a thickness of 5 nm or less over a glass substrate here, however, the invention is not limited to this. The Ti film can heighten the adhesiveness between the substrate 10 and the conductive film 12 which is formed later by ejecting a composition containing a conductive material. In addition, the Ti film turning into titanium oxide at baking of the conductive film allows the increase of light transmissivity. In addition, though not shown, an insulating film formed of silicon oxide, silicon nitride, silicon oxynitride, silicon nitride oxide and the like may be formed in order to prevent diffusion of the impurities from the substrate side.

Subsequently, a composition containing a conductive material is ejected onto a portion where the gate electrode 13 is formed, from a nozzle 20, by a liquid droplet ejection method over the Ti film to form the conductive film 12 selectively (FIG. 20A). Ag is used as the conductive material here, however, the invention is not limited to this. At this time, the shape of the conductive film 12 is roundish due to the surface tension of the liquid droplet.

Ag is used as the conductive material here, however, the invention is not limited to this. Alternatively, such metal can be used as Ag, Au, Cu, Ni, Pt, Pd, Ir, Rh, W, Al, Ta, Mo, Cd, Zn, Fe, Ti, Si, Ge, Zr and Ba, or a metal obtained by dissolving or dispersing conductive materials such as silver halide particles or dispersible nanoparticles into a solvent. As the solvent, tetradecane and the like can be employed. In addition, the liquid droplet ejection conditions and the like may be the ones described in the aforementioned embodiment modes or embodiments.

Then, the conductive film 12 is baked in an atmosphere containing at least nitrogen and oxygen. Here, a mixed gas of nitrogen and oxygen is used with an oxygen partial pressure in the mixed gas at 25%. The baking conditions are set at the temperature of 230° C. for one hour, however, the invention is not limited to this. In this manner, by forming a conductive film by a liquid droplet ejection method and subsequently baking it in an $O_2$-containing atmosphere, a conductive film with improved planarity, thinner film thickness and lower resistance can be obtained.

Figure 20B:
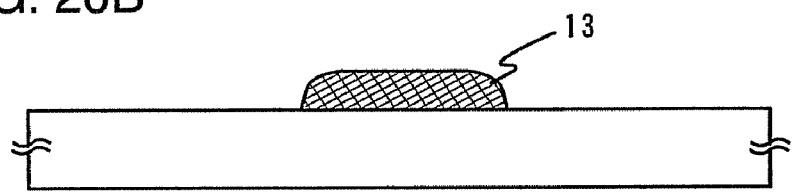

Through the aforementioned steps, the gate electrode 13 is formed (FIG. 20B). Note that planarization may be performed in the case of improving the planarity of the gate electrode 13. For example, CMP, etch back, reflowing, coating, filling with oxide, bias sputtering, selective growth by means of CVD, laser irradiation and the like can be employed.

Figure 20C:
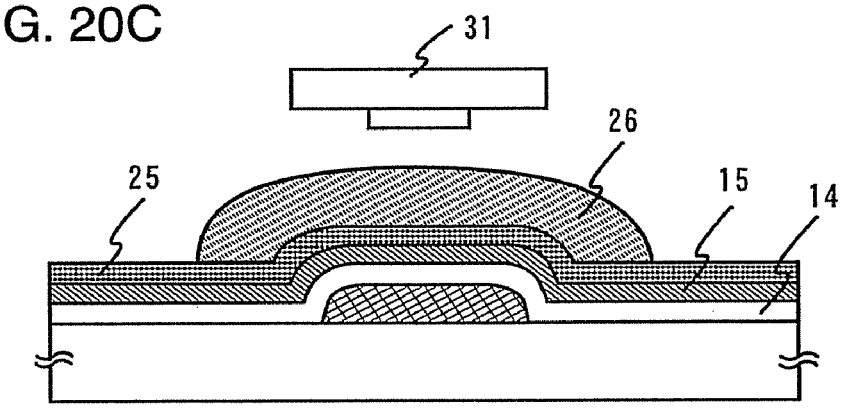

Subsequently, the gate insulating film 14 is formed over the gate electrode 13 (FIG. 20C). A silicon oxynitride film is formed with a thickness of 110 nm by plasma CVD as the gate insulating film 14 here, however, the invention is not limited to this. For example, a silicon nitride film may be formed with a thickness of 100 to 400 nm by a thin film formation method such as sputtering. Alternatively, other insulating films containing silicon oxide or other silicon can be used.

Subsequently, the semiconductor film 15 is formed over the gate insulating film 14. Here, a semi-amorphous silicon (SAS) film is formed with a thickness of 10 to 300 nm by plasma CVD, however, the invention is not limited to this.

Description is made now on the semi-amorphous semiconductor. Semi-amorphous semiconductor has an intermediate structure between amorphous and crystalline (including single crystalline and polycrystalline) structures and has the third state which is stable in free energy, and includes a crystalline region having a short-range order and lattice distortion. At least a part of the regions in the film includes crystal grains of 0.5 to 20 nm, and it is therefore called a micro crystalline semiconductor as well. It has another characteristic that Raman spectrum is shifted to the lower frequency than 520 $cm^{-1}$, and has the observed diffraction peaks at (111) and (220) by X-diffraction, which are considered to be caused by the Si-crystal lattices. In addition, it contains hydrogen or halogen with a concentration of 1 atomic % or more as a neutralizing agent for dangling bonds.

The semi-amorphous silicon is formed by performing glow discharge decomposition of silicon gas such as $SiH_4$, $Si_2H_6$, $SiH_2Cl_2$, $SiHCl_3$, $SiCl_4$ and $SiF_4$ using plasma CVD. The silicon gas may be diluted by $H_2$ or one or more of the noble gas elements such as $H_2$ and He, Ar, Kr and Ne. It is desirable that the dilution rate is set in the rage of 2 to 1000 times, pressure in the rage of about 0.1 to 133 Pa and power source frequency in the range of 1 to 120 MHz, and more preferably in the range of 13 to 60 MHz. In addition, the substrate is heated at 350° C. or less, and more preferably at 100 to 300° C. Among the impurities in the film, atmospheric impurities such as oxygen, nitrogen and carbon are desirably set at $1\times10^{20}$ $cm^{-3}$ or less. In particular, oxygen concentration is set at of $5\times10^{19}$ $cm^{-3}$ or less, and more preferably $1\times10^{19}$ $cm^{-3}$ or less. Note that the method for forming an SAS described here can be applied to the aforementioned embodiment modes or embodiments.

Subsequently, the N-type semiconductor film 25 is formed over the semiconductor film 15 (FIG. 20C). Here, an N-channel semi-amorphous silicon film is formed with a thickness of 40 to 60 nm by performing glow discharge decomposition of a mixed gas of $SiH_4$, $H_2$ and $PH_3$ using plasma CVD, however, the invention is not limited to this.

The gate insulating film 14, the semiconductor film 15 and the N-type semiconductor film 25 can be successively deposited in the identical chamber such as a plasma CVD equipment. In order to stabilize the characteristics of the TFT and improve the performance thereof, it is desirable to set the deposition temperature of the gate insulating film 14 at a high temperature of about 300° C. or more, and the deposition temperature of an amorphous silicon film at a temperature which can prevent the desorption of hydrogen that is mixed in the film. Note that each of the semiconductor film 15 and the N-type semiconductor film 25 may be an amorphous semiconductor film or a crystalline semiconductor film.

Then, the mask pattern 26 is formed over the N-type semiconductor film 25 (FIG. 20C). The mask pattern 26 is desirably formed by using a photoresist as is conventional, however, it is preferably formed by a liquid droplet ejection method. Other than the photoresist, a heat resistant high molecular weight material is preferably used. For example, polyimide, siloxane or polybenzimidazole can be used. In the case of using polyimide, it is desirable that a composition containing polyimide is ejected onto the N-type semiconductor film 25 from a nozzle 31, and it is subsequently subjected to baking at a temperature of 200° C. for 30 minutes.

Figure 20D:
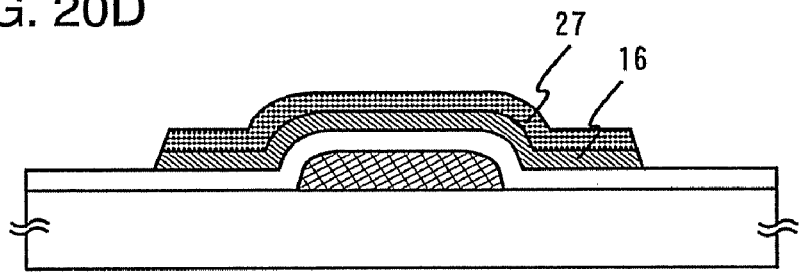

Then, the semiconductor film 15 and the N-type semiconductor film 25 are etched using the mask pattern 26 as a mask, thereby forming the island-like semiconductor film 16 and the island-like N-type semiconductor film 27 (FIG. 20D). The mask pattern 26 is removed by $O_2$ ashing and the like after etching.

Note that the etching can be performed by utilizing the atmospheric pressure plasma as well. The etching gas used for this case is preferably a mixed gas of $CF_4$ and $O_2$. In addition, it is possible to perform maskless etching by locally blowing the etching gas.

Then, the conductive films 17 and 18 to function as the source electrode and the drain electrode respectively are formed by a liquid droplet ejection method by ejecting a composition containing a conductive material onto the source region and the drain region in the island-like N-type semiconductor film 27 (FIG. 21A). As the conductive material, a similar material to the one used for the gate electrode 13, which is dissolved or dispersed into a solvent can be used.

Then, the conductive films 17 and 18 are baked in an atmosphere containing at least nitrogen and oxygen as in the aforementioned embodiment, thereby forming the source electrode 19 and the drain electrode 20 (FIG. 21B).

Subsequently, the top portions of the island-like N-type semiconductor film 27 and the island-like semiconductor film 16 are etched using the source electrode 19 and the drain electrode 20 as masks, thereby forming the source region 28, the drain region 29 and the channel region 30 (FIG. 21C). At this time, the etching conditions are required to be controlled appropriately in order to suppress the damage of the semiconductor film to function as the channel region of a TFT.

Note that the etching can be performed by utilizing the atmospheric pressure plasma as well. The etching gas used for this case is preferably a mixed gas of $CF_4$ and $O_2$. In addition, it is possible to perform maskless etching by locally blowing an etching gas.

Through the aforementioned steps, a channel-etched TFT can be completed. Note that a passivation film 32 may be deposited over the source electrode 19 and the drain electrode 20. The passivation film 32 can be formed by a thin film formation method such as plasma CVD and sputtering using silicon nitride, silicon oxide, silicon nitride oxide, silicon oxynitride, aluminum oxynitride, aluminum oxide, diamond-like carbon (DLC), nitrogen-containing carbon (CN) or other insulating materials. Alternatively, a lamination of these materials can be used.

In addition, though not shown, other wirings connected to the gate electrode 13, the source electrode 19 or the drain electrode 20 may be formed by a liquid droplet ejection method. That is, a mask pattern may be formed by a liquid droplet ejection method to perform etching, or alternatively, a conductive composition may be directly depicted by a liquid droplet ejection method to form a wiring. In the case of forming a wiring by the liquid droplet ejection method, ejection quantity may be controlled by changing ejection heads according to the wiring width. For example, a gate signal line and a gate electrode can be formed to have desired shapes respectively such that the gate signal line can be formed to have a thick-lined pattern while the gate electrode can be formed to have a thin-lined pattern. Further, by forming a mask pattern by the liquid droplet ejection method, such steps as resist coating, baking, exposure, development and baking after the development can be omitted. Thusly simplified steps can contribute to a significant cost reduction. In this manner, when using a liquid droplet ejection method to form an electrode, a wiring, a mask pattern and the like, the patterns can be formed in an arbitrary place while adjusting the thickness and width of the patterns to be formed. Therefore, these patterns can be formed even over a large substrate of more than 1 meter on a side at low cost with high yields.

The gate electrode 13, the source electrode 19, the drain electrode 20, the mask pattern 26 and the like described above can be formed to have desired patterns at desired positions by setting a moving path of the nozzle 11 or a moving path of the stage for supporting the substrate 10 based on the pattern data designed by CAD and the like, moving the nozzle or the stage along the set moving path by a control means and ejecting compositions containing the materials for forming such patterns from an ejection head of the nozzle.

In addition, according to the characteristics of the compositions to be ejected, such ejection conditions are set as the moving rate of a nozzle or a substrate, ejection quantity of compositions, distance between an ejection head of a nozzle and the substrate, ejection rate of compositions to be ejected from the ejection head, atmosphere of the space that the compositions are ejected, the temperature and moisture of the space, and heating temperature of the substrate. These conditions are determined by a determination means for determining an optimal parameter by comparing the designed data of the thin film pattern with the data of the composition type, film thickness and the like based on a database in which a number of parameters that are obtained theoretically, experimentally and experientially are compiled. Thus, an excellent pattern can be obtained with high throughput.

In addition, the island-like semiconductor film 16, the island-like N-type semiconductor film 27 and the like in this embodiment can also be formed by ejecting compositions containing materials for forming such films by using a liquid droplet ejection system in accordance with the invention.

By inputting pattern data of the thin film such as the gate electrode 13, the source electrode 19, the drain electrode 20, the mask pattern 26 and the like formed by the aforementioned method, the moving path of the nozzle for ejecting compositions or the moving path of the stage of the substrate is determined, and compositions are ejected along the moving path, whereby a desired thin film pattern can be promptly formed with accuracy. Thus, a manufacturing method of a semiconductor element can be provided with a reduced tact time, higher throughput and higher yield. Further, a similar advantageous effect to those in the aforementioned embodiment modes or embodiments can be obtained.

Embodiment 11

In this embodiment, description is made on the case where the invention is applied to the manufacture of a staggered TFT with reference to FIGS. 22A to 23D.

Figure 22A:
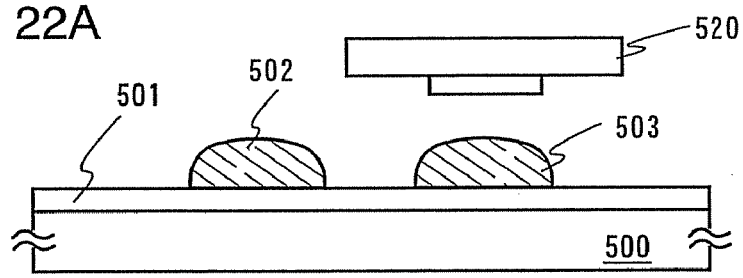
FIGS. 22A to 22D illustrate manufacturing steps of a staggered TFT in accordance with the invention.

First, compositions containing conductive materials are ejected onto the portions over a substrate 500 where a source electrode and a drain electrode are fowled by a liquid droplet ejection method, thereby forming conductive films 502 and 503 selectively (FIG. 22A). At this time, the shapes of the conductive films 502 and 503 are roundish due to the surface tension of the liquid droplet.

The substrate 500 may be formed of a similar material to the one used in the aforementioned embodiment modes or embodiments. In addition, a base insulating film 501 is desirably formed by using silicon oxide, silicon nitride, silicon oxynitride, silicon nitride oxide and the like in order to prevent diffusion of impurities from the substrate side. Note that the base insulating film 501 can be formed by plasma CVD, and it may have a single-layer structure as well as a laminated structure of two, three or more layers. Alternatively, the substrate 500 may be formed of a metal such as stainless, a semiconductor substrate and the like over the surface of which is formed an insulating film such as silicon oxide and silicon nitride, that is, a substrate having a function of the base insulating film 501 can also be used.

Note that a Ti film may be deposited over the substrate 500 or the base insulating film 501 though not shown. For example, a Ti film may be foamed with a thickness of 5 nm or less over a glass substrate. The Ti film can heighten the adhesiveness between the substrate 500 and a conductive film which is formed later by ejecting a composition containing a conductive material. In addition, the Ti film turning into titanium oxide at baking of the conductive film allows the increase of light transmissivity.

As the compositions ejected from the ejection head, a similar conductive material to the one used in the aforementioned embodiment modes and embodiments, which is dissolved or dispersed into a solvent is used. Other conditions of the liquid droplet ejection means may be set as in the aforementioned embodiment modes as well.

Then, the conductive films 502 and 503 are baked in an atmosphere containing at least nitrogen and oxygen. For example, a mixed gas of nitrogen and oxygen is preferably used. The composition ratio of oxygen in the mixed gas is in the range of 3 to 60%, and more preferably in the range of 10 to 25%. The baking conditions are preferably at a temperature of 200 to 300° C. for 0.5 to 2 hours. In this manner, by forming conductive films by a liquid droplet ejection method and subsequently baking them in an $O_2$-containing atmosphere, conductive films with improved planarity, thinner film thickness and lower resistance can be obtained. Note that the solvent in the composition is evaporated by ejecting a composition containing a conductive material under the reduced pressure, therefore, time required for the subsequent heat treatment (baking) can be reduced.

Figure 22B:
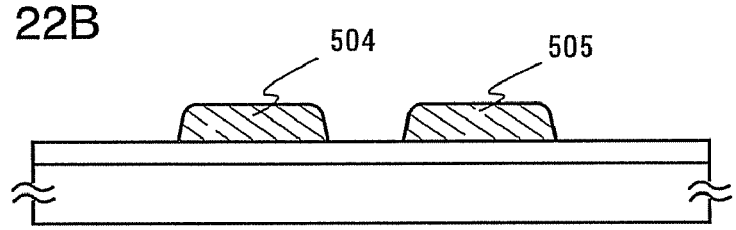

Through the aforementioned steps, a source electrode 504 and a drain electrode 505 are formed (FIG. 22B). Note that planarization may be performed in order to improve the planarity of the source electrode 504 and the drain electrode 505. Note that each of the source electrode 504 and the drain electrode 505 is not limited to a single-layer structure, and it may have a laminated structure of two, three or more layers. Simultaneously with the formation of the source electrode 504 and the drain electrode 505, various wirings such as a signal line can be formed as well.

Figure 22C:
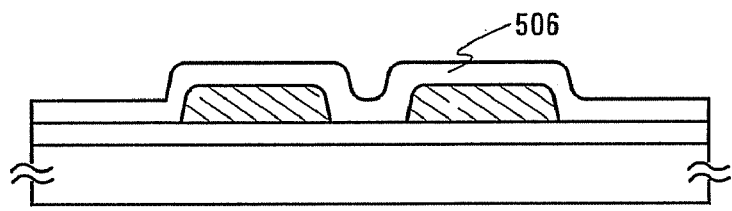

Then, a semiconductor film 506 is formed over the source electrode 504 and the drain electrode 505 (FIG. 22C). The semiconductor film 506 is formed of an amorphous semiconductor, a crystalline semiconductor or a semi-amorphous semiconductor. Each of them may be a silicon film or a semiconductor film containing silicon as its main component, for example such as a silicon germanium (SiGe) film. The semiconductor film 506 can be formed by plasma CVD and the like. The semiconductor film 506 is preferably formed with a thickness of 10 to 60 nm.

Figure 22D:
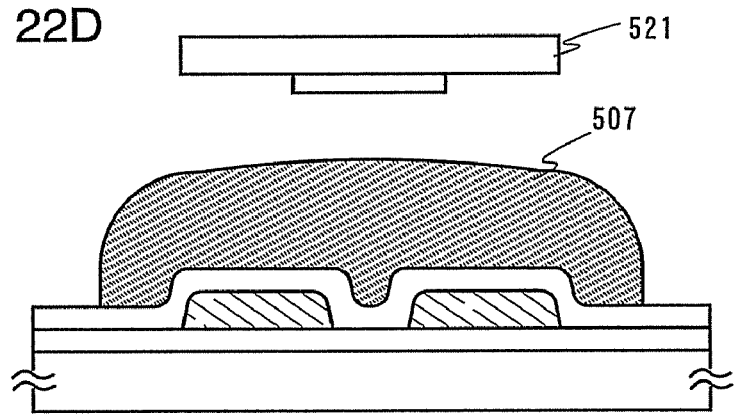

Then, a mask pattern 507 is formed over the semiconductor film 506 by a liquid droplet ejection method. The mask pattern 507 is formed selectively by ejecting a composition containing organic resin onto the semiconductor film 506 from a nozzle 521 (FIG. 22D). The mask pattern 507 may be formed by using organic resin such as acrylic, benzocyclobutene, polyamide and polyimide. Alternatively, a material having Si—O bonds in its backbone structure, and containing at least hydrogen or at least one of fluorine, an alkyl group and aromatic hydrocarbon as a substituent (hereinafter referred to as a 'siloxane material') can be used. Alternatively, a composition containing a photosensitive agent may be employed, such as a positive resist that novolac resin and naphthoquinone diazide compounds as a photosensitive agent are dissolved or dispersed with a known solvent; and a negative resist that base resin and diphenylsilanediol, acid generator or the like are dissolved or dispersed with a known solvent. Note that the mask pattern 507 can be formed through exposure and developing steps after a resist coating of over the whole surface as is conventional, however, a liquid droplet ejection system is desirably used in view of the simplification of steps.

Figure 23A:
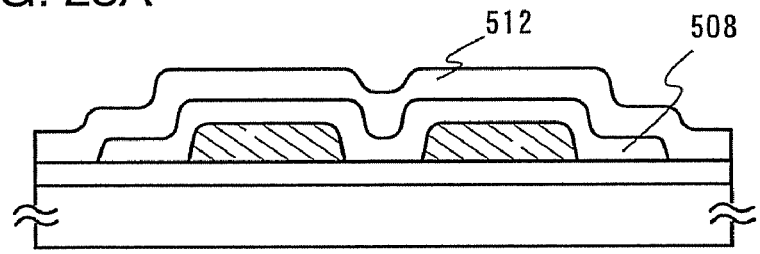
FIGS. 23A to 23D illustrate manufacturing steps of a staggered TFT in accordance with the invention.

Then, the semiconductor film 506 is etched using the mask pattern 507, thereby forming an island-like semiconductor film 508 (FIG. 23A). As an etching gas, a chlorine gas typified by $Cl_2$, $BCl_3$, $SiCl_4$ or $CCl_4$, a fluorine gas typified by $CF_4$, $SF_6$, and $NF_3$ or $O_2$ can be used appropriately. The mask pattern 507 is peeled off subsequently.

Note that the etching can be performed by utilizing the atmospheric pressure plasma as well. The etching gas used for this case is preferably a mixed gas of $CF_4$ and $O_2$. In addition, it is possible to perform maskless etching by locally blowing an etching gas.

Then, a gate insulating film 512 is formed over the island-like semiconductor film 508 (FIG. 23A). The gate insulating film 512 is preferably formed of an insulating film containing silicon which is formed by plasma CVD or sputtering.

Figure 23B:
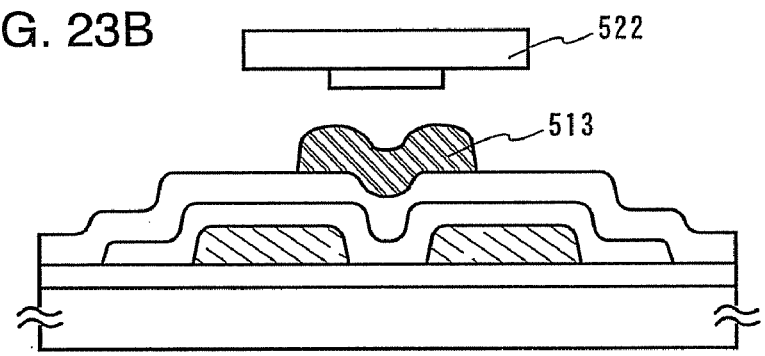
Figure 23C:
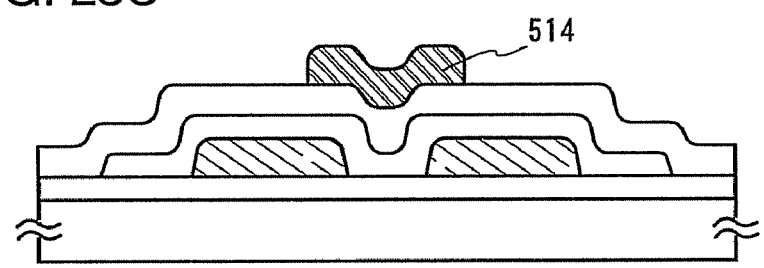

Then, a conductive film 513 to be a gate electrode 514 is formed over the gate insulating film 512 by a liquid droplet ejection method. The conductive film 513 is formed selectively by ejecting a composition containing a conductive material onto the gate insulating film 512 from a nozzle 522 (FIG. 23B). The conductive material may be the one similar to the conductive material used for the gate electrode 13 described in the aforementioned embodiment modes or embodiments. The conductive film 513 is baked in an atmosphere containing at least nitrogen and oxygen, whereby the gate electrode 514 is fowled (FIG. 23C). Note that planarization may be performed if necessary.

Note that the gate electrode 514 is not limited to a single-layer structure, and it may have a laminated structure of two, three or more layers. Simultaneously with the formation of the gate electrode 514, various wirings such as a signal line can be formed as well.

The island-like semiconductor film 508 is doped with impurity elements using the gate electrode 514 as a mask, thereby forming a channel region 509, and a source region 510 and a drain region 511 as impurity regions. As the impurity elements, N-type impurity elements such as arsenic (As) and phosphorus (P) or P-type impurity elements such as boron (B) can be used. Note that the impurity elements may be activated by heat treatment after the doping step.

Figure 23D:
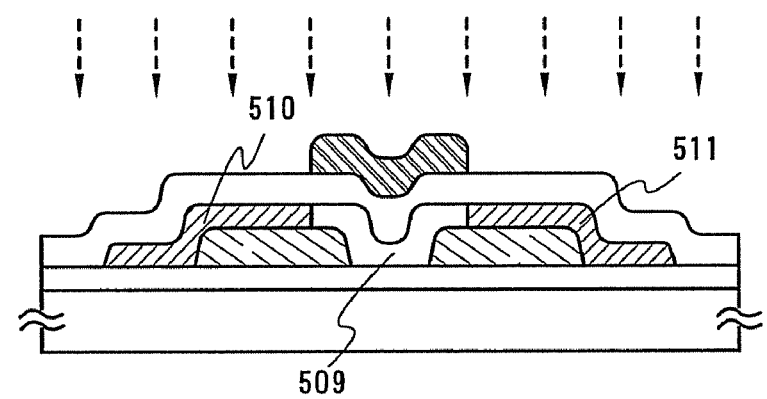

Through the aforementioned steps, a staggered TFT using the invention can be completed (FIG. 23D). In addition, though not shown, other wirings connected to the gate electrode 514, the source electrode 504 or the drain electrode 505 may be formed by a liquid droplet ejection method. That is, a mask pattern may be formed by a liquid droplet ejection method to perform etching, or alternatively, a conductive composition may be directly depicted by liquid droplet ejection to form a wiring. In the case of forming a wiring by the liquid droplet ejection method, ejection quantity may be controlled by changing ejection heads according to the wiring width. For example, a gate signal line and a gate electrode can be formed to have desired shapes respectively such that the gate signal line can be formed to have a thick-lined pattern while the gate electrode can be formed to have a thin-lined pattern. Further, by forming the mask pattern by the liquid droplet ejection method, such steps as resist coating, baking, exposure, development and baking after the development can be omitted. Thusly simplified steps can contribute to a significant cost reduction. In this manner, when using a liquid droplet ejection method to form an electrode, a wiring, a mask pattern and the like, the patterns can be formed in an arbitrary place while adjusting the thickness and width of the patterns to be formed. Therefore, these patterns can be formed even over a large substrate of more than 1 meter on a side at low cost and high yields.

Note that description is made on the case where a source electrode and a drain electrode are formed in advance in this embodiment, however, the gate electrode may be formed prior to the formation of these electrodes. For example, though not shown, it is possible that an interlayer insulating film is formed after the formation of a gate electrode, and a source electrode and a drain electrode are formed through a contact hole provided in the interlayer insulating film and the gate insulating film. The invention can be applied to this case as well. By forming a conductive film by a liquid droplet ejection method, and subsequently performing the aforementioned baking step, a thin electrode with excellent planarity and low resistance can be formed. Note that a semiconductor element formed in this manner is called a top-gate 1141.

As described above, in the formation of the source electrode 504 and the drain electrode 505, when forming the conductive films 502 and 503 by a liquid droplet ejection method and subsequently baking it in an $O_2$-containing atmosphere, conductive films with improved planarity, thinner film thickness and lower resistance can be obtained. Thus, the semiconductor film 506, the gate insulating film 512 and the like having planarity, evenness and excellent step coverage relatively to the source electrode 504 and the drain electrode 505 can be formed.

In the formation of the gate electrode 514, when forming the conductive film 513 by liquid droplet ejection and subsequently baking it in an $O_2$-containing atmosphere, a conductive film with improved planarity, thinner film thickness and lower resistance can be obtained. Thus, an insulating film, wiring and the like having planarity, evenness and excellent step coverage relatively to the gate electrode 514 can be formed over the gate electrode 514.

The gate electrode, the source electrode, the drain electrode, the mask pattern and the like described above can be formed to have desired patterns at desired positions by setting a moving path of a nozzle or a moving path of a stage for supporting the substrate based on the pattern data designed by CAD and the like, moving the nozzle or the stage along the set moving path by a control means and ejecting compositions containing the materials for forming such patterns from an ejection head of the nozzle.

In addition, according to the characteristics of compositions to be ejected, such ejection conditions are set as the moving rate of a nozzle or a substrate, ejection quantity of compositions, distance between an ejection head of a nozzle and the substrate, ejection rate of compositions to be ejected from the ejection head, atmosphere of the space that the compositions are ejected, the temperature and moisture of the space, and heating temperature of the substrate. These conditions are determined by a determination means for determining an optimal parameter by comparing the designed data of the thin film pattern with the data of the composition type, film thickness and the like based on a database in which a number of parameters that are obtained theoretically, experimentally and experientially are compiled. Thus, an excellent pattern can be obtained with high throughput.

In addition, the island-like semiconductor film or the island-like N-type semiconductor film and the like in this embodiment can be formed by ejecting compositions containing materials for forming such films by using a liquid droplet ejection system in accordance with the invention.

By inputting pattern data of the thin film such as the gate electrode, the source electrode, the drain electrode, the mask pattern and the like formed by the aforementioned method, the moving path of the nozzle for ejecting compositions or the moving path of the stage of the substrate is determined, and compositions are ejected along the moving path, whereby a desired thin film pattern can be promptly formed with accuracy. Thus, a manufacturing method of a semiconductor element can be provided with a reduced tact time, higher throughput and higher yield.

Embodiment 12

In this embodiment, description is made on a manufacturing method of an active matrix liquid crystal display device using the invention with reference to FIGS. 24A to 26B.

Figure 24A:
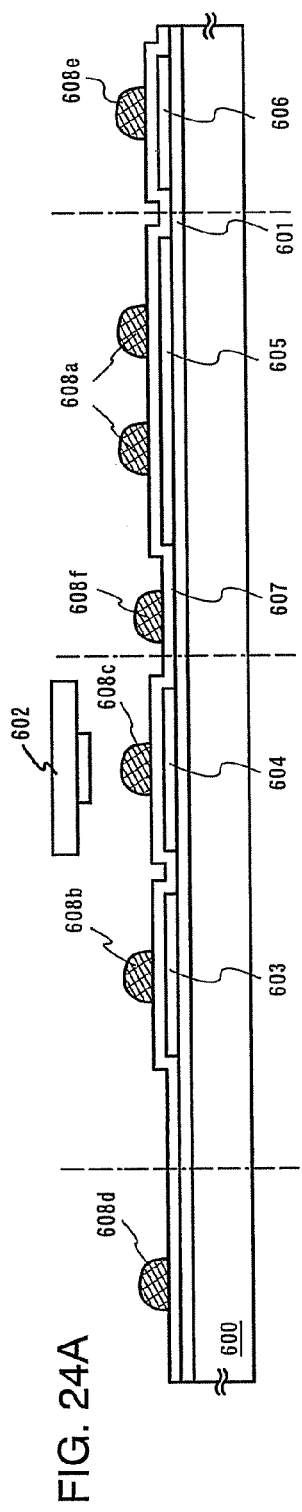
FIGS. 24A to 24C illustrate manufacturing steps of a liquid crystal display device in accordance with the invention.

First, a base insulating film 601 is formed over a substrate 600 (FIG. 24A). The base insulating film 601 is formed of a silicon nitride oxide film which is formed with a thickness of 10 to 200 nm by plasma CVD. However, the invention is not limited to this, and the base insulating film 601 may be formed of a silicon oxide film, a silicon nitride film, a silicon oxynitride film or a lamination of them. Note that the base insulating film 601 is not particularly required.

Subsequently, a semiconductor film is formed with a thickness of 10 to 80 nm over the base insulating film 601. The surface of the semiconductor film is processed with a nickel-containing solution and subsequently applied a thermal crystallization at a temperature of 500 to 750° C. to obtain a crystalline silicon semiconductor film. Further, it is subjected to a laser irradiation to improve the crystallinity thereof. Note that the semiconductor film may be the one having other amorphous crystalline structures such as a silicon germanium (SiGe) alloy. As a deposition method, sputtering, LPCVD and the like can be employed. As a crystallization method, laser crystallization, thermal crystallization or thermal crystallization by means of other catalysts (Fe, Ru, Rh, Pd, Os, Ir, Pt, Cu, Au and the like) can be employed. Alternatively, such crystallization may be preformed alternately in a plurality of times. The aforementioned catalysts are dissolved or dispersed into a solvent, which are then deposited over the semiconductor film by a known method such as spin coating and sputtering. For example, a nickel acetate solution containing nickel at 10 ppm is coated over the surface of the semiconductor film.

As for the crystallization of a semiconductor film having an amorphous structure, a continuous wave laser may be employed. In order to obtain crystal grains of large diameters in crystallization, a solid-state laser capable of radiating continuous wave laser is used, and it is desirable to adopt the second to the fourth harmonic wave of the fundamental wave. Typically, the second harmonic wave (532 nm) or the third harmonic wave (355 nm) of an Nd:YVO$_4$ laser (the fundamental wave of 1064 nm) may be employed. In the case of using a continuous wave laser, laser light which is radiated from a continuous wave YVO$_4$ laser at an output of 10 W is converted into a higher harmonic wave by means of a non-linear optical element. Alternatively, a method for radiating a higher harmonic wave can be used by putting YVO$_4$ crystals and a non-linear optical element in a resonator. In that case, it is preferable that rectangular or oval laser light is produced on the irradiation surface by an optical system before irradiated to the subject. The energy density at this time is required to be about 0.01 to 100 MW/cm$^2$ (more preferably about 0.1 to 10 MW/cm$^2$). The semiconductor film may be moved relatively to the laser light at a rate of about 10 to 2000 cm/s.

After obtaining a crystalline silicon semiconductor film by the aforementioned method, an amorphous silicon film for getting metal catalysts is deposited with an oxide film interposed therebetween, and gettering is performed by heat treatment at a temperature of 500 to 750° C. Subsequently, the amorphous silicon film containing the metal catalysts is removed by etching.

Further, in order to control the threshold voltage of the crystalline silicon semiconductor film as a TFT element, boron ions are desirably implanted to the film at an appropriately determined concentration of 1 to $3 \times 10^{13}$ or more.

Note that the semiconductor film may be a semi-amorphous semiconductor or an amorphous semiconductor as well as a crystalline semiconductor formed by other methods.

Subsequently, the silicon crystalline semiconductor film is etched using a first mask pattern to form island-like silicon crystalline semiconductor films (hereinafter referred to as 'island-like semiconductor films 603 to 606'). Note that the first mask pattern is desirably formed by a liquid droplet ejection method in view of the simplification of steps though not shown. At this time, the first mask pattern is preferably formed by using a heat resistant high molecular weight material. For example, polyimide, siloxane, polybenzimidazole and the like can be used. In the case of using polyimide, compositions containing polyimide are ejected onto the island-like semiconductor films from an ejection head of droplets, and then baked at 200° C. for 30 minutes to form the first mask pattern.

Then, a gate insulating film 607 is formed over the island-like semiconductor films 603 to 606 after removing the first mask pattern (FIG. 24A). The gate insulating film 607 is deposited by plasma CVD or sputtering to have a thickness of 1 to 200 nm. Preferably, it is formed of a single layer or laminated layers containing silicon to have a thickness of 10 to 50 nm, and the surface thereof is nitrided by using a microwave plasma.

In the case of depositing such a thin gate insulating film by plasma CVD, the deposition rate is required to be low enough to control the thinness of the film. For example, deposition conditions can be set as follows: RF power of 100 W, 10 kHz, pressure at 0.3 Torr, $N_2O$ gas flow rate of 400 sccm and $SiH_4$ gas flow rate of 1 sccm, whereby the deposition rate of an silicon oxide film can be set at 6 nm/min. The nitriding process with a microwave plasma is performed by using a microwave source (2.45 GHz) and a nitrogen gas as a reaction gas.

Note that the nitrogen concentration in this case is lower in the farther place from the surface of the gate insulating film 607. Accordingly, the surface of the silicon oxide film can be nitrided to have a high concentration while nitrogen contained on the boundary between the silicon oxide film and an active layer can be decreased, which can prevent the degradation of the characteristics of a device. Note that the gate insulating film 607 may have a multi-layer stricture as described in Embodiment 2.

Subsequently, a portion where a gate electrode is formed over the gate insulating film 607 is selectively ejected with compositions containing conductive materials by a liquid droplet ejection method, thereby forming conductive films 608a to 608f (FIG. 24A). At this time, the shapes of the conductive films 608a to 608f are roundish due to the surface tension of the liquid droplet. Ag is used as the conductive material here, however, the invention is not limited to this. Those described in the aforementioned embodiment modes or embodiments can be employed. In addition, the liquid droplet ejection conditions and the like may be similar to the ones described in the aforementioned embodiment modes or embodiments.

Then, the conductive films 608a to 608f containing conductive materials are baked in an atmosphere containing at least nitrogen and oxygen. Here, a mixed gas of nitrogen and oxygen is used with an oxygen partial pressure in the mixed gas at 25%. The baking conditions are set at the temperature of 230° C. for one hour, however, the invention is not limited to this. In this manner, by forming conductive films by a liquid droplet ejection method and subsequently baking them in an $O_2$-containing atmosphere, conductive films with improved planarity, thinner film thickness and lower resistance can be obtained. Note that the solvent in the compositions is evaporated by ejecting the compositions containing conductive materials under the reduced pressure, therefore, time required for the subsequent heat treatment (drying or baking) can be reduced.

Figure 24B:
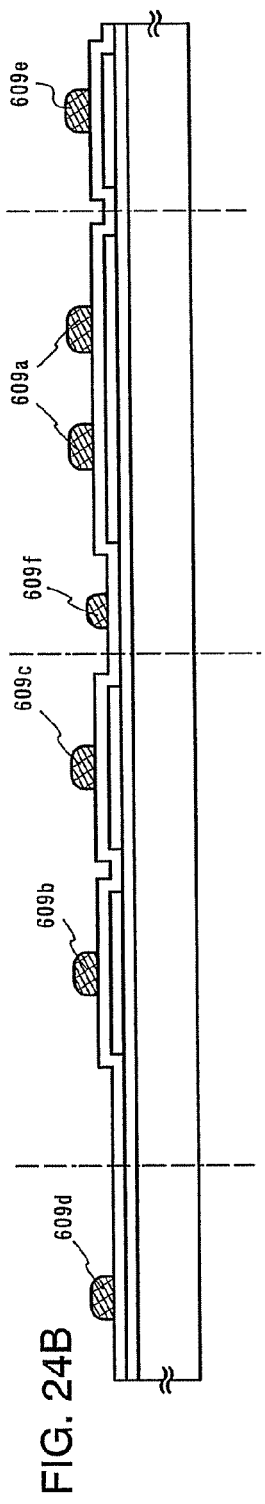

Through the aforementioned steps, gate electrodes 609a to 609c and wirings 609d to 609f are formed (FIG. 24B). Note that planarization may be performed in order to improve the planarity. For example, CMP, etch back, reflowing, coating, filling with oxide, bias sputtering, bias sputtering, selective growth by means of CVD, laser irradiation and the like can be used.

Note that each of the gate electrodes 609a to 609c and the wirings 609d to 609f is not limited to the single-layer structure, and it may have a laminated structure of two, three or more layers. For example, a double-layer structure of TaN (tantalum nitride) and W (tungsten) may be employed. In this case, it is desirable that the aforementioned baking step is performed each time a conductive film is deposited, however, the invention is not limited to this procedure. Simultaneously with the formation of the gate electrodes 609a to 609c and wirings 609d to 609f, various wirings such as a scan line and a signal line can be formed as well.

Figure 24C:
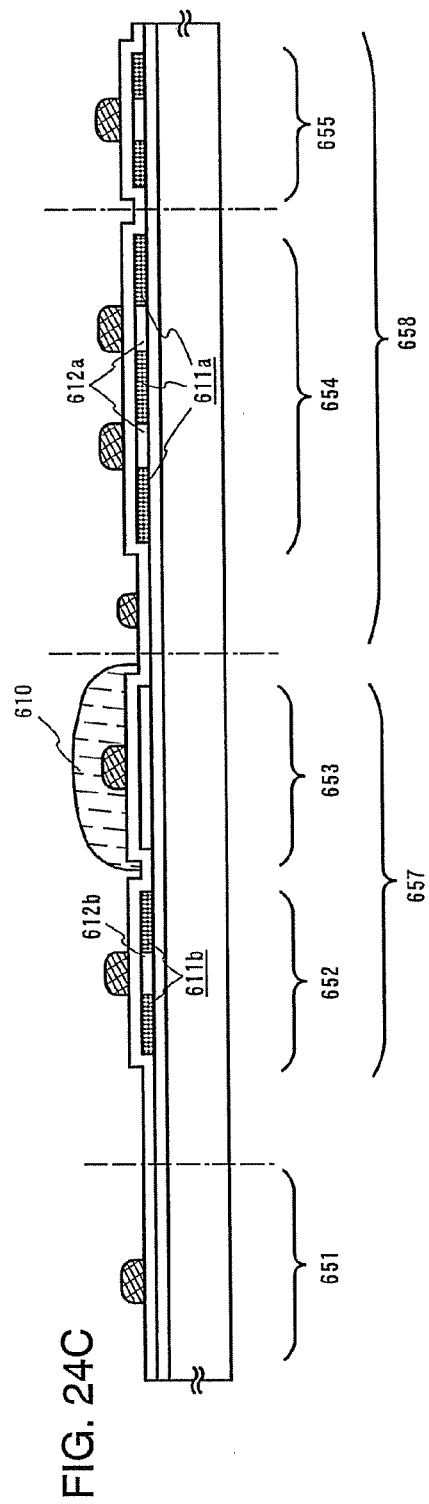

Subsequently, a second mask pattern 610 is formed over the portion where a P-channel TFT 653 of a driver circuit portion is formed, and then N-type impurity elements on the order of $10^{13}$ to $10^{14}$ atoms/cm$^3$ are doped into the island-like semiconductor films 605 and 603 using the gate electrodes 609a and 609b as masks respectively. Accordingly, N-type impurity regions 611a and 611b to function as a source region or a drain region of an N-channel TFT 652 and the pixel TFT 654 are formed. Further, channel regions 612a and 612b are formed between each of the impurity regions (FIG. 24C). As the N-type impurity elements, arsenic (As), phosphorus (P) and the like can be used. Subsequently, the second mask pattern 610 is removed by $O_2$ ashing and the like.

Figure 25A:
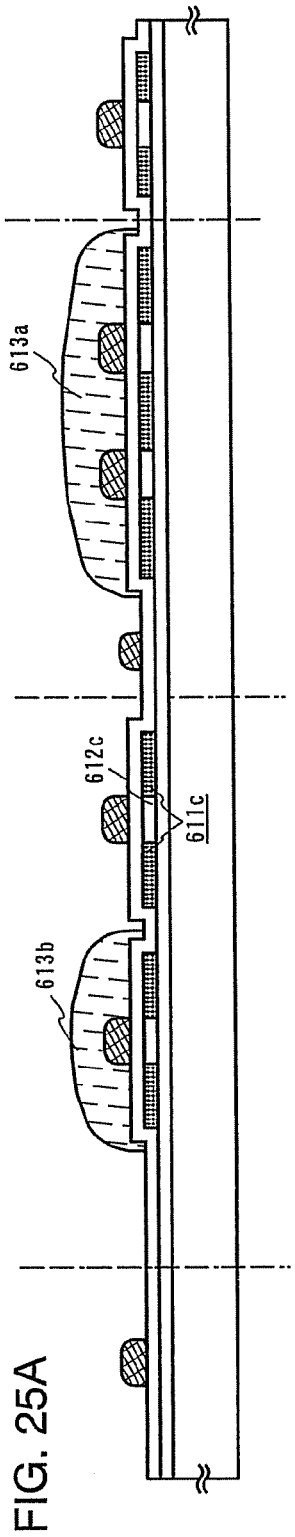
FIGS. 25A to 25C illustrate manufacturing steps of a liquid crystal display device in accordance with the invention.

Subsequently, third mask patterns 613a and 613b are formed to cover the portions where the pixel TFT 654 of the pixel portion and the N-channel TFT 652 of the driver circuit portion are formed respectively, and then P-type impurity elements on the order of $10^{15}$ to $10^{17}$ atoms/cm$^3$ are doped into the island-like semiconductor film 604 using the gate electrode 609c as a mask. Accordingly, a P-type impurity region 611c to serve as a source region or a drain region of the P-channel TFT 652 is formed. Further, a channel region 612c is formed in the middle of the P-type impurity region 611c (FIG. 25A). As the N-type impurity elements, boron (B) and the like can be used. Subsequently, the third mask patterns 613a and 613b are removed by $O_2$ ashing and the like.

Note that the second and third mask patterns are desirably formed by a liquid droplet ejection method as well as the first mask pattern in view of the simplification of the steps.

Figure 25B:
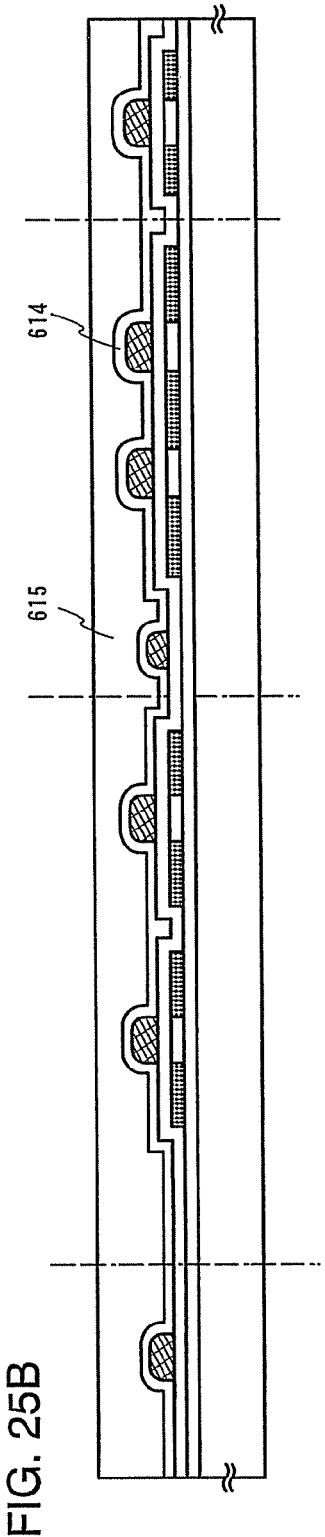

Subsequently, a cap insulating film 614 for covering the TFTs is formed by plasma CVD (FIG. 25B). The cap insulating film 614 may be preferably formed of a silicon nitride film or a silicon oxynitride film, however, the invention is not limited to this. In addition, the method for forming the cap insulating film 614 is not limited to plasma CVD. Note that the cap insulating film 614 is preferably provided in order to prevent intrusion of impurities from above the TFT.

Then, heat treatment is performed in order to activate the impurities doped to the semiconductor film. This activation is performed in a furnace with an $N_2$ atmosphere at a temperature of 500 to 800° C. For example, RTA (Rapid Thermal Annealing) may be employed. Alternatively, activation may be performed by laser irradiation. In this case, laser light may be irradiated from either the back side or the front side of the substrate. Alternatively, it may be irradiated from both sides of the substrate as well. Note that the activation may be omitted in the case of simplifying the steps.

Note that it is possible that an insulating film (not shown) formed of a hydrogen-containing silicon nitride film or silicon nitride oxide film is subsequently formed by plasma CVD, and heat treatment is performed thereto so as to discharge hydrogen from the insulating film and hydrogenate the semiconductor film, thereby eliminating dangling bonds of silicon. This heat treatment may be performed using a clean oven with an $N_2$ atmosphere at a temperature of 350 to 450° C. (preferably at 410° C.). Note that the insulating film may be other insulating film containing hydrogen and silicon, and the method for forming the film may be other than plasma CVD as well.

Then, an interlayer insulating film 615 is formed over the cap insulating film 614. Here, a solution containing polyimide is coated over the whole surface of the substrate by spin coating, however, the invention is not limited to such material and method. For example, an insulating film having Si—O bonds and Si—$CH_x$ bonds, which is formed of acrylic resin, polyamide resin or a siloxane material as a starting material can be used as well as the polyimide resin. Alternatively, the interlayer insulating film 615 may be formed by a liquid droplet ejection method.

Figure 25C:
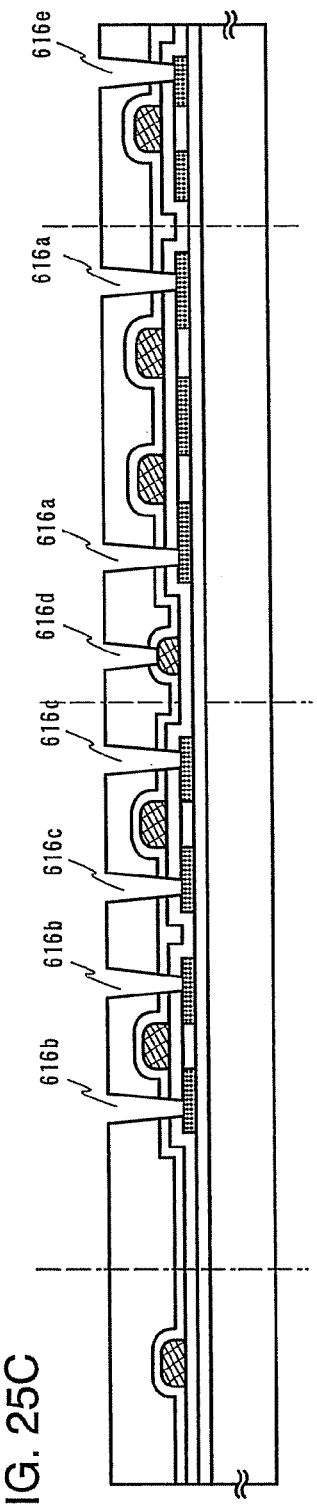

Then, the interlayer insulating film 615, the cap insulating film 614 and the gate insulating film 607 are selectively etched to open contact holes 616a to 616e (FIG. 25C). In the case where an insulating film for hydrotreatment is formed, it is incidentally removed at this time. The contact holes 616a to 616e can be formed by a conventional method such that a resist is coated over the whole surface of a substrate, which is then subjected to prevaking, exposure and development steps to form a mask pattern to be etched. However, the mask pattern is desirably formed by selective ejection of a resist according to a liquid droplet ejection method in view of the cost reduction and simplification of steps.

Alternatively, contact holes can be formed through the following steps by omitting the resist pattering. That is, contact holes can be formed by covering the portions where the contact holes of a semiconductor element are to be formed, with a first water repellent organic film (hereinafter merely referred to as a 'first organic film'), forming a second organic film to serve as an interlayer insulating film where the first organic film is not formed and subsequently removing the first organic film. The process for opening the contact holes is described below.

First, the first organic film is selectively formed over the portions where contact holes are to be formed extending to the source regions or the drain regions 611a to 611c and the wiring 609 by a liquid droplet ejection method. The first organic film may be a known fluorinated resin having water repellent property. Preferably, repfluoroalkylsilane (FAS) having excellent water repellent property represented by a chemical formula: $R_n$—Si—$X_{4-n}$ (n=1, 2 and 3) is used. Here, R includes a relatively inactive group such as an alkyl group or a reactive group such as a vinyl group, an amino group and epoxy group. X denotes halogen, methoxy group, ethoxy group, acetoxy group or other hydrolysis group.

Alternatively, a non-water repellent organic substance may be used for the first organic film provided that it is later treated with $CF_4$ plasma and the like to obtain water repellent property. For example, a mixture of water soluble resin such as polyvinyl alcohol (PVA) with a solvent such as $H_2O$ can be used. The mixture of PVA with other water soluble resin can be used as well.

Subsequently, a second organic film is coated over the whole surface of the substrate, whereby the second organic film is repelled by the first organic film. Thus, the second organic film is formed in other than the portions where the first organic film is formed. The second organic film can be formed by spin coating or a liquid droplet ejection method using an insulating film having Si—O bonds and Si—$CH_x$ bonds, which is formed of polyimide resin, acrylic resin, polyimide resin or a siloxane material as a starting material.

After the formation of the second organic film, the first organic film is removed. Further, the cap insulating film 614 and the gate insulating film 607 are selectively removed. As a method for removing the films, such processing may be employed as wet etching, dry etching, etching by means of the atmospheric pressure plasma discharge, washing, and irradiation with laser or electron beams. The processing can be appropriately selected in accordance with the materials used for the first organic film, the gate insulating film 607 and the like. In particular, when using water-soluble resin such as PVA, the aforementioned films can be easily removed by washing. In addition, types of etching gas, laser and the like can be appropriately selected in accordance with the materials as well. Each of the first organic film, the cap insulating film 614 and the gate insulating film 607 may be removed in stages as well. Through the aforementioned steps, contact holes are formed in the portion where the first organic resin film has been present.

After the formation of the contact holes 616a to 616e, compositions containing conductive materials are ejected by a liquid droplet ejection method in order to form wirings for connecting the TFTs 652 to 654, a capacitor 655 and the wiring 609f. As the conductive materials, those described in the aforementioned embodiment modes or embodiments can be used. Further, by performing the aforementioned heat treatment, conductive films with improved planarity, thinner film thickness and lower resistance can be obtained.

Figure 26A:
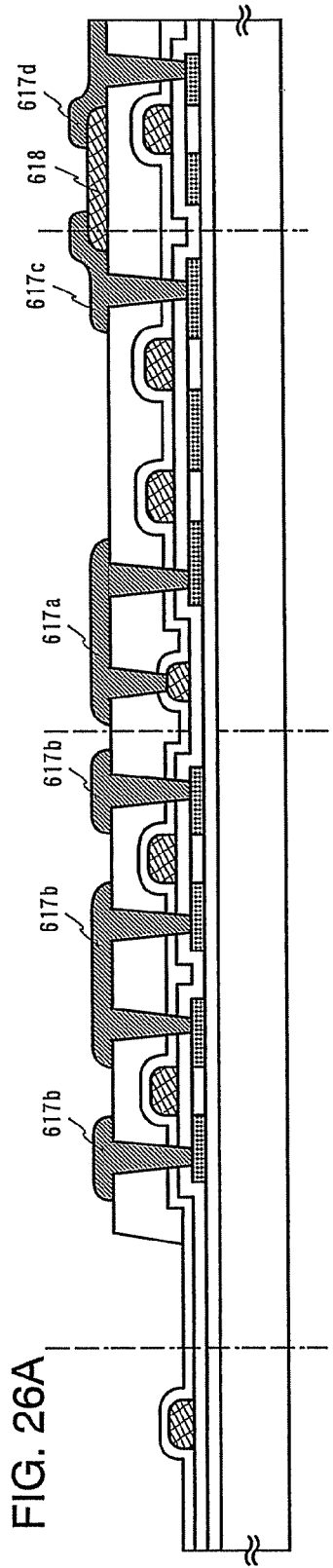
FIGS. 26A and 26B illustrate manufacturing steps of a liquid crystal display device in accordance with the invention.

In this manner, wirings 617a to 617d are formed (FIG. 26A). Note that these wirings may have a multi-layer structure. For example, the wirings 617a to 617d are formed by a liquid droplet ejection method by sequentially laminating a Ti film having a thickness of 50 to 200 nm, an Al film or an Al—Si alloy film having a thickness of 250 to 400 nm and a Ti film having a thickness of 50 to 200 nm. In such a triple-layer structure, Ti may be replaced by TiN or titanium nitride containing nitrogen with a composition ratio of 50% or less (hereinafter referred to as 'Ti (N)'). Alternatively, TiN or Ti (N) may be laminated additionally to sandwich the triple layers. Al produces hillocks at a temperature of 150 to 200° C., therefore, it is desirable that the wirings contains Si.

As for the formation of the pixel portion 658, compositions containing a conductive material for forming the pixel electrode 618 is ejected by a liquid droplet ejection method. As the conductive material, light-transmitting conductive materials such as ITO, ITSO, IZO and GZO are desirably employed. The pixel electrode 618 is desirably formed by baking the compositions containing a conductive material in an atmosphere containing at least nitrogen and oxygen. Accordingly, a conductive film with improved planarity, thinner film thickness and lower resistance can be obtained.

Thusly formed pixel electrode 618 is electrically connected to the drain region of the pixel TFT 654 and the lower electrode of the capacitor 655 (semiconductor film doped with impurities) via the wirings 617c and 617d (FIG. 26A). Note that the pixel electrode 618 may have a laminated structure of conductive films farmed of the aforementioned materials.

Through the aforementioned steps, an active matrix substrate can be completed which comprises the driver circuit portion 657 including a CMOS structure of the N-channel TFT 652 and the P-channel TFT 653 and the pixel portion 658 including the pixel TFT 654 and the capacitor 655 (FIG. 26A).

Figure 26B:
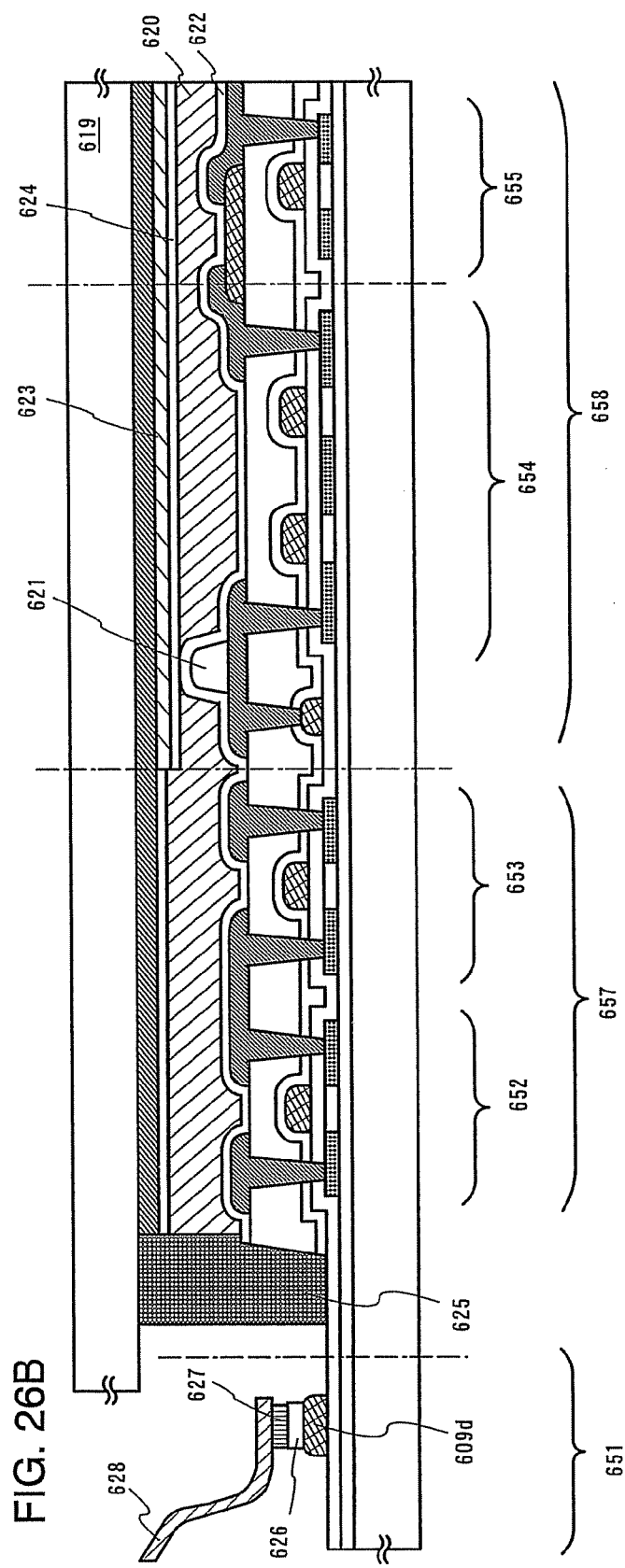

FIG. 26B illustrates the active matrix substrate in the condition where TFT substrate and a counter substrate 619 are attached with a liquid crystal layer 620 sandwiched therebetween by a sealing member 625. A columnar spacer 621 is formed on the TFT substrate. In addition, an alignment film 622 is formed over the TFT substrate, and processed by rubbing. The counter substrate 619 is formed with a light-transmitting conductive film 623 and an alignment film 624. Subsequently, the TFT substrate and the counter substrate 619 are attached by the sealing member 625 and liquid crystals are injected between them to form the liquid crystal layer 620. In this manner, an active matrix liquid crystal display device can be completed. Note that the liquid crystal layer 620 may be formed by dropping liquid crystals. Such process is effective in the case of manufacturing a liquid crystal display device using a large active matrix substrate of more than 1 to 2 meters on a side.

Subsequently, an FPC (Flexible Printed Circuit) 628 is attached to a terminal electrode 626 with an anisotropic conductive film 627 by a known method. The terminal electrode 626 is desirably connected to the wiring 609*d* which is formed simultaneously with the gate electrodes, and formed by using a light-transmitting conductive film.

Through the aforementioned steps, an active matrix liquid crystal display device using a top-gate TFT is completed. In this embodiment, in the formation of the gate electrodes 609*a* to 609*c*, the wirings 609*d* to 609*f*, the wirings 617*a* to 617*d* and the pixel electrode 618, when forming the conductive films by a liquid droplet ejection method and subsequently baking them in an $O_2$-containing atmosphere, conductive films with improved planarity, thinner film thickness and lower resistance can be obtained. Note that the method for forming these conductive films using a liquid droplet ejection method is not required to be applied to all the steps.

The gate electrodes, the source electrodes, the drain electrodes, the mask pattern, the pixel electrode, a color filter, the alignment film and the like described above can be formed to have desired patterns at desired positions by setting a moving path of a nozzle or a moving path of a stage for supporting the substrate based on the pattern data designed by CAD and the like, moving the nozzle or the stage along the set moving path by a control means and ejecting compositions containing the materials for forming such patterns from an ejection head of the nozzle.

In addition, according to the characteristics of compositions to be ejected, such ejection conditions are set as the moving rate of a nozzle or a substrate, ejection quantity of compositions, distance between an ejection head of a nozzle and the substrate, ejection rate of compositions to be ejected from the ejection head, atmosphere of the space that the compositions are ejected, the temperature and moisture of the space, and heating temperature of the substrate. These conditions are determined by a determination means for determining an optimal parameter by comparing the designed data of the thin film pattern with the data of the composition type, film thickness and the like based on a database in which a number of parameters that are obtained theoretically, experimentally and experientially are compiled. Thus, an excellent pattern can be obtained with high throughput.

In addition, the island-like semiconductor film or the island-like N-type semiconductor film and the like in this embodiment can be formed by ejecting compositions containing materials for forming such films by using a liquid droplet ejection system in accordance with the invention.

By inputting pattern data of the thin film such as the gate electrodes, the source electrodes, the drain electrodes, the mask pattern, the pixel electrode, the color filter, the alignment film and the like formed by the aforementioned method, the moving path of the nozzle for ejecting compositions or the moving path of the stage of the substrate is determined, and compositions are ejected along the moving path, whereby a desired thin film pattern can be promptly formed with accuracy. Thus, a manufacturing method of a semiconductor element can be provided with a reduced tact time, higher throughput and higher yield.

Embodiment 13

Figure 27A:
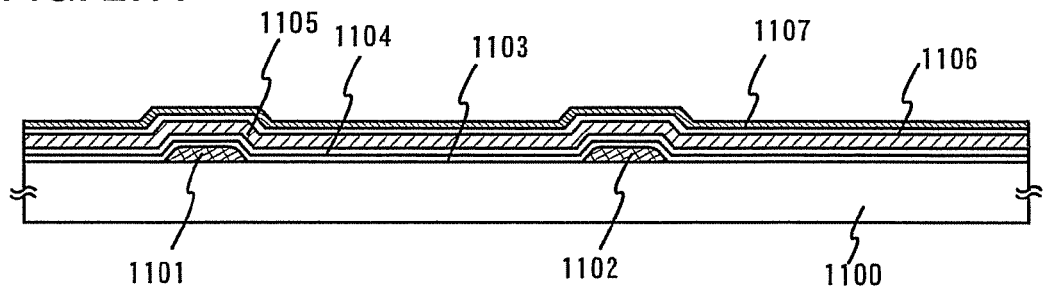
FIGS. 27A to 27D illustrate manufacturing steps of an EL light-emitting device in accordance with the invention.
Figure 27B:
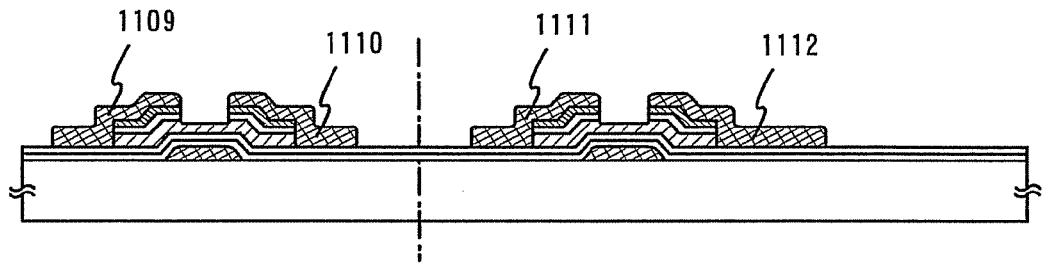
Figure 27C:
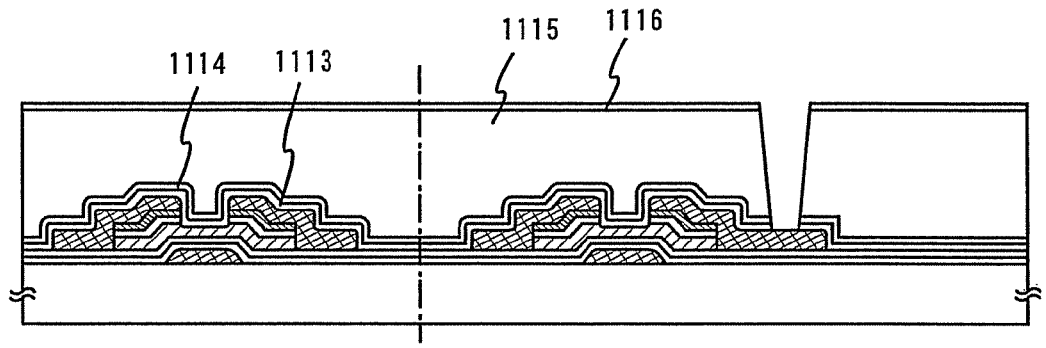
Figure 27D:
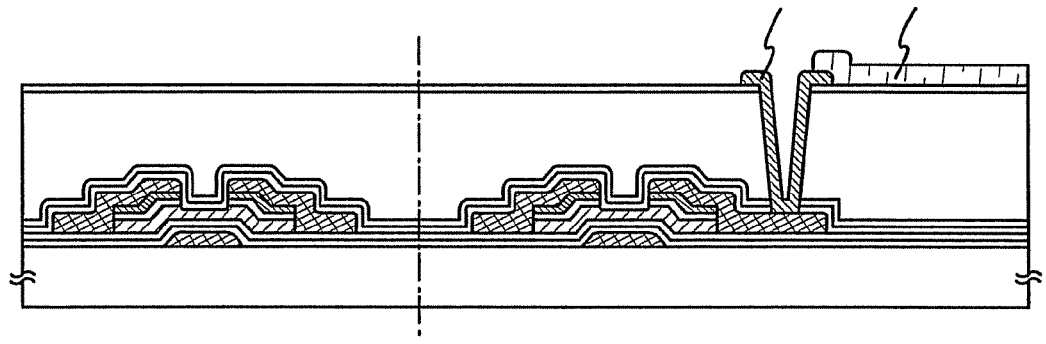
Figure 28:
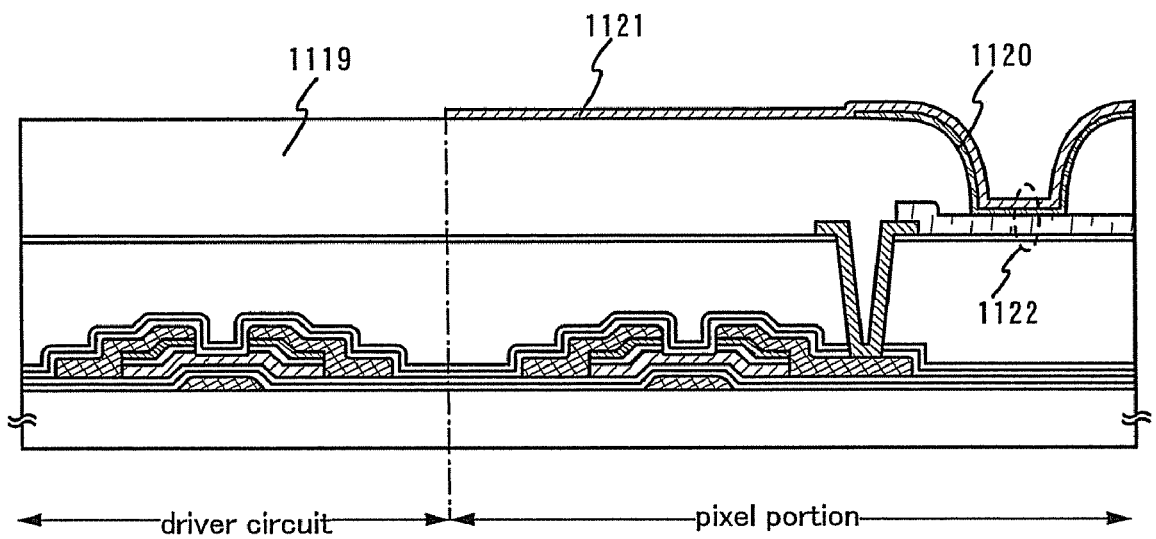
FIG. 28 illustrates a completion diagram of an EL light-emitting device (channel-etched TFT) manufactured in accordance with the invention.

In this embodiment, description is made on the case where the invention is applied to a bottom emission active matrix light-emitting device having an inverted staggered structure with reference to FIGS. 27A to 28.

A conductive film for forming gate electrodes and gate wirings (scan lines) is formed over a substrate 1100 formed of a similar material to those described in the aforementioned embodiment modes or embodiments by a liquid droplet ejection method. Compositions ejected from an ejection head may be the one described in the aforementioned embodiment modes or embodiments. Other conditions of the liquid droplet ejection means may be set as in the aforementioned embodiment modes or embodiments as well.

Then, the ejected compositions are baked in an atmosphere containing at least nitrogen and oxygen. For example, a mixed gas of nitrogen and oxygen is preferably used. The composition ratio of oxygen in the mixed gas is in the range of 3 to 60%, and more preferably in the range of 10 to 25%. The baking conditions are preferably at a temperature of 200 to 300° C. for 0.5 to 2 hours. In this manner, by forming conductive films by a liquid droplet ejection method and subsequently baking them in an $O_2$-containing atmosphere, conductive films with improved planarity, thinner film thickness and lower resistance can be obtained.

Through the aforementioned steps, gate electrodes 1101 and 1102 are formed (FIG. 27A). Note that planarization may be performed in the case of improving the planarity of the gate electrodes 1101 and 1102. For example, CMP, etch back, reflowing, coating, filling with oxide, bias sputtering, bias sputtering, selective growth by means of CVD, laser irradiation and the like can be used.

Note that each of the gate electrodes 1101 to 1102 is not limited to a single-layer structure, and it may have a laminated structure of two, three or more layers. Simultaneously with the formation of the gate electrodes 1101 and 1102, various wirings such as a scan line and a signal line can be formed as well.

Then, a first insulating film 1103 and a second insulating film 1104 to function as gate insulating films are formed over the gate electrodes 1101 and 1102. In this case, it is desirable that the first insulating film 1103 is formed of a silicon oxide film while the second insulating film 1104 is formed of a silicon nitride film, however, the invention is not limited to this. These insulating films can be formed by glow discharge decomposition or sputtering. In particular, in the case of forming dense insulating films having small gate leak currents at a low deposition temperature, it is desirable that a reactive gas containing a noble gas element such as argon is mixed into the insulating films to be formed.

Then, a first semiconductor film 1105 is formed over the first insulating film 1103 and the second insulating film 1104. The first semiconductor film 1105 is formed of a semi-amorphous semiconductor (SAS). The SAS can be obtained by glow discharge decomposition of silicon gas. Typically, silicon gas of $SiH_4$ can be used as well as other silicon gas such as $Si_2H_6$, $SiH_2Cl_2$, $SiHCl_3$, $SiCl_4$ and $SiF_4$. The silicon gas which is diluted by one or more of noble gas elements such as hydrogen, hydrogen and helium, argon, krypton and neon will facilitate the formation of SAS. The dilution rate of the silicon gas is preferably in the range of 10 to 1000 times. It is needless to mention that a reaction for producing the film by glow discharge decomposition is performed at a reduced pressure. The pressure at this time may be in the range of about 0.1 to 133 Pa. The power for producing glow discharge may be in the range of 1 to 120 MHz, and more preferably an RF power in the range of 13 MHz to 60 MHz. The substrate is desirably heated at a temperature of 300° C. or less, and more preferably in the range of 100 to 200° C.

It is also possible that the silicon gas is mixed with a carbide gas such as $CH_4$ and $C_2H_6$ or a germanium gas such as $GeH_4$ and $GeF_4$ to control the energy bandwidth at 1.5 to 2.4 eV or at 0.9 to 1.1 eV.

The SAS shows small N-type conductivity when not doped with impurity elements for controlling electrons intentionally. This is because oxygen is easily mixed into the semiconductor film since glow discharge is performed with a higher power than that in the case of depositing an amorphous semiconductor. Then, as for the first semiconductor film provided with a channel forming region of a TFT, the threshold voltage thereof can be controlled by doping impurity elements which impart P-type conductivity simultaneously with or after the deposition of the film. As the typical impurity element which imparts P-type conductivity, boron is employed. For example, impurity gas such as $B_2H_6$ and $BF_3$ may be mixed into the silicon gas at a rate of 1 to 1000 ppm. In the case of employing boron as the impurity element which imparts P-type conductivity, concentration of the boron is preferably in the range of $1 \times 10^{14}$ to $6 \times 10^{16}$ atoms/cm³.

Then, a second semiconductor film 1106 and a third semiconductor film 1107 are formed in sequence. The second semiconductor 1106 is formed by doping no impurity elements for controlling electrons intentionally, and it can be formed by using an SAS as well as the first semiconductor film 1105. The second semiconductor film 1106 has a function of a buffer layer by being formed between the third semiconductor film 1107 and the first semiconductor film 1105 having one conductivity for forming a source or a drain. Therefore, it is not necessarily required to be formed in the case where the third semiconductor film 1107 is formed to have the same type of one conductivity as that of the first semiconductor film 1105. In the case of doping impurity elements which impart P-type conductivity with a view to control the threshold voltage, the second semiconductor film 1106 functions to change concentration of the impurities in stages, which is advantageous in obtaining an excellent junction formation. That is, it can function as a low-concentration impurity region (LDD region) formed between a channel forming region and a source region or a drain region in a TFT to be formed.

In the case of forming an N-channel TFT, the third semiconductor film 1107 having one conductivity may be doped with phosphorus which is a typical impurity element. That is, the third semiconductor film 1107 may be formed by doping an impurity gas such as $PH_3$ mixed with a silicon gas. The third semiconductor film 1107 having one conductivity can be formed by using an SAS or an amorphous semiconductor.

As described above, the first insulating film 1103 to the third semiconductor film 1107 having one conductivity can be formed in succession without being exposed to the atmosphere. That is, since the boundary face of each lamination can be formed without being contaminated by impurity elements in the atmospheric component or in the atmosphere, the variation of the TFT characteristics can be reduced (FIG. 27A).

Then, a mask pattern is formed, and the first semiconductor film 1105, the second semiconductor film 1106 and the third semiconductor film 1107 having one conductivity are etched so as to be separated into island shapes. This mask pattern may be formed by using organic resin such as acrylic, benzocyclobutene, polyamide, polyimide and a siloxane material. Alternatively, a composition containing a photosensitive agent may be employed, such as a positive resist that novolac resin and naphthoquinone diazide compounds as a photosensitive agent are dissolved or dispersed with a known solvent; and a negative resist that base resin and diphenylsilanediol, acid generator or the like are dissolved or dispersed with a known solvent. Note that the mask pattern can be formed through exposure and developing steps after a resist coating of over the whole surface as is conventional, however, a liquid droplet ejection system is desirably used in view of the simplification of steps.

Then, a second conductive film for forming a source or a drain is formed by liquid droplet ejection. Compositions ejected from an ejection head may be the one described in the aforementioned embodiment modes or embodiments. Other conditions of the liquid droplet ejection means may be set as in the aforementioned embodiment modes or embodiments as well. Subsequently, the ejected composition is baked in an atmosphere containing at least nitrogen and oxygen, whereby a conductive film with improved planarity, thinner film thickness and lower resistance can be obtained.

Through the aforementioned steps, source electrodes 1109 and 1111 and drain electrodes 1110 and 1112 are formed (FIG. 27B). Note that planarization may be performed in the case of improving the planarity of the source electrodes 1109 and 1111 and the drain electrodes 1110 and 1112. For example, CMP, etch back, reflowing, coating, filling with oxide, bias sputtering, bias sputtering, selective growth by means of CVD, laser irradiation and the like can be used.

Then, top portions of the third semiconductor film 1107, the second semiconductor film 1106 and the first semiconductor film 1110 are etched using the source electrodes 1109 and 1111 and the drain electrodes 1110 and 1112 as masks. Etching can be performed by using a fluoride gas such as $SF_6$, $NF_3$ and $CF_4$ as an etching gas, however in this case, the processing time is required to be controlled appropriately since it is impossible to have an etching rate with the first semiconductor film 1105 as a base. In this manner, the channel-etched TFT can be formed (FIG. 27B).

Then, a third insulating film 1113 is formed by using a silicon nitride film with a view to protect the channel forming region. The silicon nitride film can be formed by sputtering or glow discharge decomposition, and it is required to be dense enough to prevent intrusion of organic substances, metals and impurities such as moisture vapor in the atmosphere. By using a silicon nitride film as the third insulating film 1113, oxygen concentration of the first semiconductor film 1105 can be suppressed to $5 \times 10^{19}$ atoms/cm³ or less, and more preferably to $1 \times 10^{19}$ atoms/cm³ or less. For this purpose, the third insulating film 1113 can be promoted to be densified when a silicon nitride film is used which is formed by RF sputtering with a mixed sputtering gas of nitrogen and a noble gas element such as argon by using silicon as a target, whereby the noble gas element is contained in the film. In the case of performing glow discharge decomposition also, a densified film can be obtained even at a temperature as low as 100° C. or less when a silicon nitride film formed with a silicon gas which is diluted with a silicon gas such as argon 100 to 500 times is employed. Further, a fourth insulating film 1114 formed of a silicon oxide film may be laminated if necessary. The third insulating film 1113 and the fourth insulating film 1114 correspond to passivation films.

Further, a fifth insulating film 1115 (planarizing film) is desirably formed over the third insulating film 1113 and/or the fourth insulating film 1114. The fifth insulating film 1115 is preferably formed of organic resin such as acrylic, polyimide and polyamide or a siloxane material. These materials have water absorptivity, therefore, a sixth insulating film 1116 is preferably formed thereover as a barrier film to prevent intrusion and discharge of water. The sixth insulating film 1116 may be formed of the aforementioned silicon nitride film.

After the formation of a contact hole in the sixth insulating film 1116, the fifth insulating film 1115 and the third insulating film 1114, a wiring 1117 is formed to have a desired shape by etching (FIGS. 27C and 27D). The channel-etched TFT formed in this manner can obtain field effect mobility of 1 to 10 $cm^2$/Vsec by forming the channel forming region with an SAS.

Then, a conductive film is formed over the sixth insulating film 1116 so as to be in contact with the wiring 1117 by a liquid droplet ejection method, and thorough the aforementioned baking steps, a hole injection electrode 1118 (anode) is formed. The ejected conductive material may be ITO, ITSO, organic indium, organotin and the like, each of which is used as a light-transmitting conductive film. Accordingly, a bottom emission light-emitting device can be provided in which light can be emitted to the bottom side.

Note that the hole injection electrode 1118 may have a laminated structure. For example, it is desirable that a laminated structure of ITSO is adopted, in which ITSO on the TFT side has a lower concentration of silicon oxide (1 to 6 atomic %) while ITSO on the light-emitting element side has a higher concentration of silicon oxide (7 to 15 atomic %). The hole injection electrode 1118 may be swabbed and polished by CMP using a polyvinyl alcohol porous body in order to obtain a planarized surface (FIG. 27D).

Note that when the hole injection electrode 1118, which is formed by etching, is discharged with indium, tin or oxide thereof from inside through a resist peeling step, hydrogenation (washing) step, ultraviolet irradiation step and the like, silicon, silicon oxide, silicon nitride and the like can be separated to the surface of the hole injection electrode 1118 or inside of the layer around the surface, whereby a barrier layer can be formed by using the discharged substance as a main component. Alternatively, the barrier layer may be formed by deposition, sputtering and the like of silicon, silicon oxide, silicon nitride and the like intentionally. Thusly formed barrier layer can increase a work function of the hole injection electrode 1118, thereby increasing hole injection property.

Subsequently, a bank (partition) 1119 which is an organic resin film, an inorganic insulating film or a film formed of a siloxane material is formed over the sixth insulating film 1116 as shown in FIG. 28. The bank 1119 has an aperture where the hole injection electrode 1118 is exposed.

Then, an organic compound layer 1120 is formed to be in contact with the hole injection electrode 1118 in the aperture of the bank 1119. The organic compound layer 1120 denotes a layer containing at least an organic compound, and it may contain an inorganic compound such as molybdenum oxide (MoOx) as well. The organic compound layer 1120 is also referred to as an electro luminescent layer or an EL layer. The organic compound layer 1120 may have either a single-layer structure or multi-layer structure. In the case of the multi-layer structure, a hole injection layer, a hole transporting layer, a light-emitting layer, an electron transporting layer and an electron injection layer are laminated in sequence over the hole injection electrode 1118.

Subsequently, an electron injection electrode (cathode) 1121 is faulted so as to cover the organic compound layer 1120. The electron injection electrode 1121 can be formed by using known materials having low work function such as Ca, Al, CaF, MgAg and AlLi. In the opening of the bank 1119, the hole injection electrode 1118, the organic compound layer 1120 and the electron injection electrode 1121 are overlapped to form a light-emitting element 1122 (FIG. 28).

Note that the light-emitting device completed up to the stage of FIG. 28 is preferably packaged (sealed) with a protective film (laminate film, ultraviolet curable resin film and the like) or a covering material having high air tightness and small degasification.

Thusly formed element substrate using the same TFTs for a pixel portion and a driver circuit can be formed by using the total of five masks for a gate electrode, a semiconductor region, a wiring, a contact hole and an anode.

Note that description is made on an example where a driver circuit and a pixel portion of a light-emitting device are formed over the same substrate using TFTs of amorphous semiconductors, however, the invention is not limited to this structure. It is also possible that a pixel portion is formed by using a TFT of an amorphous semiconductor and a driver circuit which is formed separately is attached to the substrate where the pixel portion is formed.

Figure 29:
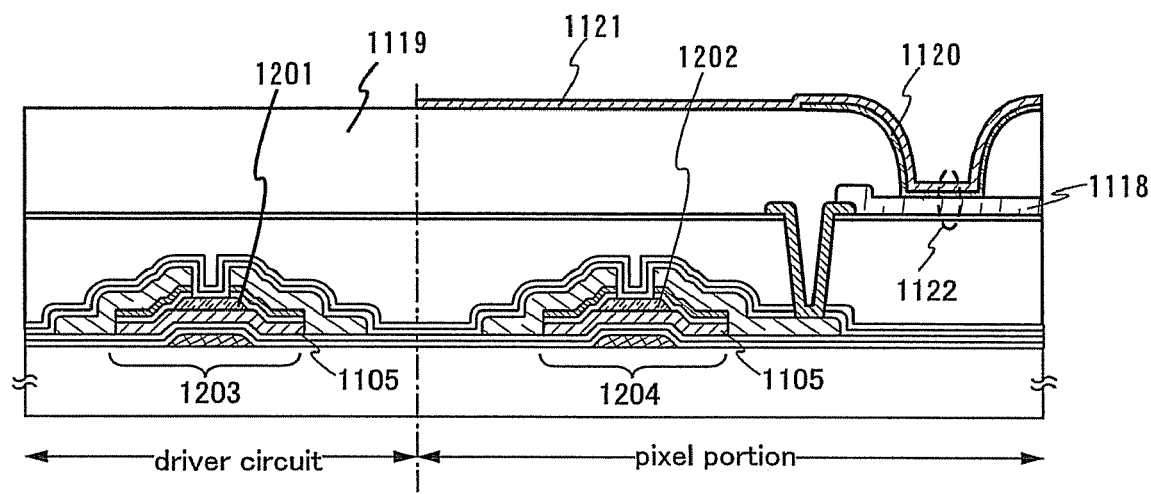
FIG. 29 illustrates a completion diagram of an EL light-emitting device (channel-etched TFT) manufactured in accordance with the invention.

Note that when the channel-protective films 1201 and 1202 are formed over the first semiconductor film 1105 formed of an SAS so as to overlap the gate electrodes 1101 and 1102, a light-emitting device using channel protective TFTs 1203 and 1204 having the structure shown in FIG. 29 can be formed in the similar manner (FIG. 29).

The gate electrodes, the source electrodes, the drain electrodes, the mask pattern and the like described above can be formed to have desired patterns at desired positions by setting a moving path of a nozzle or a moving path of a stage for supporting the substrate based on the pattern data designed by CAD and the like, moving the nozzle or the stage along the set moving path by a control means and ejecting compositions containing the materials for forming such patterns from an ejection head of the nozzle.

In addition, according to the characteristics of compositions to be ejected, such ejection conditions are set as the moving rate of a nozzle or a substrate, ejection quantity of compositions, distance between an ejection head of a nozzle and the substrate, ejection rate of compositions to be ejected from the ejection head, atmosphere of the space that the compositions are ejected, the temperature and moisture of the space, and heating temperature of the substrate. These conditions are determined by a determination means for determining an optimal parameter by comparing the designed data of the thin film pattern with the data of the composition type, film thickness and the like based on a database in which a number of parameters that are obtained theoretically, experimentally and experientially are compiled. Thus, an excellent pattern can be obtained with high throughput.

In addition, the island-like semiconductor film or the island-like N-type semiconductor film and the like in this embodiment can be formed by ejecting compositions containing materials for forming such films by using a liquid droplet ejection system in accordance with the invention.

By inputting pattern data of the thin film such as the gate electrodes, the source electrodes, the drain electrodes, the mask pattern and the like formed by the aforementioned method, the moving path of the nozzle for ejecting compositions or the moving path of the stage of the substrate is determined, and compositions are ejected along the moving path, whereby a desired thin film pattern can be promptly formed with accuracy. Thus, a manufacturing method of a semiconductor element can be provided with a reduced tact time, higher throughput and higher yield.

Embodiment 14

In the aforementioned embodiment, description is made on the case where the invention is applied to the bottom emission light-emitting device shown in FIGS. 28 and 29. In this embodiment, description is made on the case where the invention is applied to a top emission light-emitting device shown in FIG. 30A and a dual emission light-emitting device shown in FIG. 30C.

First, description is made on the case of a dual emission light-emitting device. In this case, a hole injection electrode may be formed of a light-transmitting conductive film such as ITO, ITSO, ZnO, IZO, GNO and the like as in the aforementioned embodiment. Also, in the case where ITSO is used as an anode 1622, ITSO containing silicon oxide with different concentrations may be laminated in layers. It is preferable that the ITSO on the bottom layer (source or drain wiring side) has a lower concentration of silicon oxide while the ITSO on the top layer (light-emitting element side) has a higher concentration of silicon oxide. Accordingly, connection between TFTs can be maintained to have low resistance, which heightens the hole injection efficiency to the EL layer. It is needless to mention that the anode may have a laminated structure of ITSO and other materials (for example, laminated structure of the bottom ITO layer and the top ITSO layer, or alternatively, other materials may be laminated.

Figure 30A:
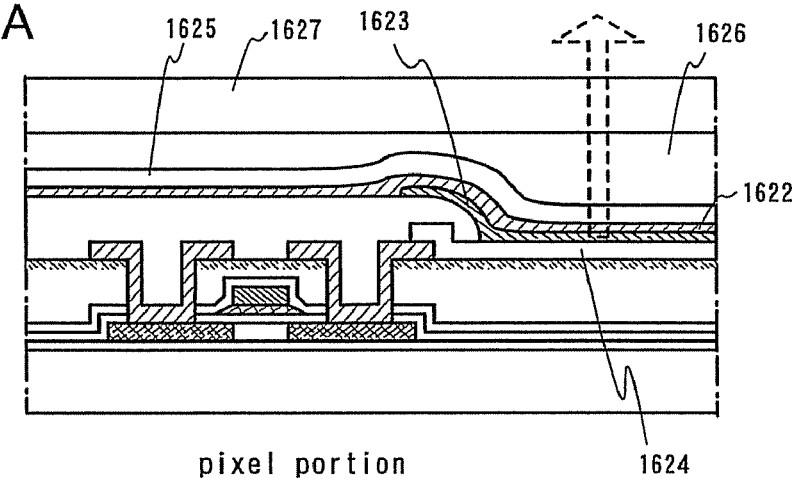
FIGS. 30A to 30C illustrate light-emitting devices of top, bottom and dual emission respectively which are manufactured in accordance with the invention.
Figure 30B:
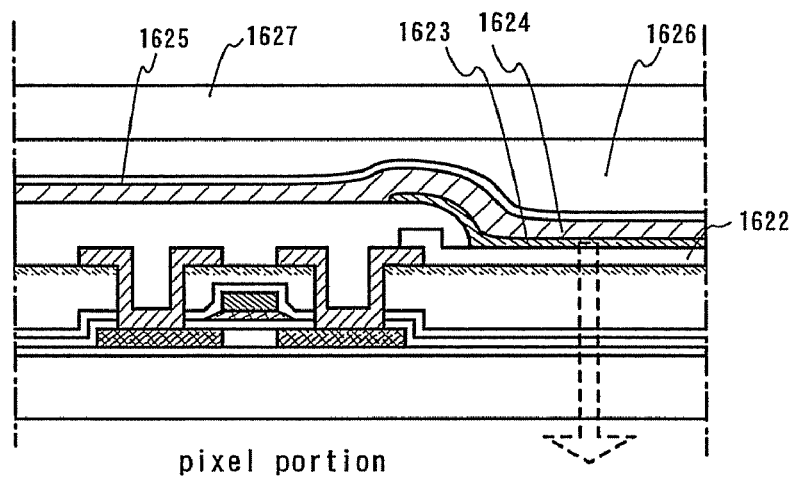
Figure 30C:
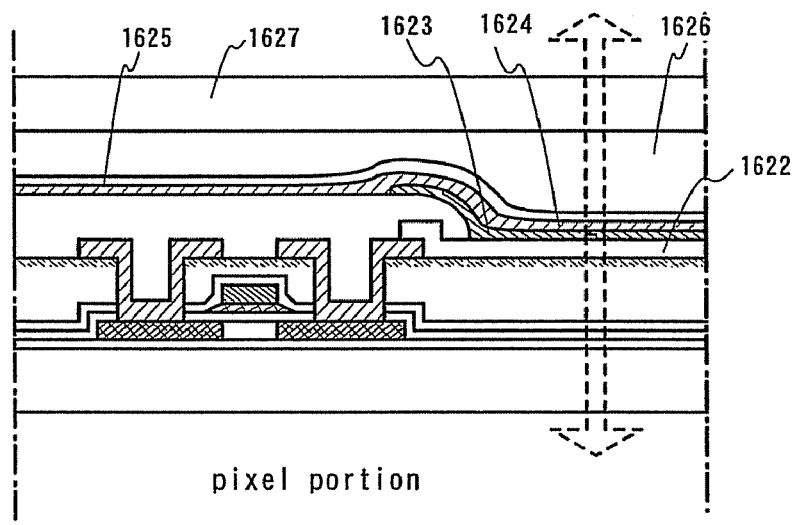

As for a cathode 1624, on the other hand, when it is formed of a thin aluminum film with a thickness of 1 to 10 nm or an aluminum film containing a slight amount of Li so as to transmit light from a light-emitting layer, a dual emission light-emitting device can be provided in which light from the light-emitting element can be emitted to both sides (FIG. 30C).

Description is made now on the case of a top emission light-emitting device. In general, the hole injection electrode (anode) 1622 and the electron injection electrode (cathode) 1624 of the bottom emission display device in FIG. 30B are exchanged, and further an organic compound layer is inversely laminated so as to invert polarity of a current controlling TFT (N-channel TFT is used here), whereby a top emission light-emitting device can be provided in which light can be emitted to the opposite side (top side) of the substrate. In the case of providing an inverted lamination of electrodes and an organic compound layer as shown in FIG. 30A, a highly stable light-emitting device can be obtained when adopting a laminated structure of light-transmitting oxide conductive layers each having a different concentration of silicon oxide as the hole injection electrode (anode) 1622, which leads to an improved emission efficiency, lower power consumption and the like. As the electron injection electrode (cathode) 1624, a light reflective metal electrode and the like may be employed.

Embodiment 15

In this embodiment, description is made on an example of a display panel provided with TFTs which can be formed in accordance with the aforementioned embodiment modes or embodiments.

Figure 31A:
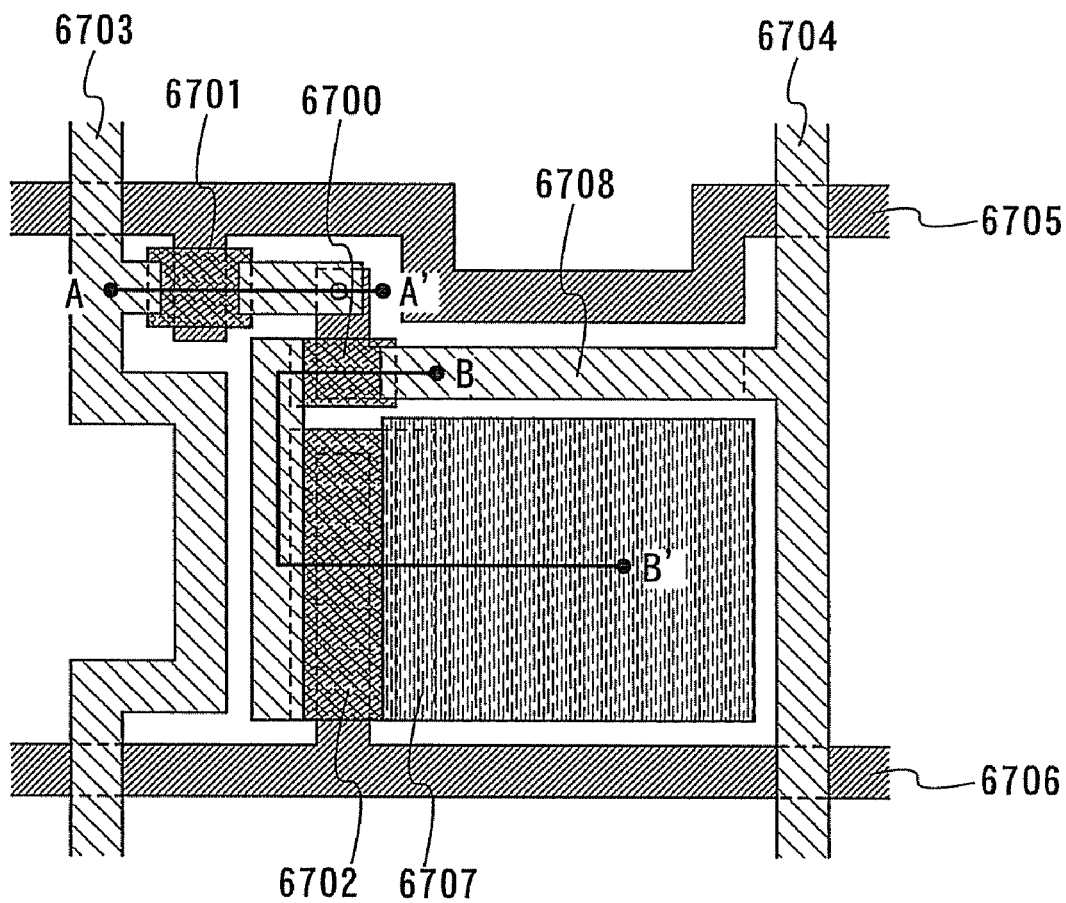
FIGS. 31A and 31B illustrate a top view and a circuit diagram of a pixel portion in an EL display panel respectively.
Figure 31B:
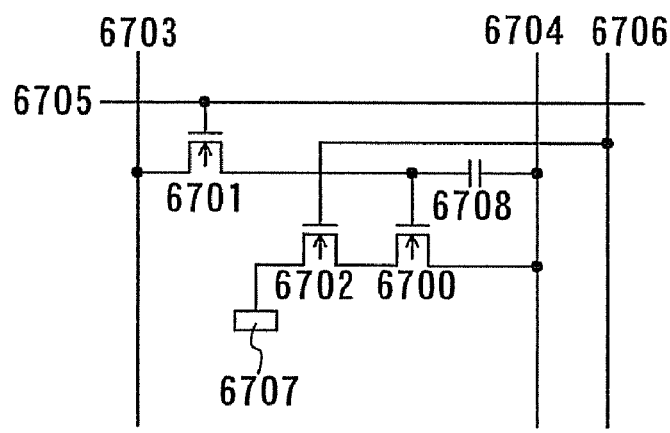

FIG. 31A illustrates a top view of a pixel in an EL display panel formed by using first to third TFTs 6700 to 6702. FIG. 31B illustrates a circuit diagram corresponding to the top view in FIG. 31B. Each of the pixels in the pixel portion of the EL display panel includes an EL element 6707, a first driving TFT 6700 for controlling the light emission of the EL element 6707, a second driving TFT 6701 for controlling ON/OFF (switching) of the first TFT 6700 and a third driving TFT 6702 for controlling current supplied to the EL element 6707. Each of the above TFT may be the TFT described in the aforementioned embodiment modes and embodiments.

The first driving TFT 6700 is connected to a pixel electrode provided on the bottom of the EL element 6707 via the third driving TFT 6702, and controls the light emission of the EL element 6707. The second driving TFT 6701 controls the operation of the first driving TFT 6701. It can control ON/OFF of the first driving TFT 6700 in accordance with signals from a scan line 6705 which is combined with a gate electrode of the second driving TFT 6701 and from a signal line 6703. The gate electrode of the first driving TFT 6700 is connected to the second driving TFT 6701, and it supplies power to the pixel electrode from a power source line 6704 in accordance with the ON/OFF of the gate. Note that the third driving TFT 6702 for controlling current which is connected to a fixed power source line 6706 is provided to supply constant current to the EL element 6707 in order to deal with the operation of the EL element 6707 whose emission luminance varies with the amount of supplied current.

The EL element 6707 has a pair of electrode (anode and cathode) and an organic compound layer sandwiched therebetween, by which are exhibited the emission (fluorescence) obtained in returning from an excited singlet state to the ground state, and the emission (phosphorescence) obtained in returning from triplet excited state to the ground state. The EL layer can be formed of an organic compound such as a low molecular weight organic light-emitting substance, medium molecular weight organic light-emitting substance (organic light-emitting substance having no sublimation property and molecular weight of 20 or less, or chain molecules with a length of 10 im or less) and a high molecular weight organic light-emitting substance. The EL layer may have a single layer or multiple layers each having a different function. In the case of laminating multiple layers, such layers may be appropriately combined as a hole injection layer, a hole transporting layer, a light-emitting layer, an electron injection layer, an electron transporting layer and a hole or an electron blocking layer. Note that each of the hole injection layer and the hole transporting layer is formed of a material which can be injected holes from the electrode and having high hole mobility. It is also possible to combine the two functions into one layer (hole injection transporting layer). The same can be applied to the electron injection transporting layer.

FIGS. 32A and 32B each illustrates a cross-sectional view of FIG. 31A taken along lines A-A' and B-B', which shows an active matrix EL display panel including a substrate 900 over which is formed the first driving TFT 6700, the second driving TFT 6701 and the third TFT 6702, a sealing substrate 900 and a light-emitting element 908 formed between the two substrates. Both of the cross-sectional view includes the first driving TFT 6700. The first driving TFT 6700 is connected to a pixel electrode 909 via the second driving TFT 6701. An insulator 911 (referred to as a bank, partition and the like) is formed over the pixel electrode 909, and further a light-emitting layer 903 and a counter electrode 904 are formed thereover so as to form the light-emitting element 908. A passivation film 905 is formed over the light-emitting element 908, and it is sealed then with a sealing member. The space between the passivation film 905 and the substrate 906 is filled with an insulator 912.

Each of the insulators 911 and 912 may be formed of one or more of silicon nitride, silicon oxide, silicon nitride oxide, aluminum nitride, aluminum oxynitride, aluminum nitride oxide, aluminum oxide, diamond-like carbon (DLC) and a nitrogen-containing carbon film (CN). As other insulating materials, a film formed of one or more of polyimide, acrylic, benzocyclobutene, polyamide and a siloxane material can be employed. In the case of light emitted to the sealing substrate 905 side (top emission), the insulator 912 is required to be formed by a light-transmitting material.

Note that FIGS. 31A to 32B each illustrates only one pixel, however, an EL element corresponding to each color of R (red), G (green) and B (blue) can be combined to perform a multi-color display. Each of the emission may be either the emission (fluorescence) obtained in returning from an excited singlet state to the ground state and the emission (phosphorescence) obtained in returning from triplet excited state to the ground state. Alternatively, such combination can be employed as one color of fluorescence (or phosphorescence) and other two colors of phosphorescence (fluorescence). In such a case, phosphorescence may be used for R while fluorescence may be used for G and B. For example, a laminated structure can be provided such that a film of copper phthalocyanine (CuPc) is formed with a thickness of 20 nm as a hole injection layer, and another film of tris (8-quinolinolato) aluminum is formed with a thickness of 70 nm as a light-emitting layer thereover. When doping a fluorescent pigment such as quinacridone, perylene and DCM1 to $Alq_3$, emission color can be controlled.

The passivation film 905 may be formed by using silicon nitride, silicon oxide, silicon oxynitride, aluminum nitride, aluminum oxide nitride, aluminum oxide, diamond-like carbon, nitrogen-containing carbon, a siloxane material or other insulating materials.

The invention can be applied to both of the dual emission light-emitting panel in which light is emitted to both sides of the light-emitting panel and a single-side emission light-emitting panel. In the case of light emitted to the counter electrode side only (top emission), the pixel electrode corresponds to an anode, and it is formed of a reflective metal film. The reflective metal film is fowled of a metal film having a high work function such as platinum (Pt) and gold (Au) in order to function as the anode. In addition, since such metal is expensive, a pixel electrode may have different structure such that the metal is laminated over an appropriate film such as an aluminum film and a tungsten film, in which platinum or gold is exposed at least to the outermost surface. The counter electrode is a thin metal film (preferably having a thickness of 10 to 50 nm), and is formed of a material having low work function, containing an element belonging to the first group or the second group of the periodic table (for example, Al, Mg, Ag, Li, Ca or an alloy of them such as MgAg, MgAgAl, MgIn, LiAl, LiFal, $CaF_2$ and CaN) in order to function as the cathode. Further, an oxide conductive film (typically, ITO film) is laminated over the counter electrode. In this case, light emitted from the light-emitting element is reflected on the pixel electrode, and passes through the counter electrode to be emitted to the sealing substrate 906 side.

In the case of light emitted to the pixel electrode only (bottom emission), the pixel electrode corresponding to the anode is formed of a light-transmitting conductive film. The light-transmitting conductive film may be formed of a compound of indium oxide and tin oxide, compound of indium oxide and zinc oxide, zinc oxide, tin oxide or indium oxide. The counter electrode is preferably formed of a metal film (having a thickness of 50 to 200 nm) formed of Al, Mg, Ag, Li, Ca or an alloy of them such as MgAg, MgIn and AlLi. In this case, light emitted from the light-emitting element passes through the pixel electrode to be emitted to the substrate 900 side.

In the case of light emitted to both sides of the pixel electrode and the counter electrode side (dual emission), the pixel electrode corresponding to the anode is formed of a light-transmitting conductive film. The light-transmitting conductive film may be formed of ITO, ITSO, IZO, ZnO, tin oxide, indium oxide and the like. The counter electrode is a thin metal film (preferably having a thickness of 10 to 50 μm) in order to transmit light, and is formed of a material having low small function, containing an element belonging to the first group or the second group of the periodic table (for example, Al, Mg, Ag, Li, Ca or an alloy of them such as MgAg, MgAgAl, MgIn, LiAl, LiFal, $CaF_2$ and CaN) in order to function as the cathode. Further, a light-transmitting oxide conductive film (typically, ITO film or ITSO film) is laminated over the counter electrode. In this case, light emitted from the light-emitting element is emitted to both sides of the substrate 900 and the sealing substrate 906. The TFT used in this embodiment may be of any type of an inverted staggered TFT, a staggered TFT, a bottom-gate TFT and a top-gate TFT.

Embodiment 16

Figure 33:
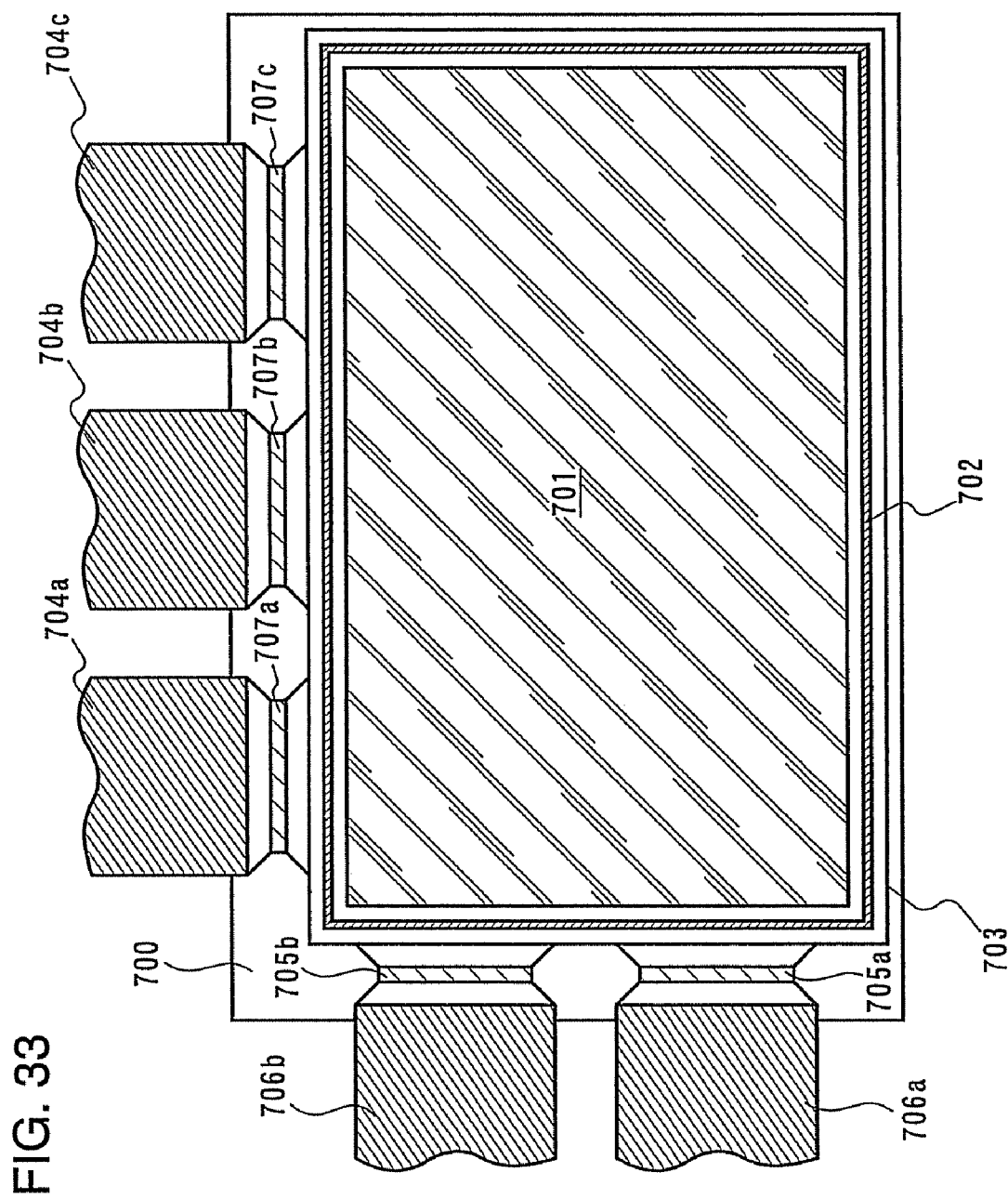
FIG. 33 illustrates a display module manufactured in accordance with the invention.

In this embodiment, description is made on a mode where the display panel used for a liquid crystal display device or a light-emitting device in the aforementioned embodiment is assembled into a module with reference to FIG. 33. The module shown in FIG. 33 has driver ICs integrating driver circuits, which are mounted by COG (Chip On Glass) bonding around a pixel portion 701. It is needless to mention that the driver ICs may be mounted by TAB (Tape Automated Bonding) as well.

A substrate 700 is attached to a counter substrate 703 with a sealing member 702. A pixel portion 701 may be formed of liquid crystals as display mediums as described in Embodiment 4 or of EL elements as display mediums as described in Embodiment 5. Each of driver ICs 705a, 705b and 707a to 707c can be configured with an integrated circuit formed by using single crystalline semiconductors or polycrystalline semiconductors. The driver ICs 705a, 705b and 707a to 707c are supplied with signals and power from FPCs 704a to 704c or 706a and 706b.

Embodiment 17

Figure 34A:
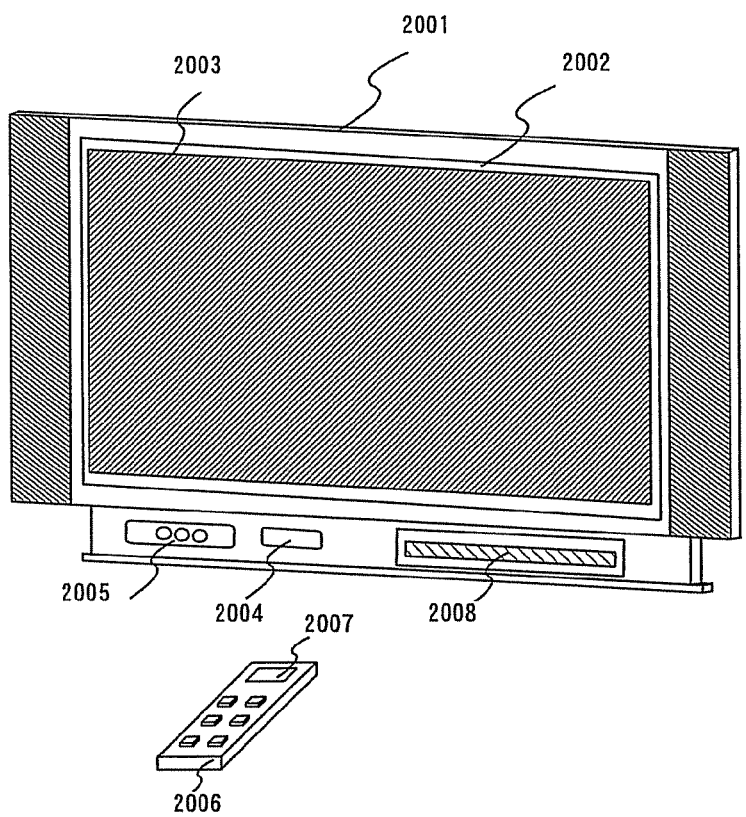
FIGS. 34A to 34C illustrate examples of electronic apparatuses manufactured in accordance with the invention.
Figure 34B:
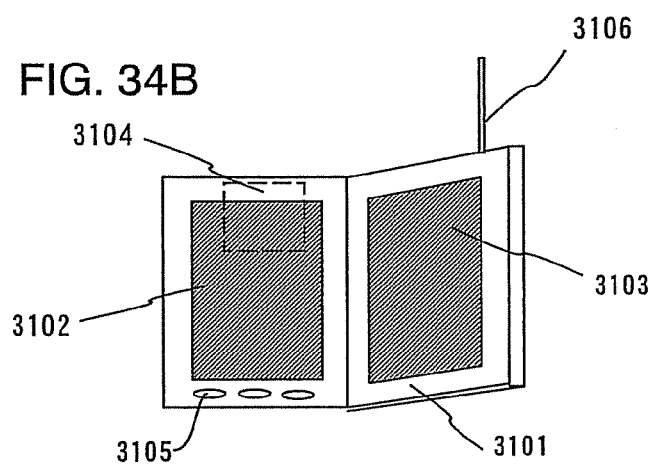
Figure 34C:
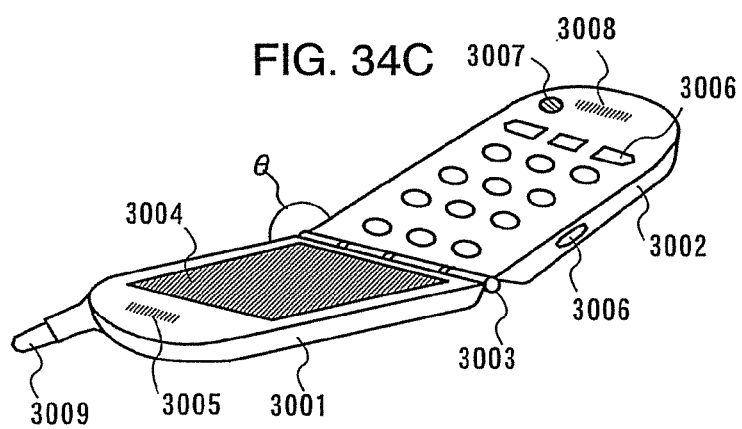

As an electronic apparatus using the module in Embodiment 16, the following examples can be provided such as a TV set, a portable book (electronic book) and a portable phone shown in FIGS. 34A to 34C.

The TV set shown in FIG. 34A includes a housing 2001 which incorporates a display module 2002 using liquid crystals or EL elements. By using a receiver 2005 for receiving general TV broadcast as well as connecting to a wire/wireless communications network through a modem 2004, one-way (sender to receiver) or two-way (between sender and receiver or between receivers) communication can be realized. The operation of the TV set can be controlled by switches incorporated in the housing 2001 or a separate remote controller 2006. The remote controller 2006 may be provided with a display portion 2007 for displaying output data as well.

In addition, the TV set may be provided with a main display 2003 as well as a sub-display 2008 formed as a second display module for displaying a channel, a sound volume and the like. In such a structure, it is possible that the main display 2003 is formed of an EL display module which provides wide viewing angles while the sub-display 2008 is formed of a liquid crystal display module capable of performing display with low power consumption. When giving priority to reduction of power consumption, the main display 2003 may be formed of a liquid display module while the sub-display 2008 may be formed of an EL display module. Incidentally, the sub-display 2008 may have a function of blinking display.

FIG. 34B illustrates a portable book (electronic book) including a housing 3101, display portions 3102 and 3103, a storage medium 3104, an operating switch 3105, an antenna 3106 and the like.

FIG. 34C illustrates a portable phone including a display panel 3001 and an operation panel 3002. The display panel 3001 and the operation panel 3002 are connected via a connecting portion 3003. An angle é made by a plane where the display portion 3004 of the display panel 3001 is provided and a plane where operating keys 3006 of the operation panel 3002 is provided can be changed arbitrarily. Further, the portable phone includes an audio output portion 3005, the operating keys 3006, a power switch 3007 and an audio input portion 3008.

Description has been made on the applicability of the invention to display fields in this embodiment, however, it is needless to mention that it can be applied to other fields. For example, when the invention is positively applied to the formation of various wirings in LSI process, a conductive film with improved planarity, thinner film thickness and lower resistance can be obtained.

What is claimed is:

1. A liquid droplet ejection system comprising:
   an input terminal for inputting a data of a film pattern;
   a first nozzle configured to eject a first composition based on the data;
   a second nozzle configured to eject a second composition based on the data;
   a computer configured to set a first moving path and a second moving path intersecting with each other;
   a database including compiled optimal ejection conditions obtained through experiments and evaluations in advance for ejecting the first composition and the second composition; and
   a camera configured to detect an alignment marker on a substrate,
   wherein the first nozzle is configured to move along the first moving path, and eject the first composition in succession,
   wherein the second nozzle is configured to move along the second moving path, and eject the second composition intermittently so as to make a thin film with a linear portion and a projecting portion such as ⊥ shape, and
   wherein the first moving path crosses the second moving path.

2. A liquid droplet ejection system according to claim 1, wherein the liquid droplet ejection system is used in a manufacturing process for a thin film transistor having a gate electrode, a semiconductor film, a source electrode and a drain electrode.

3. A liquid droplet ejection system according to claim 2, wherein the gate electrode, the source electrode and the drain electrode comprises Ag.

4. A liquid droplet ejection system according to claim 1, further comprising a stage for fixing the substrate.

5. A liquid droplet ejection system according to claim 1, wherein the first composition or the second composition for forming the film pattern comprises at least one of Ag, Au, Ci, Ni, Pt, Pd, Ir, Rh, W, Al, Ta, Mo, Cd, Zn, Fe, Ti, Si, Ge, Zr, Ba, ITO, ITSO organic indium, organotin and zinc oxide (ZnO).

6. A liquid droplet ejection system according to claim 1, further comprising:
   a determination means for determining a temperature of an atmosphere in which the first composition and the second composition are ejected, a moisture of the atmosphere in which the first composition and the second composition are ejected, and a temperature of the substrate; and
   a control means for control the temperature of the atmosphere, the moisture of the atmosphere, and the temperature of the substrate so as to control an ejection quantity of the first composition and the second composition.

7. A liquid droplet ejection system according to claim 6, wherein at least one of $N_2$ gas, $O_2$ gas and organic gas is used according to characteristics of the first composition or the second composition for controlling the temperature of the atmosphere and the moisture of the atmosphere.

8. A liquid droplet ejection system comprising:
   an input terminal for inputting a data of a film pattern;
   a first nozzle configured to eject a first composition continuously based on the data;
   a second nozzle configured to eject a second composition intermittently based on the data;
   a computer configured to set a first moving path and a second moving path intersecting with each other;
   a database including compiled optimal ejection conditions obtained through experiments and evaluations in advance for ejecting the first composition and the second composition; and
   a camera configured to detect an alignment marker on a substrate,
   wherein the first nozzle is configured to move along the first moving path, and eject the first composition in succession,
   wherein the second nozzle is configured to move along the second moving path, and eject the second composition intermittently so as to make a thin film with a linear portion and a projecting portion such as ⊥ shape, and
   wherein the first moving path crosses the second moving path.

9. A liquid droplet ejection system according to claim 8, wherein the liquid droplet ejection system is used in a manufacturing process for a thin film transistor having a gate electrode, a semiconductor film, a source electrode and a drain electrode.

10. A liquid droplet ejection system according to claim 9, wherein the gate electrode, the source electrode and the drain electrode comprises Ag.

11. A liquid droplet ejection system according to claim 8, further comprising a stage for fixing the substrate.

12. A liquid droplet ejection system according to claim 8, wherein the first composition or the second composition for forming the film pattern comprises at least one of Ag, Au, Ci, Ni, Pt, Pd, Ir, Rh, W, Al, Ta, Mo, Cd, Zn, Fe, Ti, Si, Ge, Zr, Ba, ITO, ITSO organic indium, organotin and zinc oxide (ZnO).

13. A liquid droplet ejection system according to claim 8, further comprising:
   a determination means for determining a temperature of an atmosphere in which the first composition and the second composition are ejected, a moisture of the atmosphere in which the first composition and the second composition are ejected, and a temperature of the substrate; and
   a control means for control the temperature of the atmosphere, the moisture of the atmosphere, and the temperature of the substrate so as to control an ejection quantity of the first composition and the second composition.

14. A liquid droplet ejection system according to claim 13, wherein at least one of $N_2$ gas, $O_2$ gas and organic gas is used according to characteristics of the first composition or the second composition for controlling the temperature of the atmosphere and the moisture of the atmosphere.

* * * * *

UNITED STATES PATENT AND TRADEMARK OFFICE
CERTIFICATE OF CORRECTION

PATENT NO. : 8,322,847 B2
APPLICATION NO. : 13/049078
DATED : December 4, 2012
INVENTOR(S) : Shunpei Yamazaki et al.

Page 1 of 1

It is certified that error appears in the above-identified patent and that said Letters Patent is hereby corrected as shown below:

In the Specification:

Column 6, Line 28; Change "fowled" to --formed--.
Column 8, Line 56; Change "é" to --θ--.
Column 9, Line 45; Change "é" to --θ--.

Column 13, Line 67; Change "é." to --θ.--.
Column 14, Line 34; Change "faun" to --form--.
Column 30, Line 32; Change "fowled" to --formed--.
Column 30, Line 53; Change "foamed" to --formed--.
Column 32, Line 13; Change "fowled" to --formed--.

Column 32, Line 67; Change "1141." to --TFT.--.
Column 37, Lines 8 thru 9; Change "containing polyimide is" to --containing polyamide is--.
Column 37, Line 67; Change "polyimide" to --polyamide--.
Column 38, Line 56; Change "farmed" to --formed--.
Column 43, Line 66; Change "faulted" to --formed--.
Column 47 Line 35; Change "fowled" to --formed--.
Column 48, Line 4; Change "50 $\mu$ m" to --50nm--.
Column 49, Line 10; Change "é" to --θ--.

Signed and Sealed this
Third Day of September, 2013

Teresa Stanek Rea
*Acting Director of the United States Patent and Trademark Office*